United States Patent
Sugishima

(10) Patent No.: US 12,139,693 B2
(45) Date of Patent: Nov. 12, 2024

(54) TREATMENT LIQUID AND METHOD FOR TREATING OBJECT TO BE TREATED

(71) Applicant: FUJIFILM Corporation, Tokyo (JP)

(72) Inventor: Yasuo Sugishima, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 242 days.

(21) Appl. No.: 17/850,160

(22) PCT Filed: Dec. 24, 2020

(86) PCT No.: PCT/JP2020/048515
§ 371 (c)(1),
(2) Date: Jun. 27, 2022

(87) PCT Pub. No.: WO2021/153122
PCT Pub. Date: Aug. 5, 2021

(65) Prior Publication Data
US 2023/0159864 A1    May 25, 2023

(30) Foreign Application Priority Data
Jan. 28, 2020    (JP) ................. 2020-011787

(51) Int. Cl.
*C11D 7/06*    (2006.01)
*C11D 7/10*    (2006.01)
(Continued)

(52) U.S. Cl.
CPC .............. *C11D 7/06* (2013.01); *C11D 7/105* (2013.01); *C11D 7/16* (2013.01); *C11D 7/265* (2013.01);
(Continued)

(58) Field of Classification Search
CPC .. C11D 7/06; C11D 7/105; C11D 7/16; C11D 7/265; C11D 7/32; C11D 7/3245; C11D 7/3281; C11D 7/34; C11D 7/36; C11D 7/50; C11D 2111/22; C11D 3/0073; C11D 7/5013; C11D 7/04; C11D 17/0008;
(Continued)

(56) References Cited

U.S. PATENT DOCUMENTS 9,862,914 B2 *   1/2018   Kajikawa ................. C11D 7/34
2003/0171239 A1 * 9/2003  Patel ......................... C11D 3/28
510/412
(Continued)

FOREIGN PATENT DOCUMENTS

JP    2002-062668 A    2/2002
JP    2004-101849 A    4/2004
(Continued)

OTHER PUBLICATIONS

Translation of JP2006351813A (Year: 2005).*
(Continued)

*Primary Examiner* — Duy Vu N Deo
(74) *Attorney, Agent, or Firm* — Sughrue Mion, PLLC

(57) ABSTRACT

A treatment liquid contains water, hydroxylamine, and one or more kinds of hydrazines selected from the group consisting of hydrazine, a hydrazine salt, and a hydrazine derivative, in which a total content of the hydrazines is 1 part by mass or less with respect to 100 parts by mass of the hydroxylamine.

27 Claims, 2 Drawing Sheets

(51) Int. Cl.

| | |
|---|---|
| *C11D 7/16* | (2006.01) |
| *C11D 7/26* | (2006.01) |
| *C11D 7/32* | (2006.01) |
| *C11D 7/34* | (2006.01) |
| *C11D 7/36* | (2006.01) |
| *C11D 7/50* | (2006.01) |
| *H01L 21/02* | (2006.01) |
| *H01L 21/3213* | (2006.01) |

(52) U.S. Cl.
CPC .............. *C11D 7/32* (2013.01); *C11D 7/3245* (2013.01); *C11D 7/3281* (2013.01); *C11D 7/34* (2013.01); *C11D 7/36* (2013.01); *C11D 7/50* (2013.01); *H01L 21/02071* (2013.01); *H01L 21/32134* (2013.01); *C11D 2111/22* (2024.01)

(58) Field of Classification Search
CPC .. C11D 17/08; C11D 7/10; C11D 7/26; C11D 7/3209; C11D 7/5022; H01L 21/02071; H01L 21/32134; H01L 21/02068; H01L 21/02063; H01L 21/304; H01L 21/311; G03F 7/425
USPC .................................. 438/706–714, 745–757
See application file for complete search history.

(56) References Cited

U.S. PATENT DOCUMENTS

| | | | |
|---|---|---|---|
| 2004/0048761 A1 | 3/2004 | Ikemoto | |
| 2005/0287488 A1 | 12/2005 | Li | |
| 2009/0162537 A1 | 6/2009 | Kolics et al. | |
| 2012/0157368 A1* | 6/2012 | Mizuta | G03F 7/426 510/176 |
| 2014/0318584 A1 | 10/2014 | Cooper et al. | |
| 2016/0254139 A1* | 9/2016 | Kamimura | C11D 7/3272 510/176 |
| 2016/0272924 A1 | 9/2016 | Kajikawa et al. | |
| 2020/0231900 A1 | 7/2020 | Harada et al. | |
| 2021/0395645 A1 | 12/2021 | Kamimura et al. | |

FOREIGN PATENT DOCUMENTS

| | | |
|---|---|---|
| JP | 2006-261432 A | 9/2006 |
| JP | 2006-351813 A | 12/2006 |
| JP | 2012-009513 A | 1/2012 |
| JP | 2012-227291 A | 11/2012 |
| TW | I528426 B | 4/2016 |
| WO | 2011/027772 A1 | 3/2011 |
| WO | 2012/097143 A2 | 7/2012 |
| WO | 2015/029092 A1 | 3/2015 |
| WO | 2015/068823 A1 | 5/2015 |
| WO | 2017/126554 A1 | 7/2017 |
| WO | 2019/073931 A1 | 4/2019 |
| WO | 2020/014612 A1 | 1/2020 |

OTHER PUBLICATIONS

International Search Report dated Mar. 30, 2021 in International Application No. PCT/JP2020/048515.
Written Opinion of the International Searching Authority dated Mar. 30, 2021 in International Application No. PCT/JP2020/048515.
International Preliminary Report on Patentability dated Jul. 28, 2022 in International Application No. PCT/JP2020/048515.
Office Action of China Counterpart Application issued on Jul. 27, 2023, with partial English translation thereof.
International Search Report (Form PCT/ISA/210) of PCT/JP2020/029401, mailed on Sep. 29, 2020, With English translation thereof, pp. 1-5.
Written Opinion of the International Searching Authority (Form PCT/ISA/237) of PCT/JP2020/029401, mailed on Sep. 29, 2020, with English translation thereof, pp. 1-6.
Office Action issued Apr. 22, 2024 in U.S. Appl. No. 17/683,241.
Communication dated Jun. 6, 2024, issued in Taiwanese Application No. 109146807.

* cited by examiner

TREATMENT LIQUID AND METHOD FOR TREATING OBJECT TO BE TREATED

CROSS-REFERENCE TO RELATED APPLICATIONS

This application is a Continuation of PCT International Application No. PCT/JP2020/048515 filed on Dec. 24, 2020, which claims priority under 35 U.S.C § 119(a) to Japanese Patent Application No. 2020-011787 filed on Jan. 28, 2020. Each of the above application(s) is hereby expressly incorporated by reference, in its entirety, into the present application.

BACKGROUND OF THE INVENTION

1. Field of the Invention

The present invention relates to a treatment liquid and a method for treating an object to be treated.

2. Description of the Related Art

With the progress of miniaturization of semiconductor devices, the treatment, such as etching or washing, with a treatment liquid used in the semiconductor device manufacturing process is increasingly required to be more accurately performed with high efficiency.

For example, JP2004-101849A discloses a washing agent composition containing N-hydroxyformamide, and the like.

SUMMARY OF THE INVENTION

Studies are performed on a technique for treating an object to be treated composed of a substrate or the like by using a treatment liquid.

The treatment liquid used for treating such an object to be treated is required, for example, to have excellent removability for organic residues generated by a pre-treatment (such as a dry etching treatment) performed on the object to be treated (hereinafter, also simply described as "having excellent organic residue removability"). Furthermore, the treatment liquid is also required, for example, to be able to demonstrate constant performance even after a lapse of time and to have excellent stability.

The present invention has been made in consideration of the above circumstances, and an object thereof is to provide a treatment liquid having excellent organic residue removability and excellent stability.

Another object of the present invention is to provide a method for treating an object to be treated relating to the aforementioned treatment liquid.

In order to achieve the above objects, the inventors of the present invention conducted intensive studies. As a result, the inventors have found that the objects can be achieved by the following constitutions.

[1]
A treatment liquid containing water,
hydroxylamine, and
one or more kinds of hydrazines selected from the group consisting of hydrazine, a hydrazine salt, and a hydrazine derivative,
in which a total content of the hydrazines is 1 part by mass or less with respect to 100 parts by mass of the hydroxylamine.

[2]
The treatment liquid described in [1], in which the total content of the hydrazines is 0.0001 parts by mass or more with respect to 100 parts by mass of the hydroxylamine.

[3]
The treatment liquid described in [1] or [2], in which the total content of the hydrazines is 0.005 to 0.5 parts by mass with respect to 100 parts by mass of the hydroxylamine.

[4]
The treatment liquid described in any one of [1] to [3], in which the hydrazine derivative is one or more kinds of compounds selected from the group consisting of a compound represented by General Formula (A), a compound represented by General Formula (B), a compound having a pyrazole ring, and a salt of these.

In General Formula (A), two $R^N$'s each independently represent a hydrogen atom or a substituent. Two $R^N$'s may be bonded to each other to form a ring. However, at least one of two $R^N$'s is not a hydrogen atom.

In General Formula (B), X represents a divalent group.

[5]
The treatment liquid described in any one of [1] to [4], in which the hydrazines contain hydrazine.

[6]
The treatment liquid described in any one of [1] to [5], further containing one or more kinds of first anions selected from the group consisting of $Cl^-$, $NO_2^-$, and $NO_3^-$.

[7]
The treatment liquid described in [6], containing three kinds of first anions consisting of $Cl^-$, $NO_2^-$, and $NO_3^-$.

[8]
The treatment liquid described in [6] or [7], in which a total content of the first anions is 0.0001 to 30 parts by mass with respect to 100 parts by mass of the hydroxylamine.

[9]
The treatment liquid described in any one of [6] to [8], further containing one or more kinds of second anions selected from the group consisting of $SO_4^{2-}$ and $PO_4^{3-}$,
in which a total content of the first anions and the second anions is 0.0001 to 30 parts by mass with respect to 100 parts by mass of the hydroxylamine.

[10]
The treatment liquid described in any one of [6] to [9], in which a total mass of $NO_2^-$ and $NO_3^-$ contained in the treatment liquid is larger than a mass of $Cl^-$ contained in the treatment liquid.

[11]
The treatment liquid described in any one of [1] to [10], further containing a chelating agent.

[12]
The treatment liquid described in [11], in which the chelating agent contains a functional group selected from the group consisting of a carboxylic acid group, a phosphonic acid group, and a sulfonic acid group.

[13]
The treatment liquid described in [11] or [12], in which the chelating agent is one or more kinds of compounds selected from the group consisting of diethylenetriaminepentaacetic acid, ethylenediaminetetraacetic acid, trans-1,2-diaminocyclohexanetetraacetic acid, oxalic acid, malonic acid, succinic acid, citric acid, methanesulfonic acid, 1-hydroxyethylidene-1,1-diphosphonic acid, and nitrilotrismethylenephosphonic acid.

[14]

The treatment liquid described in any one of [1] to [13], further containing an anticorrosive.

[15]

The treatment liquid described in [14], in which the anticorrosive is benzotriazoles.

[16]

The treatment liquid described in [15], in which the benzotriazoles are benzotriazole that may be substituted with one or more kinds of substituents selected from the group consisting of an alkyl group which may further contain a substituent, an aryl group which may further contain a substituent, a halogen atom, an amino group which may further contain a substituent, a nitro group, an alkoxy group which may further contain a substituent, and a hydroxyl group.

[17]

The treatment liquid described in [14], in which the anticorrosive is one or more kinds of compounds selected from the group consisting of benzotriazole, 5-aminotetrazole, 1-hydroxybenzotriazole, 5-phenylthiol-benzotriazole, 5-chlorobenzotriazole, 4-chlorobenzotriazole, 5-bromobenzotriazole, 4-bromobenzotriazole, 5-fluorobenzotriazole, 4-fluorobenzotriazole, naphthotriazole, tolyltriazole, 5-phenyl-benzotriazole, 5-nitrobenzotriazole, 4-nitrobenzotriazole, 3-amino-5-mercapto-1,2,4-triazole, 2-(5-amino-pentyl)-benzotriazole, 1-amino-benzotriazole, 5-methyl-1H-benzotriazole, benzotriazole-5-carboxylic acid, 4-methylbenzotriazole, 4-ethylbenzotriazole, 5-ethylbenzotriazole, 4-propylbenzotriazole, 5-propylbenzotriazole, 4-isopropylbenzotriazole, 5-isopropylbenzotriazole, 4-n-butylbenzotriazole, 5-n-butylbenzotriazole, 4-isobutylbenzotriazole, 5-isobutylbenzotriazole, 4-pentylbenzotriazole, 5-pentylbenzotriazole, 4-hexylbenzotriazole, 5-hexylbenzotriazole, 5-methoxybenzotriazole, 5-hydroxybenzotriazole, dihydroxypropylbenzotriazole, 1-[N,N-bis(2-ethylhexyl)aminomethyl]-benzotriazole, 5-t-butylbenzotriazole, 5-(1',1'-dimethylpropyl)-benzotriazole, 5-(1',1',3'-trimethylbutyl)benzotriazole, 5-n-octylbenzotriazole, and 5-(1',1',3',3'-tetramethylbutyl)benzotriazole.

[18]

The treatment liquid described in any one of [1] to [17], further containing one or more kinds of organic solvents selected from the group consisting of an alcohol-based solvent, a ketone-based solvent, an ester-based solvent, and an ether-based solvent.

[19]

The treatment liquid described in any one of [1] to [18], in which the treatment liquid has a pH of 6 to 11.

[20]

The treatment liquid described in any one of [1] to [19], in which the treatment liquid is used for an object to be treated that contains a cobalt-containing substance containing cobalt atoms and a metal-containing substance containing metal atoms other than cobalt atoms.

[21]

The treatment liquid described in [20], in which the cobalt-containing substance is simple cobalt, a cobalt alloy, a cobalt oxide, or a cobalt nitride.

[22]

A method for treating an object to be treated, including bringing an object to be treated that contains a cobalt-containing substance containing cobalt atoms into contact with the treatment liquid described in any one of [1] to [21] so that the cobalt-containing substance is dissolved.

[23]

A method for treating an object to be treated, including a step A of performing a treatment on an object to be treated containing a metal layer so that a surface layer of the metal layer is oxidized and turns into a metal oxide layer, and a step B of bringing the object to be treated obtained by the step A into contact with the treatment liquid described in any one of [1] to [19] so that the metal oxide layer is dissolved, in which the treatment in the step A is a liquid treatment of bringing the object to be treated into contact with a solution selected from the group consisting of water, hydrogen peroxide water, a mixed aqueous solution of ammonia and hydrogen peroxide, a mixed aqueous solution of hydrofluoric acid and hydrogen peroxide water, a mixed aqueous solution of sulfuric acid and hydrogen peroxide water, a mixed aqueous solution of hydrochloric acid and hydrogen peroxide water, water containing dissolved oxygen, and water containing dissolved ozone, an ozone treatment of bringing the object to be treated into contact with an ozone gas, a heating treatment in oxygen in which the object to be treated is heated in an oxygen atmosphere, or a plasma treatment using an oxygen gas.

[24]

The method for treating an object to be treated described in [23], in which the step A and the step B are alternately repeated.

[25]

The method for treating an object to be treated described in [23] or [24], in which the metal layer consists of a cobalt-containing substance that is simple cobalt or a cobalt alloy.

[26]

A method for treating an object to be treated, including performing a dry etching treatment on an object to be treated containing a metal-based material, and then bringing the object to be treated into contact with the treatment liquid described in any one of [1] to [19] so that dry etching residues are removed.

[27]

The method for treating an object to be treated described in [26], in which the metal-based material is a cobalt-containing substance containing cobalt atoms.

According to an aspect of the present invention, a treatment liquid having excellent organic residue removability and excellent stability can be provided.

Furthermore, according to an aspect of the present invention, a method for treating an object to be treated relating to the aforementioned treatment liquid can be provided.

DESCRIPTION OF THE PREFERRED EMBODIMENTS

Figure 1:
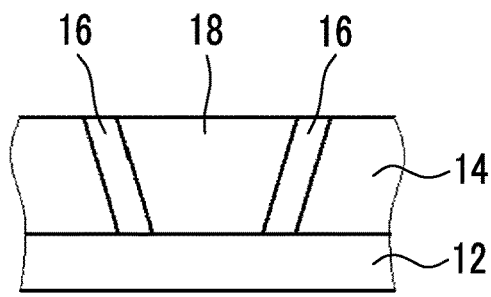
FIG. 1 is a cross-sectional view showing an embodiment of an object to be treated.

Hereinafter, the present invention will be specifically described.

The following constituents will be described based on typical embodiments of the present invention in some cases, but the present invention is not limited to the embodiments.

In the present specification, the range of numerical values described using "to" means a range including the numerical values listed before and after "to" as the lower limit and the upper limit.

Furthermore, in the present invention, "ppm" means "parts-per-million ($10^{-6}$)", "ppb" means "parts-per-billion ($10^{-9}$)", and "ppt" means "parts-per-trillion ($10^{-12}$)".

In the present specification, "room temperature" is "25° C.".

[Treatment Liquid]

The treatment liquid according to an aspect of the present invention contains water, hydroxylamine, and one or more kinds of hydrazines selected from the group consisting of hydrazine, a hydrazine salt, and a hydrazine derivative, in which a content of the hydrazines is 1 part by mass or less with respect to 100 parts by mass of the hydroxylamine.

It is unclear what mechanism works for the treatment liquid constituted as above to achieve the above objects. According to the inventors of the present invention, the mechanism is considered to be as below.

That is, in the treatment liquid according to the aspect of the present invention, water contains both the hydroxylamine and hydrazines. Hydrazines have more nitrogen atoms than hydroxylamine, and nitrogen atoms have more unshared electron pairs than hydroxylamine.

Presumably, because hydrazines are adequately rich in unshared electron pairs on nitrogen, the coexistence of the hydrazines and the hydroxylamine may enable the hydrazines and/or hydroxylamine to suitably interact with an organic substance, which may enable the treatment liquid to exhibit excellent organic residue removability. In addition, presumably, because the content of the hydrazines is equal to or less than a predetermined amount, hydroxylamine decomposition that may occur during storage of the treatment liquid may be suppressed, which may contribute to the excellent stability of the treatment liquid.

Furthermore, in a case where the treatment liquid according to the aspect of the present invention contains a predetermined type and amount of anions, either or both of the removability for residues that the object to be treated can further contain and contain a metal as a main component (hereinafter, the removability will be also simply called "metal residue removability of the treatment liquid") and surface smoothness of a metal-containing substance (such as a cobalt-containing substance) that the object to be treated having been treated can contain (hereinafter, the surface smoothness will be also simply called "smoothness of the object to be treated") are also excellent.

Hereinafter, regarding the treatment liquid according to the aspect of the present invention, further improving organic residue removability, stability, metal residue removability, and/or smoothness of the object to be treated will be also simply described as "further improving the effects of the treatment liquid".

Hereinafter, the components contained in the treatment liquid according to the embodiment of the present invention will be specifically described.

<Water>

The treatment liquid contains water.

The water is not particularly limited, and examples thereof include distilled water, deionized water, and pure water.

The content of water in the treatment liquid is not particularly limited. The content of water with respect to the total mass of the treatment liquid is preferably 50% by mass or more, more preferably 70% by mass or more, and even more preferably 80% by mass or more. The upper limit of the content of water is less than 100% by mass.

<Hydroxylamine>

The treatment liquid contains hydroxylamine ($NH_2OH$).

The hydroxylamine may be ionized in the treatment liquid.

The content of hydroxylamine is not particularly limited. In view of further improving the effects of the treatment liquid, the content of the hydroxylamine compound with respect to the total mass of the treatment liquid is preferably 0.001% to 25% by mass.

In a case where the content of hydroxylamine is 0.001% by mass or more with respect to the total mass of the treatment liquid, the washing properties of the treatment liquid are further improved. In a case where the content of hydroxylamine is 25% by mass or less with respect to the total mass of the treatment liquid, the smoothness of the object to be treated is further improved.

In order that the performances of the treatment liquid are well balanced, the content of hydroxylamine with respect to the total mass of the treatment liquid is, for example, preferably 0.05% to 15% by mass, more preferably 0.1% to 10% by mass, and even more preferably 0.5% to 8% by mass.

The content of hydroxylamine in the treatment liquid can be measured by ion chromatography (Dionex ICS-2100 from Thermo Fisher Scientific Inc., or the like).

Furthermore, in a case where the components and formulation of the raw materials used for preparing the treatment liquid are known, the content of hydroxylamine may be calculated from the amount of the compound formulated.

<Hydrazines>

The treatment liquid contains one or more kinds of hydrazines selected from the group consisting of hydrazine, a hydrazine salt (a salt of hydrazine), and a hydrazine derivative (a derivative of hydrazine).

The hydrazine derivative may be a salt or a derivative other than a salt.

Examples of the hydrazine salt include hydrazine sulfate, hydrazine hydrochloride, and hydrazine acetate.

Examples of the hydrazine derivative include a compound represented by General Formula (A) (a compound represented by $H_2N—N—R^N{}_2$), a compound represented by General Formula (B) (a compound represented by $H_2N—N=X$), a compound having a pyrazole ring (pyrazols), a salt of these (such as sulfate, hydrochloride, or acetate).

$$H_2N—N—R^N{}_2 \quad\quad (A)$$

$$H_2N—N=X \quad\quad (B)$$

It is also preferable that the hydrazine derivative be not azoles (such as benzotriazoles) other than pyrazoles.

In General Formula (A) ($H_2N—N—R^N{}_2$), two $R^N$'s each independently represent a hydrogen atom or a substituent. Two $R^N$'s may be bonded to each other to form a ring. Here, at least one of two $R^N$'s is not a hydrogen atom (in other words, at least one of two $R^N$'s is a substituent, or two $R^N$'s are bonded to each other to form a ring).

As the substituent represented by $R^N$, an alkyl group which may have a substituent (the alkyl group may be linear or branched, and preferably has 1 to 5 carbon atoms) or -L$^N$-NH$_2$ (L$^N$ represents a single bond or a divalent linking group, and the divalent linking group is preferably —CO—, —CS—, —NH—, —C(=NH)—, or a group consisting of a combination of two or more of these groups) is preferable.

In General Formula (B) (H$_2$N—N=X), X represents a divalent group. Especially, X is preferably =CR$^C_2$. Two R$^C$'s each independently represent a hydrogen atom or a substituent.

In the hydrazine derivative, the total number of atoms other than hydrogen atoms is preferably 3 to 30, more preferably 3 to 15, and even more preferably 3 to 8.

Specific examples of the hydrazine derivative include pyrazole, carbohydrazide, semicarbazide, thiosemicarbazide, monomethylhydrazide, t-butylhydrazine, dimethylhydrazine (1,1-dimethylhydrazine), and aminoguanidine.

It is preferable that the hydrazines contain at least hydrazine among the above.

The content of hydrazine with respect to the total mass of the hydrazines is preferably 20% to 100% by mass, and more preferably 50% to 100% by mass.

In the treatment liquid, the total content of the hydrazines (preferably hydrazine) with respect to 100 parts by mass of the hydroxylamine is 1 part by mass or less. In view of further improving the stability of the treatment liquid, the total content of the hydrazines is preferably 0.5 parts by mass or less. In view of further improving the organic residue removability of the treatment liquid, the total content of the hydrazines is preferably 0.00001 parts by mass or more, more preferably 0.0001 parts by mass or more, even more preferably 0.0005 parts by mass or more, and particularly preferably 0.005 parts by mass or more.

In the treatment liquid, the total content of the hydrazines (preferably hydrazine) is preferably 0.0001 to 3,000 ppm by mass with respect to the total mass of the treatment liquid. In a case where the total content of the hydrazines is 0.0001 ppm by mass or more (preferably 0.0005 ppm by mass or more, more preferably 0.005 ppm by mass or more, and even more preferably 0.05 ppm by mass or more), the organic residue removability of the treatment liquid is further improved. In a case where the total content of the hydrazines is 3,000 ppm by mass or less (preferably 300 ppm by mass or less), the stability of the treatment liquid is further improved.

The type and content of the hydrazines in the treatment liquid can be measured by ion chromatography (Dionex ICS-2100 from Thermo Fisher Scientific Inc., or the like). Furthermore, in a case where the components and formulation of the raw materials used for preparing the treatment liquid are known, the content of hydroxylamine may be calculated from the amount of the compound formulated.

The method for introducing hydrazines into the treatment liquid is not particularly limited. For example, a substance containing hydrazines (such as hydrazines or an aqueous solution of hydrazines) may be added in preparing the treatment liquid. Furthermore, a substance containing hydrazines as a trace component (impurity or the like) may be used as a raw material in preparing the treatment liquid so that the hydrazines are introduced into the treatment liquid.

<First Anions>

The treatment liquid preferably contains one or more kinds of first anions selected from the group consisting of Cl$^-$, NO$_2^-$, and NO$_3^-$, more preferably contains two or more kinds of first anions selected from the same group, and even more preferably contains three kinds of first anions selected from the same group.

That is, it is preferable that the treatment liquid contain all of Cl$^-$, NO$_2^-$, and NO$_3^-$.

In the treatment liquid, the total content of the first anions (total content of Cl$^-$, NO$_2^-$, and NO$_3^-$) is preferably 0.00001 to 100 parts by mass with respect to 100 parts by mass of hydroxylamine.

In a case where the total content of the first anions is 0.00001 parts by mass or more, the metal residue removability of the treatment liquid is further improved. In a case where the total content of the first anions is 100 parts by mass or less, the smoothness of the object to be treated is further improved. In order that the performances of the treatment liquid are well balanced, the total content of the first anions is, for example, preferably 0.0001 to 30 parts by mass, more preferably 0.1 to 25 parts by mass, and even more preferably 0.1 to 10 parts by mass.

The inventors of the present invention consider that in a case where the treatment liquid contains anions as described above, the effects of the treatment liquid may be further improved for the following reason.

That is, in a case where the first anions are in water in the treatment liquid according to the aspect of the present invention, the anions suitably react with metal-containing residues and the like generated after dry etching, which can further improve the solubility of the residues in water and enhance the washing properties. Such an effect is more marked in a case where the total content of the first anions is equal to or more than a predetermined amount with respect to the hydroxylamine. Furthermore, presumably, because the total content of the first anions is equal to or less than a predetermined amount with respect to the hydroxylamine, so-called pitting and corrosion caused in a metal by anions may be suppressed, and the smoothness of the surface after treatment could be improved.

In the treatment liquid, the total content of the first anions is preferably 0.001 to 50,000 ppm by mass with respect to the total mass of the treatment liquid.

In a case where the total content of the first anions is 0.001 ppm by mass or more with respect to the total mass of the treatment liquid, the washing properties of the treatment liquid are further improved. In a case where the total content of the first anions is 50,000 ppm by mass or less with respect to the total mass of the treatment liquid, the smoothness of the object to be treated is further improved. In order that the performances of the treatment liquid are well balanced, the total content of the first anions with respect to the total mass of the treatment liquid is, for example, more preferably 1 to 25,000 ppm by mass, and even more preferably 2 to 15,000 ppm by mass.

In the treatment liquid, the content of Cl$^-$ is preferably 0.001 to 5,000 ppm by mass with respect to the total mass of the treatment liquid.

In a case where the content of Cl$^-$ is 0.05 ppm by mass or more with respect to the total mass of the treatment liquid, the washing properties of the treatment liquid are further improved. In a case where the content of Cl$^-$ is 5,000 ppm by mass or less with respect to the total mass of the treatment liquid, the smoothness of the object to be treated is further improved.

In order that the performances of the treatment liquid are well balanced, the content of Cl$^-$ with respect to the total mass of the treatment liquid is, for example, more preferably 0.05 to 2,000 ppm by mass, and even more preferably 0.1 to 500 ppm by mass.

In the treatment liquid, the content of NO$_2^-$ is preferably 0.001 to 30,000 ppm by mass with respect to the total mass of the treatment liquid.

In a case where the content of $NO_2^-$ is 0.001 ppm by mass or more with respect to the total mass of the treatment liquid, the washing properties of the treatment liquid are further improved. In a case where the content of $NO_2^-$ is 30,000 ppm by mass or less with respect to the total mass of the treatment liquid, the smoothness of the object to be treated is further improved. In order that the performances of the treatment liquid are well balanced, the content of $NO_2^-$ with respect to the total mass of the treatment liquid is, for example, more preferably 0.5 to 20,000 ppm by mass, and even more preferably 1 to 5,000 ppm by mass.

In the treatment liquid, the content of $NO_3^-$ is preferably 0.001 to 30,000 ppm by mass with respect to the total mass of the treatment liquid.

In a case where the content of $NO_3^-$ is 0.001 ppm by mass or more with respect to the total mass of the treatment liquid, the washing properties of the treatment liquid are further improved. In a case where the content of $NO_3^-$ is 30,000 ppm by mass or less with respect to the total mass of the treatment liquid, the smoothness of the object to be treated is further improved. In order that the performances of the treatment liquid are well balanced, the content of $NO_3^-$ with respect to the total mass of the treatment liquid is, for example, more preferably 0.5 to 20,000 ppm by mass, and even more preferably 1 to 5,000 ppm by mass.

Especially, among the first anions, $NO_2^-$ and $NO_3^-$ are also called specific anions.

The total mass of the two kinds of specific anions consisting of $NO_2^-$ and $NO_3^-$ contained in the treatment liquid is preferably 0.001 to 50,000 ppm by mass with respect to the total mass of the treatment liquid.

In order that the performances of the treatment liquid are well balanced, the total mass of the specific anions contained in the treatment liquid with respect to the total mass of the treatment liquid is more preferably 1 to 50,000 ppm by mass, and even more preferably 2 to 10,000 ppm by mass.

In the treatment liquid, the total mass of the two kinds of specific anions consisting of $NO_2^-$ and $NO_3^-$ contained in the treatment liquid is preferably larger than the mass of the $Cl^-$ contained in the treatment liquid. In this case, in the treatment liquid, the content of the $Cl^-$ with respect to the total mass of the treatment liquid is preferably more than 0 ppm by mass, and more preferably 0.001 ppm by mass.

For example, a ratio of the total mass of the specific anions contained in the treatment liquid to the mass of the $Cl^-$ contained in the treatment liquid (total mass of specific anions contained in treatment liquid/mass of $Cl^-$ contained in treatment liquid) is preferably 1.1 to 100, and more preferably 1.5 to 30.

In the treatment liquid, the content of the first anions preferably satisfies the relationship of "mass of $Cl^-$ contained in treatment liquid≤mass of $NO_2^-$ contained in treatment liquid≤mass of $NO_3^-$ contained in treatment liquid", and more preferably satisfies the relationship of "0.001 ppm by mass≤mass of $Cl^-$ contained in treatment liquid≤mass of $NO_2^-$ contained in treatment liquid≤mass of $NO_3^-$ contained in treatment liquid".

<Second Anions>

The treatment liquid may further contain one or more kinds of second anions selected from the group consisting of $SO_4^{2-}$ and $PO_4^{3-}$.

That is, the treatment liquid may contain either or both of $SO_4^{2-}$ and $PO_4^{3-}$, or may contain neither of these.

In a case where the treatment liquid contains one or more kinds of second anions, the total content of the first anions and the second anions (total content of $Cl^-$, $NO_2^-$, $NO_3^-$, $SO_4^{2-}$, and $PO_4^{3-}$) is preferably 0.0001 to 30 parts by mass with respect to 100 parts by mass of hydroxylamine.

In a case where the total content of the first and second anions is 0.0001 parts by mass or more, the washing properties of the treatment liquid are further improved. In a case where the total content is 30 parts by mass or less, the smoothness of the object to be treated is further improved. In order that the performances of the treatment liquid are well balanced, the total content of the first and second anions is, for example, more preferably 0.1 to 25 parts by mass, and even more preferably 0.1 to 10 parts by mass.

In a case where the treatment liquid contains the second anions, the total content of the second anions (total content of $SO_4^{2-}$ and $PO_4^{3-}$) in the treatment liquid with respect to the total mass of the treatment liquid is preferably more than 0 ppm by mass and 1,000 ppm by mass or less, and more preferably more than 0 ppm by mass and 50 ppm by mass or less.

In a case where the treatment liquid contains $SO_4^{2-}$, the content of $SO_4^{2-}$ in the treatment liquid with respect to the total mass of the treatment liquid is preferably more than 0 ppm by mass and 500 ppm by mass or less, and more preferably more than 0 ppm by mass and 30 ppm by mass or less.

In a case where the treatment liquid contains $PO_4^{3-}$, the content of $PO_4^{3-}$ in the treatment liquid with respect to the total mass of the treatment liquid is preferably more than 0 ppm by mass and 500 ppm by mass or less, and more preferably more than 0 ppm by mass and 30 ppm by mass or less.

The content of the first anions and the second anions in the treatment liquid can be measured by ion chromatography (Dionex ICS-2100 from Thermo Fisher Scientific Inc., or the like).

Furthermore, in a case where the components and formulation of the raw materials used for preparing the treatment liquid are known, the content of hydroxylamine may be calculated from the amount of the compound formulated.

The method for introducing the first anions and/or the second anions into the treatment liquid is not particularly limited. For example, the substances containing the first anions and/or the second anions (such as nitric acid, nitrous acid, hydrochloric acid, sulfuric acid, phosphoric acid, and aqueous solutions of these) may be added as sources of the first anions and/or the second anions in the process of preparing the treatment liquid.

Furthermore, the compounds that produce substances containing the first anions and/or the second anions by dissolution in water, chemical reactions, and the like may be adopted as sources of the first anions and/or the second anions. Examples of such compounds include dinitrogen trioxide which produces nitrous acid by reacting with water.

In addition, the substances containing the first anions and/or the second anions as impurities (trace components) may be used as raw materials for preparing the treatment liquid so that the first anions and/or the second anions are introduced into the treatment liquid.

<Chelating Agent>

The treatment liquid may contain a chelating agent. In a case where the treatment liquid contains a chelating agent, the washing properties of the treatment liquid are further improved. However, the chelating agent mentioned herein does not include the aforementioned hydrazines.

The chelating agent means a substance (preferably an acid) capable of functioning as a chelating ligand, and is preferably a compound containing one or more (preferably 1 to 8) acid groups.

The acid group is not particularly limited, and is preferably at least one kind of functional group selected from the group consisting of a carboxylic acid group, a sulfonic acid group, and a phosphonic acid group.

Examples of the chelating agent containing a carboxylic acid group include polyaminopolycarboxylic acids, aliphatic dicarboxylic acids, aliphatic polycarboxylic acids containing a hydroxyl group, and ascorbic acids.

The polyaminopolycarboxylic acids are compounds containing a plurality of amino groups and a plurality of carboxylic acid groups. Examples thereof include mono- or polyalkylene polyamine polycarboxylic acid, polyaminoalkane polycarboxylic acid, polyaminoalkanol polycarboxylic acid, and hydroxyalkyl ether polyamine polycarboxylic acid.

Examples of the polyaminopolycarboxylic acids include butylenediaminetetraacetic acid, diethylenetriaminepentaacetic acid (DTPA), ethylenediaminetetrapropionic acid, triethylenetetraminehexacetic acid, 1,3-diamino-2-hydroxypropane-N,N,N',N'-tetraacetic acid, propylenediaminetetraacetic acid, ethylenediaminetetraacetic acid (EDTA), trans-1,2-diaminocyclohexanetetraacetic acid, ethylenediaminediacetic acid, ethylenediaminedipropionic acid, 1,6-hexamethylene-diamine-N,N,N',N'-tetraacetic acid, N,N-bis(2-hydroxybenzyl)ethylenediamine-N,N-diacetic acid, diaminopropanetetraacetic acid, 1,4,7,10-tetraazacyclododecane-tetraacetic acid, diaminopropanol tetraacetic acid, and (hydroxyethyl)ethylenediaminetriacetic acid. Among these, diethylenetriaminepentaacetic acid (DTPA), ethylenediaminetetraacetic acid (EDTA), or trans-1,2-diaminocyclohexanetetraacetic acid is preferable.

Examples of the aliphatic dicarboxylic acids include oxalic acid, malonic acid, succinic acid, and maleic acid. Among these, oxalic acid, malonic acid, or succinic acid is preferable.

Examples of the aliphatic polycarboxylic acids containing a hydroxyl group include malic acid, tartaric acid, and citric acid. Among these, citric acid is preferable.

Examples of ascorbic acids include ascorbic acid, isoascorbic acid, ascorbic acid sulfate, ascorbic acid phosphate, ascorbic acid 2-glucoside, ascorbic acid palmitate, ascorbyl tetraisopalmitate, ascorbic acid isopalminate, and ascorbic acids of these salts and the like. Among these, ascorbic acid is preferable.

Examples of the chelating agent containing a sulfonic acid group include methanesulfonic acid.

Examples of the chelating agent containing a phosphonic acid group include methyldiphosphonic acid, aminotri(methylenephosphonic acid), 1-hydroxyethylidene-1,1-diphosphonic acid, nitrilotrismethylenephosphonic acid (NTMP), ethylenediaminetetrakis(methylenephosphonic acid) (EDTPO), hexamethylenediaminetetra(methylenephosphonic acid), propylenediaminetetra(methylenephosphonic acid), diethylenetriaminepenta(methylenephosphonic acid), triethylenetetraminehexa(methylenephosphonic acid), triaminotriethylaminehexa(methylenephosphonic acid), trans-1,2-cyclohexanediaminetetra(methylenephosphonic acid), glycol ether diaminetetra(methylenephosphonic acid), tetraethylenepentaminehepta(methylenephosphonic acid), and glycine-N,N-bis(methylenephosphonic acid) (glyphosine).

In view of further improving the effects of the treatment liquid, the chelating agent is preferably one or more kinds of compounds selected from the group consisting of diethylenetriaminepentaacetic acid, ethylenediaminetetraacetic acid, trans-1,2-diaminocyclohexanetetraacetic acid, oxalic acid, malonic acid, succinic acid, citric acid, methanesulfonic acid, 1-hydroxyethylidene-1,1-diphosphonic acid, and nitrilotrismethylenephosphonic acid.

Among these, diethylenetriaminepentaacetic acid or citric acid is more preferable as the chelating agent.

In a case where the treatment liquid contains a chelating agent, in view of further improving the effects of the treatment liquid, the content of the chelating agent with respect to the total mass of the treatment liquid is preferably 0.01% to 20% by mass, more preferably 0.1% to 15% by mass, and even more preferably 0.2% to 5% by mass.

One kind of chelating agent may be used alone, or two or more kinds of chelating agents may be used. In a case where two or more kinds of chelating agents are used, the total amount thereof is preferably within the above range.

<Anticorrosive>

The treatment liquid may contain an anticorrosive. The anticorrosive has a function of preventing overetching of an object to be treated, and further improves the smoothness of the object to be treated. The anticorrosive mentioned herein does not include the aforementioned hydrazines and chelating agent.

As the anticorrosive, for example, a compound represented by Formula (1X) is preferable.

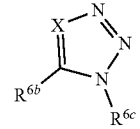

(1X)

In Formula (1X), X represents —CR$^{6a}$= or —N=.

In Formula (1X), R$^{6a}$, R$^{6b}$, and R$^{6c}$ each independently represent a hydrogen atom or a substituent.

Each of the above substituents is preferably a hydrocarbon group, a halogen atom (such as a fluorine atom, a chlorine atom, a bromine atom, or an iodine atom), an amino group, a nitro group, an alkoxy group (preferably having 1 to 12 carbon atoms, more preferably having 1 to 6 carbon atoms, and even more preferably having 1 to 3 carbon atoms), or a hydroxyl group. If possible, these substituents may further contain substituents.

Examples of each of the substituents that the aforementioned hydrocarbon group and alkoxy group may further contain include a hydroxyl group, a carboxyl group, and a substituted or unsubstituted amino group (preferably having an alkyl group having 1 to 6 carbon atoms as a substituent, and more preferably having an alkyl group having 1 to 3 carbon atoms as a substituent).

Examples of the substituent that the aforementioned amino group may further contain include an alkyl group having 1 to 6 carbon atoms.

Examples of each of the hydrocarbon groups represented by R$^{6a}$ and R$^{6b}$ in Formula (1X) include an alkyl group (preferably having 1 to 12 carbon atoms, more preferably having 1 to 6 carbon atoms, and even more preferably having 1 to 3 carbon atoms), an alkenyl group (preferably having 2 to 12 carbon atoms, and more preferably having 2 to 6 carbon atoms), an alkynyl group (preferably having 2 to 12 carbon atoms, and more preferably having 2 to 6 carbon atoms), an aryl group (preferably having 6 to 22 carbon atoms, more preferably having 6 to 14 carbon atoms, and even more preferably having 6 to 10 carbon atoms), and an aralkyl group (preferably having 7 to 23 carbon atoms, more preferably having 7 to 15 carbon atoms, and even more preferably having 7 to 11 carbon atoms).

If possible, these hydrocarbon groups may further contain substituents. Examples of the substituents that the hydrocarbon groups may further contain are as described above.

In a case where X represents —$CR^{6a}$=, $R^{6a}$ and $R^{6b}$ may be bonded to each other to form a ring.

Examples of the ring formed by the bonding of $R^{6a}$ and $R^{6b}$ include a benzene ring and a naphthalene ring. In a case where $R^{6a}$ and $R^{6b}$ are bonded to each other to form a ring, the aforementioned ring may further have a substituent (such as a hydrocarbon group having 1 to 5 carbon atoms or a carboxyl group).

The anticorrosive is preferably azoles (compounds having a 5-membered heterocyclic ring structure containing one or more nitrogen atoms). However, azoles as anticorrosive agents are other than pyrazoles.

As the azoles, benzotriazoles (compounds having a benzotriazole structure) are also preferable. That is, it is also preferable that the anticorrosive be benzotriazoles.

Examples of the benzotriazoles include benzotriazole that may be substituted with one or more kinds of substituents selected from the group consisting of an alkyl group which may further contain a substituent, an aryl group which may further contain a substituent, a halogen atom (such as a fluorine atom, a chlorine atom, a bromine atom, or an iodine atom), an amino group which may further contain a substituent, a nitro group, an alkoxy group which may further contain a substituent, and a hydroxyl group.

The number of carbon atoms in the alkyl group is preferably 1 to 12, more preferably 1 to 6, and even more preferably 1 to 3. The preferable number of carbon atoms means the number of carbon atoms including the carbon atoms in a substituent that the alkyl group can contain.

The number of carbon atoms in the aryl group is preferably 6 to 22, more preferably 6 to 14, and even more preferably 6 to 10. The preferable number of carbon atoms means the number of carbon atoms including the carbon atoms in a substituent that the aryl group can contain.

The number of carbon atoms in the alkoxy group is preferably 1 to 12, more preferably 1 to 6, and even more preferably 1 to 3. The preferable number of carbon atoms means the number of carbon atoms including the carbon atoms in a substituent that the alkoxy group can contain.

Examples of each of the substituents that the alkyl group, the aryl group, and the alkoxy group may further contain include a hydroxyl group, a carboxyl group, and a substituted or unsubstituted amino group (preferably having an alkyl group having 1 to 6 carbon atoms as a substituent, and more preferably having an alkyl group having 1 to 3 carbon atoms as a substituent).

Examples of the substituent that the amino group may further contain include an alkyl group having 1 to 6 carbon atoms.

In a case where the benzotriazoles are benzotriazole containing a substituent, each substituent preferably substitutes for one or more positions among position 1, position 4, and position 5 of the benzotriazole, and more preferably substitutes for one of position 1, position 4, and position 5 of the benzotriazole.

The positions other than position 1, position 4, and position 5 of the benzotriazole may or may not be substituted with a substituent.

Preferable examples of the substituents that the benzotriazole contains are as described above.

Particularly, benzotriazole having an amino group as a substituent at position 1 or benzotriazole having an alkyl group as a substituent at position 5 is preferable.

The benzotriazoles are also preferably unsubstituted benzotriazole.

Examples of the benzotriazoles include benzotriazole (BTA), 1-hydroxybenzotriazole, 5-phenylthiol-benzotriazole, 5-chlorobenzotriazole, 4-chlorobenzotriazole, 5-bromobenzotriazole, 4-bromobenzotriazole, 5-fluorobenzotriazole, 4-fluorobenzotriazole, naphthotriazole, tolyltriazole, 5-phenyl-benzotriazole, 5-nitrobenzotriazole, 4-nitrobenzotriazole, 3-amino-5-mercapto-1,2,4-triazole, 2-(5-aminopentyl)-benzotriazole, 1-amino-benzotriazole, 5-methyl-1H-benzotriazole, benzotriazole-5-carboxylic acid, 4-methylbenzotriazole, 4-ethylbenzotriazole, 5-ethylbenzotriazole, 4-propylbenzotriazole, 5-propylbenzotriazole, 4-isopropylbenzotriazole, 5-isopropylbenzotriazole, 4-n-butylbenzotriazole, 5-n-butylbenzotriazole, 4-isobutylbenzotriazole, 5-isobutylbenzotriazole, 4-pentylbenzotriazole, 5-pentylbenzotriazole, 4-hexylbenzotriazole, 5-hexylbenzotriazole, 5-methoxybenzotriazole, 5-hydroxybenzotriazole, dihydroxypropylbenzotriazole, 1-[N,N-bis(2-ethylhexyl) aminomethyl]-benzotriazole, 5-t-butylbenzotriazole, 5-(1',1'-dimethylpropyl)-benzotriazole, 5-(1',1',3'-trimethylbutyl) benzotriazole, 5-n-octylbenzotriazole, and 5-(1',1',3',3'-tetramethylbutyl)benzotriazole.

Examples of the anticorrosive other than benzotriazoles include 1,2,4-triazole (TAZ), 5-aminotetrazole (ATA), 5-amino-1,3,4-thiadiazole-2-thiol, 3-amino-1H-1,2,4-triazole, 3,5-diamino-1,2,4-triazole, 3-amino-5-mercapto-1,2,4-triazole, 1-amino-1,2,4-triazole, 1-amino-1,2,3-triazole, 1-amino-5-methyl-1,2,3-triazole, 3-mercapto-1,2,4-triazole, 3-isopropyl-1,2,4-triazole, 1H-tetrazole-5-acetic acid, 2-mercaptobenzothiazole (2-MBT), 1-phenyl-2-tetrazoline-5-thione, 2-mercaptobenzimidazole (2-MBI), 4-methyl-2-phenylimidazole, 2-mercaptothiazoline, 2,4-diamino-6-methyl-1,3,5-triazine, thiazole, imidazole, benzimidazole, triazine, methyltetrazole, bismuthiol I, 1,3-dimethyl-2-imidazolidinone, 1,5-pentamethylenetetrazole, 1-phenyl-5-mercaptotetrazole, diaminomethyltriazine, imidazolinethione, 4-methyl-4H-1,2,4-triazole-3-thiol, 5-amino-1,3,4-thiadiazole-2-thiol, benzothiazole, 2,3,5-trimethylpyrazine, 2-ethyl-3,5-dimethylpyrazine, quinoxaline, acetylpyrrole, pyridazine, and pyrazine.

The anticorrosive is preferably one or more kinds of compounds selected from the group consisting of benzotriazole, 5-aminotetrazole, 1-hydroxybenzotriazole, 5-phenyl-thiol-benzotriazole, 5-chlorobenzotriazole, 4-chlorobenzotriazole, 5-bromobenzotriazole, 4-bromobenzotriazole, 5-fluorobenzotriazole, 4-fluorobenzotriazole, naphthotriazole, tolyltriazole, 5-phenyl-benzotriazole, 5-nitrobenzotriazole, 4-nitrobenzotriazole, 3-amino-5-mercapto-1,2,4-triazole, 2-(5-amino-pentyl)-benzotriazole, 1-amino-benzotriazole, 5-methyl-1H-benzotriazole, benzotriazole-5-carboxylic acid, 4-methylbenzotriazole, 4-ethylbenzotriazole, 5-ethylbenzotriazole, 4-propylbenzotriazole, 5-propylbenzotriazole, 4-isopropylbenzotriazole, 5-isopropylbenzotriazole, 4-n-butylbenzotriazole, 5-n-butylbenzotriazole, 4-isobutylbenzotriazole, 5-isobutylbenzotriazole, 4-pentylbenzotriazole, 5-pentylbenzotriazole, 4-hexylbenzotriazole, 5-hexylbenzotriazole, 5-methoxybenzotriazole, 5-hydroxybenzotriazole, dihydroxypropylbenzotriazole, 1-[N,N-bis(2-ethylhexyl)aminomethyl]-benzotriazole, 5-t-butylbenzotriazole, 5-(1',1'-dimethylpropyl)-benzotriazole, 5-(1',1',3'-trimethylbutyl)benzotriazole, 5-n-octylbenzotriazole, and 5-(1',1',3',3'-tetramethylbutyl) benzotriazole.

Among these, as the anticorrosive, benzotriazole, 1-amino-benzotriazole, or 5-methyl-1H-benzotriazole is more preferable, and 5-methyl-1H-benzotriazole is even more preferable.

In a case where the treatment liquid contains an anticorrosive (preferably azoles), the content of the anticorrosive with respect to the total mass of the treatment liquid is preferably 0.01% to 10% by mass, and more preferably 0.05% to 5% by mass.

One kind of anticorrosive may be used alone, or two or more kinds of anticorrosives may be used. In a case where two or more kinds of anticorrosives are used, the total amount thereof is preferably within the above range.

<Organic Solvent>

The treatment liquid according to the embodiment of the present invention may contain an organic solvent.

The organic solvent may be a water-soluble organic solvent.

For an organic solvent, "water-soluble" means that water at 25° C. and the organic solvent are miscible (dissolvable) at an arbitrary ratio.

Examples of the organic solvent include an alcohol-based solvent, a ketone-based solvent, an ester-based solvent, an ether-based solvent (such as glycol diether), a sulfone-based solvent, a sulfoxide-based solvent, a nitrile-based solvent, an amide-based solvent, and the like.

These solvents may be water-soluble.

Particularly, it is preferable that the treatment liquid contain one or more kinds of organic solvents selected from the group consisting of an alcohol-based solvent, a ketone-based solvent, an ester-based solvent, and an ether-based solvent.

Examples of the alcohol-based solvent include alkanediol (including alkylene glycol, for example), alkoxy alcohol (including glycol monoether, for example), a saturated aliphatic monohydric alcohol, an unsaturated non-aromatic monohydric alcohol, a low-molecular-weight alcohol having a ring structure, and the like.

Among these, as the alcohol-based solvent, glycol monoether or a saturated aliphatic monohydric alcohol is preferable.

Examples of the alkanediol include glycol, 2-methyl-1,3-propanediol, 1,3-propanediol, 2,2-dimethyl-1,3-propanediol, 1,4-butanediol, 1,3-butanediol, 1,2-butanediol, 2,3-butanediol, pinacol, alkylene glycol, and the like.

Examples of the alkylene glycol include ethylene glycol, propylene glycol, hexylene glycol, diethylene glycol, dipropylene glycol, triethylene glycol, tetraethylene glycol, and the like.

Examples of the alkoxy alcohol include 3-methoxy-3-methyl-1-butanol, 3-methoxy-1-butanol, 1-methoxy-2-butanol, glycol monoether, and the like.

Examples of the glycol monoether include ethylene glycol monomethyl ether, ethylene glycol monoethyl ether, ethylene glycol mono-n-propyl ether, ethylene glycol monoisopropyl ether, ethylene glycol monobutyl ether, diethylene glycol monomethyl ether, diethylene glycol monoethyl ether, diethylene glycol monobutyl ether, triethylene glycol monomethyl ether, triethylene glycol monoethyl ether, triethylene glycol monobutyl ether, 1-methoxy-2-propanol, 2-methoxy-1-propanol, 1-ethoxy-2-propanol, 2-ethoxy-1-propanol, propylene glycol mono-n-propyl ether, dipropylene glycol monomethyl ether, dipropylene glycol monoethyl ether, dipropylene glycol mono-n-propyl ether, tripropylene glycol monoethyl ether, tripropylene glycol monomethyl ether, ethylene glycol mono benzyl ether, diethylene glycol monobenzyl ether, 1-octanol, 2-octanol, 2-ethylhexanol, and the like.

Among these, ethylene glycol monobutyl ether is preferable.

Examples of the saturated aliphatic monohydric alcohol include methanol, ethanol, n-propyl alcohol, isopropyl alcohol, 1-butanol, 2-butanol, isobutyl alcohol, tert-butyl alcohol, 2-pentanol, t-pentyl alcohol, hexanol, and the like.

Examples of the unsaturated non-aromatic monohydric alcohol include allyl alcohol, propargyl alcohol, 2-butenyl alcohol, 3-butenyl alcohol, 4-penten-2-ol, and the like.

Examples of low-molecular-weight alcohol containing a ring structure include tetrahydrofurfuryl alcohol, furfuryl alcohol, 1,3-cyclopentanediol, and the like.

Examples of the ketone-based solvent include acetone, propanone, cyclobutanone, cyclopentanone, cyclohexanone, diacetone alcohol, 2-butanone, 5-hexanedione, 1,4-cyclohexanedione, 3-hydroxyacetophenone, 1,3-cyclohexanedione, cyclohexanone, and the like.

Examples of the ester-based solvent include glycol monoesters such as ethyl acetate, butyl acetate, ethylene glycol monoacetate, and diethylene glycol monoacetate, and glycol monoether monoesters such as propylene glycol monomethyl ether acetate, ethylene glycol monomethyl ether acetate, propylene glycol monoethyl ether acetate, and ethylene glycol monoethyl ether acetate.

Examples of the sulfone-based solvent include sulfolane, 3-methylsulfolane, 2,4-dimethylsulfolane, and the like.

Examples of the sulfoxide-based solvent include dimethyl sulfoxide and the like.

Examples of the nitrile-based solvent include acetonitrile and the like.

Examples of the amide-based solvent include N,N-dimethylformamide, 1-methyl-2-pyrrolidone, 2-pyrrolidinone, 1,3-dimethyl-2-imidazolidinone, F-caprolactam, formamide, N-methylformamide, acetamide, N-methylacetamide, N,N-dimethylacetamide, N-methylpropanamide, hexamethylphosphoric triamide, and the like.

In a case where the treatment liquid contains an organic solvent, the content of the organic solvent with respect to the total mass of the treatment liquid is preferably 0.1% to 20% by mass, and more preferably 0.5% to 10% by mass.

One kind of organic solvent may be used alone, or two or more kinds of organic solvents may be used. In a case where two or more kinds of organic solvents are used, the total amount thereof is preferably within the above range.

<Reducing Agent Different from Hydroxylamine>

The treatment liquid may contain a reducing agent different from hydroxylamine. The hydrazines, the chelating agent, and the anticorrosive are not included in the reducing agent different from hydroxylamine.

The reducing agent different from hydroxylamine is not particularly limited. The reducing agent is preferably a reducing substance such as a compound containing a OH group or a CHO group or a compound containing a sulfur atom. The reducing agent is oxidative and has a function of oxidizing $OH^-$ ions, dissolved oxygen, and the like which cause decomposition of hydroxylamine.

Among the reducing substances such as the compound containing a OH group or a CHO group and the compound containing a sulfur atom, one kind of compound selected from the group consisting of a compound represented by Formula (4) and a compound having a sulfur atom is preferable.

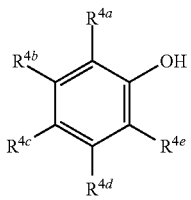

(4)

In Formula (4), $R^{4a}$ to $R^{4e}$ each independently represent a hydrogen atom, a hydroxyl group, or a hydrocarbon group which may have a heteroatom. In a case where $R^{4a}$ to $R^{4e}$ contain a hydrocarbon group which may have a heteroatom, the hydrocarbon group may have a substituent.

Examples of the hydrocarbon group represented by $R^{4a}$ to $R^{4e}$ in Formula (4) that may have a heteroatom include a hydrocarbon group and a hydrocarbon group containing a heteroatom.

Examples of the hydrocarbon group represented by $R^{4a}$ to $R^{4e}$ include an alkyl group (preferably having 1 to 12 carbon atoms, and more preferably having 1 to 6 carbon atoms), an alkenyl group (preferably having 2 to 12 carbon atoms, and more preferably having 2 to 6 carbon atoms), an alkynyl group (preferably having 2 to 12 carbon atoms, and more preferably having 2 to 6 carbon atoms), an aryl group (preferably having 6 to 22 carbon atoms, more preferably having 6 to 14 carbon atoms, and even more preferably having 6 to 10 carbon atoms), and an aralkyl group (preferably having 7 to 23 carbon atoms, more preferably having 7 to 15 carbon atoms, and even more preferably having 7 to 11 carbon atoms).

Examples of the hydrocarbon group represented by $R^{4a}$ to $R^{4e}$ containing a heteroatom include a group formed in a case where —$CH_2$— in the aforementioned hydrocarbon group is substituted, for example, with one kind of substituent selected from the group consisting of —O—, —S—, —CO—, —$SO_2$—, and —$NR^a$— or with a divalent group formed by combining two or more substituents among the above. Ra represents a hydrogen atom or a hydrocarbon group having 1 to 20 carbon atoms (preferably an alkyl group having 1 to 5 carbon atoms).

Examples of substituents include a hydroxyl group, a carboxyl group, and a substituted or unsubstituted amino group (the substituent is preferably an alkyl group having 1 to 6 carbon atoms and more preferably an alkyl group having 1 to 3 carbon atoms).

Examples of the compound represented by Formula (4) include gallic acid, resorcinol, ascorbic acid, tert-butylcatechol, catechol, isoeugenol, o-methoxyphenol, 4,4'-dihydroxyphenyl-2,2-propane, isoamyl salicylate, benzyl salicylate, methyl salicylate, and 2,6-di-t-butyl-p-cresol.

In view of adding reducing properties, the compound represented by Formula (4) preferably has two or more hydroxyl groups, and more preferably contains three or more hydroxyl groups. The position of substitution with a hydroxyl group is not particularly limited. In view of adding reducing properties, the position is preferably $R^{4a}$ and/or $R^{4b}$.

Examples of the compound represented by Formula (4) having two or more hydroxyl groups include catechol, resorcinol, tert-butylcatechol, and 4,4'-dihydroxyphenyl-2,2-propane. Examples of the compound represented by Formula (4) having three or more hydroxyl groups include gallic acid.

Examples of the compound containing a sulfur atom include mercaptosuccinic acid, dithiodiglycerol [$S(CH_2CH(OH)CH_2(OH))_2$], bis(2,3-dihydroxypropylthio)ethylene [$CH_2CH_2(SCH_2CH(OH)CH_2(OH))_2$], sodium 3-(2,3-dihydroxypropylthio)-2-methyl-propylsulfonate [$CH_2(OH)CH(OH)CH_2SCH_2CH(CH_3)CH_2SO_3Na$], 1-thioglycerol [$HSCH_2CH(OH)CH_2(OH)$], sodium 3-mercapto-1-propanesulfonate [$HSCH_2CH_2CH_2SO_3Na$], 2-mercaptoethanol [$HSCH_2CH_2(OH)$], thioglycolic acid [$HSCH_2CO_2H$], and 3-mercapto-1-propanol [$HSCH_2CH_2CH_2OH$]. Among these, a compound containing a SH group (mercapto compound) is preferable, 1-thioglycerol, sodium 3-mercapto-1-propanesulfonate, 2-mercaptoethanol, 3-mercapto-1-propanol, or thioglycolic acid is more preferable, and 1-thioglycerol or thioglycolic acid is even more preferable.

One kind of reducing agent different from hydroxylamine may be used alone, or two or more kinds of such reducing agents may be used in combination.

<Fluoride>

The treatment liquid may contain a fluoride. The fluoride facilitates the decomposition and solubilization of residues.

The fluoride is not particularly limited, and examples thereof include hydrofluoric acid (HF), fluorosilicate ($H_2SiF_6$), fluoroborate, ammonium fluorosilicate (($NH_4$)$_2SiF_6$), tetramethylammonium hexafluorophosphate, ammonium fluoride, an ammonium fluoride salt, an ammonium bifluoride salt, quaternary ammonium tetrafluoroborate and quaternary phosphonium tetrafluoroborate represented by Formulas $NR_4BF_4$ and $PR_4BF_4$ respectively, and tetrabutylammonium tetrafluoroborate (TBA-$BF_4$).

In the quaternary ammonium tetrafluoroborate (for example, tetramethylammonium tetrafluoroborate, tetraethylammonium tetrafluoroborate, tetrapropylammonium tetrafluoroborate, or tetrabutylammonium tetrafluoroborate) represented by Formula $NR_4BF_4$ and quaternary phosphonium tetrafluoroborate represented by Formula $PR_4BF_4$, R's may be the same or different from each other and each represent hydrogen, a linear, branched, or cyclic C1-C6 alkyl group (for example, a methyl group, an ethyl group, a propyl group, a butyl group, a pentyl group, or a hexyl group), or a linear or branched C6-C10 aryl group (for example, a benzyl group). One kind of fluoride may be used alone, or two or more kinds of fluorides may be used in combination as appropriate.

In a case where the treatment liquid contains a fluoride, the content of the fluoride with respect to the total mass of the treatment liquid is preferably 0.01% to 30% by mass, and more preferably 0.1% to 15% by mass.

<Metal Component>

The treatment liquid may contain a metal component.

Examples of the metal component include metal particles and metal ions. For example, the content of the metal component means the total content of metal particles and metal ions.

The treatment liquid may contain either metal particles or metal ions, or may contain both of them. It is preferable that the treatment liquid contain both the metal particles and metal ions.

Examples of the metal atom contained in the metal component include metal atoms selected from the group consisting of Ag, Al, As, Au, Ba, Ca, Cd, Co, Cr, Cu, Fe, Ga, Ge, K, Li, Mg, Mn, Mo, Na, Ni, Pb, Sn, Sr, Ti, and Zn.

The metal component may contain one kind of metal atom or two or more kinds of metal atoms.

The metal particles may be a simple metal or an alloy, and may be in the form of particles in which a metal and an organic substance are aggregated.

The metal component may be a metal component which is inevitably incorporated into each component (raw material) of the treatment liquid or a metal component inevitably incorporated into the treatment liquid during the manufacturing, storage, and/or transfer of the treatment liquid. Alternatively, the metal component may be intentionally added.

In a case where the treatment liquid contains a metal component, the content of the metal component is usually more than 0 ppt by mass and 10 ppm by mass or less with respect to the total mass of the treatment liquid. In view of further improving the effects of the treatment liquid, the content of the metal component is preferably more than 0 ppm by mass and 1 ppm by mass or less, and more preferably more than 0 ppb by mass and 100 ppb by mass or less.

The type and content of the metal component in the treatment liquid can be measured by single nano particle inductively coupled plasma mass spectrometry (SP-ICP-MS).

<pH Adjuster>

The treatment liquid may contain a pH adjuster other than the components described above. Examples of the pH adjuster include an acid compound and a base compound.

(Acid Compound)

Examples of the acid compound include acetic acid, perchloric acid, hypochlorous acid, and periodic acid.

(Base Compound)

Examples of the base compound include aqueous ammonia, an amine compound different from both the hydroxylamine and hydrazines, and a quaternary ammonium hydroxide salt.

Examples of the amine compound different from both the hydroxylamine and hydrazines include a cyclic compound (a compound containing a cyclic structure). Examples of the cyclic compound include an amine compound containing a cyclic structure that will be described later.

The quaternary ammonium hydroxide salt is not included in the amine compound different from both the hydroxylamine and hydrazines.

As the amine compound different from both the hydroxylamine and hydrazines, an amine compound containing a cyclic structure is preferable.

In the amine compound containing a cyclic structure, an amino group may be in either or both of the aforementioned cyclic structure and any position other than the cyclic structure.

Examples of the amine compound containing a cyclic structure include tetrahydrofurfurylamine, N-(2-aminoethyl)piperazine, 1,8-diazabicyclo[5.4.0]-7-undecene, 1,4-diazabicyclo[2.2.2]octane, hydroxyethyl piperazine, piperazine, 2-methylpiperazine, trans-2,5-dimethylpiperazine, cis-2,6-dimethylpiperazine, 2-piperidinemethanol, cyclohexylamine, and 1,5-diazabicyclo[4.3.0]-5-nonene.

As the amine compound, among these, tetrahydrofurfurylamine, N-(2-aminoethyl)piperazine, 1,8-diazabicyclo[5.4.0]-7-undecene, or 1,4-diazabicyclo[2.2.2]octane is preferable.

In a case where the treatment liquid contains the amine compound different from both the hydroxylamine and hydrazines, the content of such an amine compound with respect to the total mass of the treatment liquid is preferably 0.1% to 50% by mass, and more preferably 0.5% to 30% by mass.

Examples of the quaternary ammonium hydroxide salt include a compound represented by Formula (5).

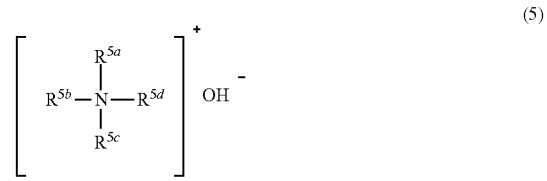

In Formula (5), $R^{5a}$ to $R^{5d}$ each independently represent an alkyl group having 1 to 16 carbon atoms, an aryl group having 6 to 16 carbon atoms, an aralkyl group having 7 to 16 carbon atoms, or a hydroxyalkyl group having 1 to 16 carbon atoms. At least two of $R^{5a}$ to $R^{5d}$ may be bonded to each other to form a cyclic structure. Particularly, the groups in at least either a combination of $R^{5a}$ and $R^{5b}$ or a combination of $R^{5c}$ and $R^{5d}$ may be bonded to each other to form a cyclic structure.

As the compound represented by Formula (5), tetramethylammonium hydroxide, tetraethylammonium hydroxide, tetrapropylammonium hydroxide, tetrabutylammonium hydroxide, methyltripropylammonium hydroxide, methyltributylammonium hydroxide, ethyltrimethylammonium hydroxide, dimethyldiethylammonium hydroxide, benzyltrimethylammonium hydroxide, hexadecyltrimethylammonium hydroxide, or (2-hydroxyethyl)trimethylammonium hydroxide is preferable.

In a case where the treatment liquid contains a quaternary ammonium hydroxide salt, the content of the quaternary ammonium hydroxide salt with respect to the total mass of the treatment liquid is preferably 0.05% to 10% by mass, and more preferably 0.1% to 5% by mass.

As the base compound, a water-soluble amine other than the above compounds can also be used.

A pKa of the water-soluble amine is preferably 7.5 to 13.0 at room temperature. In the present specification, the water-soluble amine means an amine which can dissolve in an amount of 50 g or more in 1 L of water at room temperature. Aqueous ammonia is not included in the water-soluble amine.

Examples of the water-soluble amine having a pKa of 7.5 to 13 include diglycolamine (DGA) (pKa=9.80), methylamine (pKa=10.6), ethylamine (pKa=10.6), propylamine (pKa=10.6), butylamine (pKa=10.6), pentylamine (pKa=10.0), ethanolamine (pKa=9.3), propanolamine (pKa=9.3), butanol amine (pKa=9.3), methoxyethylamine (pKa=10.0), methoxypropylamine (pKa=10.0), dimethylamine (pKa=10.8), diethylamine (pKa=10.9), dipropylamine (pKa=10.8), trimethylamine (pKa=9.80), and triethylamine (pKa=10.72).

As the water-soluble amine, unsubstituted hydroxylamine and a hydroxylamine derivative may also be used.

In the present specification, the pKa of the water-soluble amine is an acid dissociation constant in water. The acid dissociation constant in water can be measured using a spectrometer and potentiometry in combination.

As the pH adjuster, particularly, one or more kinds of compounds are preferable which are selected from the group consisting of acetic acid, perchloric acid, hypochlorous acid, periodic acid, tetramethylammonium hydroxide, tetraethylammonium hydroxide, tetrabutylammonium hydroxide, aqueous ammonia, and a water-soluble amine.

In view of further improving the effects of the treatment liquid, the pH of the treatment liquid is preferably 1 to 13, and more preferably 6 to 11.

In the present specification, the pH of the treatment liquid is a value measured at room temperature (25° C.) by using F-51 (trade name) manufactured by Horiba, Ltd.

The content of the pH adjuster may be appropriately set so that the treatment liquid can have an intended pH.

<Treatment Liquid Manufacturing Method>

The method for manufacturing the treatment liquid is not particularly limited, and known manufacturing methods can be used. For example, a method of mixing together water, hydroxylamine, and hydrazines (or an aqueous solution thereof, or the like) can be used. In mixing together the above components, if necessary, other optional components (such as a substance containing the first anions and/or the second anions) may also be mixed with the components.

Furthermore, in manufacturing the treatment liquid, if necessary, the treatment liquid may be purified by being filtered using a filter.

The treatment liquid according to the aspect of the present invention is preferably used for an object to be treated containing a metal-based material which is a material containing a metal, and more preferably used for an object to be treated containing a cobalt-containing substance containing cobalt atoms (the substance will be also simply called "cobalt-containing substance").

It is also preferable that the treatment liquid be used for an object to be treated that contains a cobalt-containing substance containing cobalt atoms and a metal-containing substance containing metal atoms other than cobalt atoms.

<Treatment Liquid Container>

The treatment liquid may be stored in a container and kept as it is until use.

The container and the treatment liquid stored in the container are collectively called treatment liquid container. The stored treatment liquid is used after being taken out of the treatment liquid container. Furthermore, the treatment liquid may be transported as a treatment liquid container.

It is preferable to use a container for semiconductors which has a high internal cleanliness and hardly causes elution of impurities. Examples of usable containers include a "CLEAN BOTTLE" series manufactured by AICELLO CORPORATION, and "PURE BOTTLE" manufactured by KODAMA PLASTICS Co., Ltd.

It is preferable that the inner wall of the container be formed of one or more kinds of resins selected from the group consisting of a polyethylene resin, a polypropylene resin, and a polyethylene-polypropylene resin, or formed of a resin different from these. It is also preferable that the inner wall of the container be formed of a metal having undergone a rustproofing treatment or a metal elution preventing treatment, such as stainless steel, Hastelloy, Inconel, or Monel.

As "resin different from these" described above, a fluororesin (perfluororesin) is preferable. In a case where a container having inner wall made of a fluororesin is used, the occurrence of problems such as elution of an ethylene or propylene oligomer can be further suppressed, than in a case where a container having inner wall formed of a polyethylene resin, a polypropylene resin, or a polyethylene-polypropylene resin is used.

Examples of the container having inner wall made of a fluororesin include a FluoroPure PFA composite drum manufactured by Entegris, and the like. In addition, it is also possible to use the containers described on page 4 of JP1991-502677A (JP-H03-502677A), page 3 of WO2004/016526A, pages 9 and 16 of the WO99/46309A, and the like.

Furthermore, in addition to the fluororesin described above, quartz and an electropolished metallic material (that is, a metallic material having undergone electropolishing) are also preferably used for the inner wall of the container.

For manufacturing the electropolished metallic material, it is preferable to use a metallic material which contains at least one kind of metal selected from the group consisting of chromium and nickel, and in which the total content of chromium and nickel is more than 25% by mass with respect to the total mass of the metallic material. Examples of such a metallic material include stainless steel and a nickel-chromium alloy.

The total content of chromium and nickel in the metallic material is preferably 30% by mass or more with respect to the total mass of the metallic material.

The upper limit of the total content of chromium and nickel in the metallic material is not particularly limited, but is preferably 90% by mass or less with respect to the total mass of the metallic material.

The stainless steel is not particularly limited, and known stainless steel can be used. Particularly, an alloy with a nickel content of 8% by mass or more is preferable, and austenite-based stainless steel with a nickel content of 8% by mass or more is more preferable.

Examples of the austenite-based stainless steel include Steel Use Stainless (SUS) 304 (Ni content: 8% by mass, Cr content: 18% by mass), SUS304L (Ni content: 9% by mass, Cr content: 18% by mass), SUS316 (Ni content: 10% by mass, Cr content: 16% by mass), and SUS316L (Ni content: 12% by mass, Cr content: 16% by mass).

The nickel-chromium alloy is not particularly limited, and known nickel-chromium alloys can be used. Among these, a nickel-chromium alloy is preferable in which the nickel content is 40% to 75% by mass and the chromium content is 1% to 30% by mass.

Examples of the nickel-chromium alloy include HASTELLOY (trade name, the same is true of the following description), MONEL (trade name, the same is true of the following description), and INCONEL (trade name, the same is true of the following description). More specifically, examples thereof include HASTELLOY C-276 (Ni content: 63% by mass, Cr content: 16% by mass), HASTELLOY C (Ni content: 60% by mass, Cr content: 17% by mass), and HASTELLOY C-22 (Ni content: 61% by mass, Cr content: 22% by mass).

Furthermore, if necessary, the nickel-chromium alloy may further contain boron, silicon, tungsten, molybdenum, copper, or cobalt, in addition to the aforementioned alloy.

The method of electropolishing the metallic material is not particularly limited, and known methods can be used. For example, it is possible to use the methods described in paragraphs "0011" to "0014" in JP2015-227501A, paragraphs "0036" to "0042" in JP2008-264929A, and the like.

It is preferable that the metallic material have undergone buffing. As the buffing method, known methods can be used without particular limitation. The size of abrasive grains used for finishing the buffing is not particularly limited, but is preferably #400 or less because such grains make it easy to further reduce the surface asperity of the metallic material.

The buffing is preferably performed before the electropolishing.

Furthermore, one of the multistage buffing carried out by changing the size of abrasive grains, acid pickling, magnetorheological finishing, and the like or a combination of two or more treatments selected from the above may be performed on the metallic material.

It is preferable that the inside of these containers be washed before the containers are filled with the treatment liquid. For washing, it is preferable to use a liquid with a lower metal impurity content.

After being manufactured, the treatment liquid may be bottled using a container, such as a gallon bottle or a quart bottle, and transported or stored.

In order to prevent changes in the components of the treatment liquid during storage, the inside of the container may be purged with an inert gas (such as nitrogen or argon) having a purity of 99.99995% by volume or higher. Particularly, a gas with a low moisture content is preferable. Although the treatment liquid may be transported and stored at room temperature, in order to prevent deterioration, the temperature may be controlled in a range of −20° C. to 20° C.

The treatment liquid may be prepared as a kit composed of a plurality of separated raw materials of the treatment liquid.

Furthermore, the treatment liquid may be prepared as a concentrated solution. In a case where the treatment liquid is prepared as a concentrated solution, the concentration factor is appropriately determined depending on the composition, but is preferably 5× to 2,000×. That is, the concentrated solution is used after being diluted 5× to 2,000×.

[Method for Treating Object to be Treated]

In the method for treating an object to be treated by using the treatment liquid according to an embodiment of the present invention (hereinafter, the method will be also simply described as "the present treatment method"), typically, it is possible to use the treatment liquid by bringing the treatment liquid into contact with an object to be treated containing a metal-based material which is a material containing a metal. In this case, the object to be treated may contain two or more kinds of metal-based materials. Furthermore, it is preferable that the treatment liquid dissolve at least one of the two or more kinds of metal-based materials that may be contained in the object to be treated.

The metal-based material may have metal atoms (such as cobalt (Co), ruthenium (Ru), tungsten (W), molybdenum (Mo), aluminum (Al), copper (Cu), titanium (Ti), and/or tantalum (Ta)). Examples thereof include a simple metal, an alloy, a metal oxide (which may be a composite oxide), and a metal nitride (which may be a composite nitride).

The content of metal atoms in the metal-based material with respect to the total mass of the metal-based material is preferably 30% to 100% by mass, more preferably 40% to 100% by mass, and even more preferably 52% to 100% by mass.

Examples of the metal-based material include a cobalt-containing substance, a metal-containing substance, and the like. Details of the cobalt-containing substance and the metal-containing substance will be described later.

For example, it is preferable that at least one of the two or more kinds of metal-based materials that an object to be treated may contain be a cobalt-containing substance, and the treatment liquid is preferably used by being brought into contact with the object to be treated containing a cobalt-containing substance so that the cobalt-containing substance is dissolved (etched).

That is, the treatment liquid may be, for example, an etching treatment liquid.

It is also preferable that the object to be treated contain a metal-containing substance (hereinafter, also simply called "metal-containing substance") containing metal atoms other than cobalt atoms (hereinafter, also simply called "other metal atoms"), in addition to the cobalt-containing substance.

In this case, the treatment liquid may be used for etching only the cobalt-containing substance, or used for etching both the cobalt-containing substance and metal-containing substance.

The form of the object to be treated is not particularly limited. For example, the object may be an object 10 to be treated shown in FIG. 1 having a substrate 12, an insulating film 14 with hole portions that is disposed on the substrate 12, a metal-containing substance portion 16 disposed in the form of a layer along the inner wall of the hole portions of the insulating film 14, and a cobalt-containing substance portion 18 with which the hole portions are filled. In FIG. 1, the metal-containing substance portion can function as a barrier metal layer.

Figure 2:
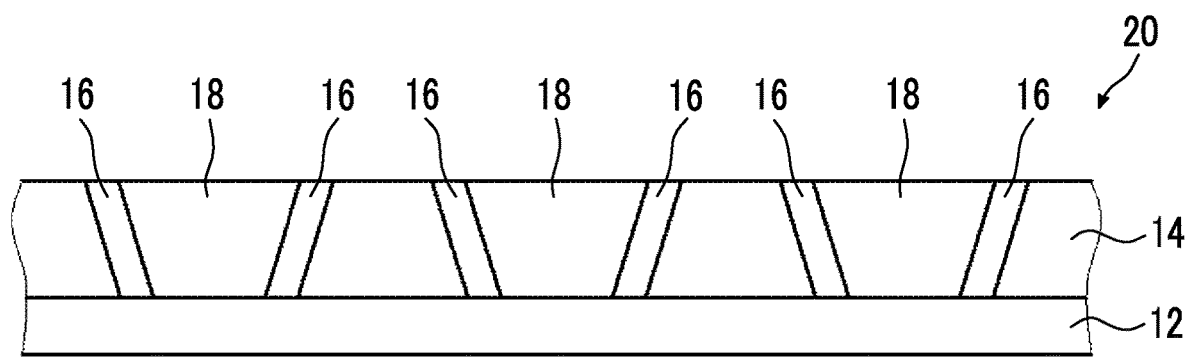
FIG. 2 is a cross-sectional view showing another embodiment of the object to be treated.

Although FIG. 1 shows an aspect in which the object to be treated has one cobalt-containing substance portion, the object to be treated is not limited to this aspect. For example, the object may be an object 20 to be treated shown in FIG. 2 having a substrate 12, an insulating film 14 with a plurality of hole portions that is disposed on the substrate 12, a metal-containing substance portion 16 disposed in the form of a layer along the inner wall of each of the hole portions of the insulating film 14, and a cobalt-containing substance portion 18 with which each of the hole portions is filled. That is, the object to be treated may have an aspect in which each of the cobalt-containing substance and the metal-containing substance is at a plurality of sites.

The type of substrate that may be contained in the object to be treated is not particularly limited. Examples of the substrate include various substrates such as a semiconductor wafer, a glass substrate for a photomask, a glass substrate for liquid crystal display, a glass substrate for plasma display, a substrate for field emission display (FED), a substrate for an optical disk, a substrate for a magnetic disk, and a substrate for a magneto-optical disk.

Examples of materials constituting the semiconductor substrate include silicon, silicon germanium, a Group III-V compound such as GaAs, and any combination of these.

The size, thickness, shape, layer structure, and the like of the substrate are not particularly limited, and can be appropriately selected as desired.

As the insulating film, known insulating films are used. The insulating film in FIGS. 1 and 2 has hole portions. However, the insulating film is not limited to this aspect, and may be an insulating film having groove portions.

The cobalt-containing substance may have cobalt atoms. Examples of the cobalt-containing substance include simple cobalt (metallic cobalt), a cobalt alloy (preferably an alloy containing cobalt as a metal component taking up the highest mass ratio), a cobalt oxide, and a cobalt nitride.

In the cobalt-containing substance, the content of cobalt atoms with respect to the total mass of the cobalt-containing substance is preferably 50% to 100% by mass, more preferably 80% to 100% by mass, and even more preferably 99% to 100% by mass.

The type of other metal atoms in the metal-containing substance is not particularly limited, and examples thereof include titanium and tantalum. Particularly, as other metal atoms, metal atoms nobler than cobalt are preferable.

The metal-containing substance may contain the aforementioned other metal atoms.

Examples of the metal-containing substance include a simple metal, an alloy, an oxide, and a nitride.

As the metal-containing substance, in view of further improving the effects of the treatment liquid, simple titanium, a titanium alloy, a titanium oxide, a titanium nitride, simple tantalum, a tantalum alloy, a tantalum oxide, or a tantalum nitride is preferable.

In a case where the object to be treated contains the metal-containing substance, the cobalt-containing substance and the metal-containing substance may be in contact with each other in the object to be treated or may be arranged via other members.

The forms of the cobalt-containing substance and the metal-containing substance are not particularly limited. For example, these substances may be in the form of a film, wiring, or particles.

In a case where the cobalt-containing substance and the metal-containing substance are in the form of a film, the thickness thereof is not particularly limited and may be appropriately selected depending on the use. For example, the thickness is preferably 50 nm or less, more preferably 20 nm or less, and even more preferably 10 nm or less.

The cobalt-containing substance and the metal-containing substance may be disposed only on one of the main surfaces of the substrate, or may be disposed on both the main surfaces of the substrate. Furthermore, the cobalt-containing substance and the metal-containing substance may be disposed on the entire main surface of the substrate, or may be disposed on a portion of the main surface of the substrate.

The object to be treated may contain two or more kinds of cobalt-containing substances, or may contain two or more kinds of metal-containing substances.

Although the object to be treated containing a cobalt-containing substance has been mainly described hitherto as an object to be treated, the object to be treated containing a cobalt-containing substance may contain another metal-based material instead of the cobalt-containing substance. For example, these objects to be treated may contain, instead of the cobalt-containing substance, a ruthenium-containing substance, a tungsten-containing substance, a molybdenum-containing substance, an aluminum-containing substance, or a copper-containing substance. Specifically, the ruthenium-containing substance, the tungsten-containing substance, the molybdenum-containing substance, the aluminum-containing substance, and the copper-containing substance are the same as the cobalt-containing substance described above except that cobalt is substituted with ruthenium, tungsten, molybdenum, aluminum, and copper, respectively.

In a case where the object to be treated contains, instead of the cobalt-containing substance, a ruthenium-containing substance, a tungsten-containing substance, a molybdenum-containing substance, an aluminum-containing substance, or a copper-containing substance, "other metal atoms" in the aforementioned metal-containing substance refers to metal atoms other than ruthenium atoms, metal atoms other than tungsten atoms, metal atoms other than molybdenum atoms, metal atoms other than aluminum atoms, and metal atoms other than copper atoms, respectively. Even in this case, as the metal-containing substance, simple titanium, a titanium alloy, a titanium oxide, a titanium nitride, simple tantalum, a tantalum alloy, a tantalum oxide, or a tantalum nitride is preferable.

The object to be treated may include various layers and/or structures as desired, in addition to the above components. For example, the substrate may have metal wiring, a gate electrode, a source electrode, a drain electrode, an insulating layer, a ferromagnetic layer, and/or a non-magnetic layer, and the like.

The substrate may include the structure of an exposed integrated circuit, for example, an interconnection mechanism such as metal wiring and a dielectric material. Examples of metals and alloys used for the interconnection mechanism include aluminum, a copper-aluminum alloy, copper, titanium, tantalum, cobalt, silicon, titanium nitride, tantalum nitride, and tungsten. The substrate may include a layer of silicon oxide, silicon nitride, silicon carbide, and/or carbon-doped silicon oxide.

The method for manufacturing the object to be treated is not particularly limited. For example, the object to be treated shown in FIG. 1 may be manufactured by a method of forming an insulating film on a substrate, forming hole portions or groove portions in the insulating film, arranging a metal-containing substance layer and a cobalt-containing substance layer in this order on the insulating film by a sputtering method, a chemical vapor deposition (CVD) method, a molecular beam epitaxy (MBE) method, or the like, and then performing a smoothing treatment such as CMP.

Examples of the method for treating an object to be treated according to an embodiment of the present invention include a method of bringing an object to be treated containing at least one kind of metal-based material into contact with the treatment liquid described above. By adopting this method, it is possible to dissolve one or more kinds of metal-based materials contained in the object to be treated or to wash the object to be treated (for example, wash dry etching residues contained in the object to be treated).

First Aspect

More specifically, examples of the method for treating an object to be treated according to the embodiment of the present invention include a method of bringing an object to be treated containing at least a cobalt-containing substance into contact with the aforementioned treatment liquid so that the cobalt-containing substance is dissolved. This method for treating an object to be treated is also called a first aspect of the method for treating an object to be treated according to the embodiment of the present invention.

The method of bringing the object to be treated into contact with the treatment liquid is not particularly limited, and examples thereof include a method of immersing the object to be treated in the treatment liquid stored in a tank, a method of spraying the treatment liquid onto the object to be treated, a method of causing the treatment liquid to flow on the object to be treated, and a combined method consisting of any of the above methods. Among these, the method of immersing the object to be treated in the treatment liquid is preferable.

In order to further enhance the washing ability of the treatment liquid, a mechanical stirring method may also be used.

Examples of the mechanical stirring method include a method of circulating the treatment liquid on an object to be treated, a method of causing the treatment liquid to flow on the object to be treated or spraying the treatment liquid onto the object to be treated, and a method of stirring the treatment liquid by using ultrasonic or megasonic waves.

The contact time between the object to be treated and the treatment liquid can be adjusted as appropriate.

The treatment time (the contact time between the treatment liquid and the object to be treated) is not particularly limited, but is preferably 0.25 to 10 minutes, and more preferably 0.5 to 2 minutes.

The temperature of the treatment liquid during the treatment is not particularly limited, but is preferably 20° C. to 75° C. and more preferably 20° C. to 65° C.

By the treatment performed as above, mainly the cobalt-containing substance in the object to be treated is dissolved.

In a case where the object to be treated contains a metal-containing substance in addition to the cobalt-containing substance, the metal-containing substance may or may not be dissolved together with the cobalt-containing substance by this treatment. In a case where the metal-containing substance is dissolved, the dissolution of the metal-containing substance may be intentional or inevitable.

In a case where the dissolution of the metal-containing substance is unintentional, it is preferable that the amount of the inevitably dissolved metal-containing substance be small. In a case where the dissolution of the metal-containing substance is unintentional, and the amount of the inevitably dissolved metal-containing substance is small, the treatment liquid is also described as being excellent in member resistance of the metal-containing substance.

In the first aspect, the object to be treated may contain, instead of or in addition to the cobalt-containing substance, a ruthenium-containing substance, a tungsten-containing substance, a molybdenum-containing substance, an aluminum-containing substance, or a copper-containing substance.

Second Aspect

Examples of other aspects of the method for treating an object to be treated according to an embodiment of the present invention include the following second aspect.

That is, the second aspect is a method for treating an object to be treated, including a step A of performing an oxidation treatment on an object to be treated having a metal layer so that the surface layer of the metal layer is oxidized and turns into a metal oxide layer and a step B of bringing the object to be treated obtained by the step A into contact with the treatment liquid so that the metal oxide layer is dissolved.

The second aspect may be a form of the first aspect.

The metal layer is a form of metal-based material which is a layer consisting of a metal-based material that can be oxidized. The metal layer is preferably, for example, a simple metal or a metal alloy. The metal layer is preferably a cobalt-containing substance (such as simple cobalt or a cobalt alloy), a ruthenium-containing substance (such as simple ruthenium or a ruthenium alloy), a tungsten-containing substance (such as simple tungsten or a tungsten alloy), a molybdenum-containing substance (such as simple molybdenum or a molybdenum alloy), an aluminum-containing substance (such as simple aluminum or an aluminum alloy), or a copper-containing substance (such as simple copper or a copper alloy), and more preferably a cobalt-containing substance (simple cobalt or a cobalt alloy).

The metal oxide layer is a layer formed by the oxidation of the surface layer of the metal layer, and can be said to be a form of metal-based material. A part of the surface layer of the metal layer may turn into a metal oxide layer, or the entire surface layer of the metal layer may turn into a metal oxide layer.

The metal oxide layer is an oxide of a simple metal or alloy. The metal oxide layer is preferably a layer consisting of a cobalt oxide, an oxide of a cobalt alloy, a ruthenium oxide, an oxide of a ruthenium alloy, a tungsten oxide, an oxide of a tungsten alloy, a molybdenum oxide, an oxide of a molybdenum alloy, an aluminum oxide, an oxide of an aluminum alloy, a copper oxide, or an oxide of a copper alloy, more preferably a layer consisting of a cobalt oxide or an oxide of a cobalt alloy, and even more preferably a layer consisting of a cobalt oxide.

The thickness of the metal oxide layer is, for example, equivalent to the thickness of 1 to 10 atomic layers. The thickness of one atomic layer of a metal or metal oxide is 1 nm or less (for example, 0.3 nm to 0.4 nm). That is, the oxidation treatment is a treatment of forming a metal oxide layer by oxidizing the surface layer of the metal layer, for example, by a thickness of 1 to 10 atomic layers.

In many cases, the metal oxide layer is more soluble (more easily etched) in the treatment liquid than the metal layer.

That is, in the second aspect, by making the surface of the metal layer into a thin metal oxide layer in the step A and removing only the metal oxide layer (and the portion where the metal layer under the metal oxide layer can be inevitably dissolved) by using the treatment liquid in the step B, it is possible to remove (dissolve) only the extremely thin surface of the metal layer contained in the object to be treated.

Furthermore, by alternately repeating the step A and the step B, it is possible to control the etching amount with high accuracy.

In a case where the step A and the step B are performed alternately, it is preferable that each of the step A and the step B be performed 1 to 20 times.

The object to be treated to which the second aspect can be applied may have only one kind of metal layer or two or more kinds of metal layers. Furthermore, the object to be treated to which the second aspect can be applied may contain a metal-based material other than the metal layer or the metal oxide layer, and a part or entirety of such a metal-based material may be intentionally or inevitably removed through the step A and the step B.

The step A is a step of performing an oxidation treatment on the object to be treated having the metal layer so that the surface layer of the metal layer is oxidized and turns into a metal oxide layer.

There are no restrictions on the method of oxidation treatment for oxidizing the surface layer of the metal layer to form a metal oxide layer. For example, the oxidation treatment can be performed by a liquid treatment of bringing the object to be treated into contact with an oxidizing solution, a gas treatment of bringing the object to be treated into contact with an oxidizing gas (such as an ozone treatment of bringing the object to be treated into contact with an ozone gas or a heating treatment in oxygen in which the object to be treated is heated in an oxygen atmosphere that will be described later), or a plasma treatment using an oxygen gas.

One kind of oxidation treatment may be performed, or two or more kinds of oxidation treatments may be performed.

Particularly, as the oxidation treatment, it is preferable to perform at least a liquid treatment of bringing a predetermined solution into contact with the aforementioned object to be treated.

The aforementioned oxidizing solution may be a solution that can oxidize the surface layer of the metal layer. The oxidizing solution is preferably a solution other than the treatment liquid according to an embodiment of the present invention.

The aforementioned oxidizing solution is preferably a solution (hereinafter, also called "specific solution") selected from the group consisting of water, hydrogen peroxide water, a mixed aqueous solution of ammonia and hydrogen peroxide (APM), a mixed aqueous solution of hydrofluoric acid and hydrogen peroxide water (FPM), a mixed aqueous solution of sulfuric acid and hydrogen peroxide water (SPM), a mixed aqueous solution of hydrochloric acid and hydrogen peroxide water (HPM), water containing dissolved oxygen, water containing dissolved ozone, perchloric acid, and nitric acid.

Among these, a solution selected from the group consisting of water, hydrogen peroxide water, APM, FPM, SPM, HPM, water containing dissolved oxygen, and water containing dissolved ozone is preferable as the specific solution.

The hydrogen peroxide water has a composition in which, for example, the content of $H_2O_2$ is 0.5% to 31% by mass with respect to the total mass of the hydrogen peroxide water. The content of $H_2O_2$ is more preferably 3% to 15% by mass.

The composition of APM is, for example, preferably in a range of "aqueous ammonia:hydrogen peroxide water:water=1:1:1" to "aqueous ammonia:hydrogen peroxide water:water=1:3:45" (mass ratio).

The composition of FPM is, for example, preferably in a range of "hydrofluoric acid:hydrogen peroxide water:water=1:1:1" to "hydrofluoric acid:hydrogen peroxide water:water=1:1:200" (mass ratio).

The composition of SPM is, for example, preferably in a range of "sulfuric acid:hydrogen peroxide water:water=3:1:0" to "sulfuric acid:hydrogen peroxide water:water=1:1:10" (mass ratio).

The composition of HPM is, for example, preferably in a range of "hydrochloric acid:hydrogen peroxide water:water=1:1:1" to "hydrochloric acid:hydrogen peroxide water:water=1:1:30" (mass ratio).

The preferred compositional ratio described above means a compositional ratio determined in a case where the content of aqueous ammonia is 28% by mass, the content of hydrofluoric acid is 49% by mass, the content of sulfuric acid is 98% by mass, the content of hydrochloric acid is 37% by mass, and the content of hydrogen peroxide water is 30% by mass.

Furthermore, the volume ratio is based on a volume at room temperature.

"A:B:C=x:y:z to A:B:C=X:Y:Z" used above to describe a suitable range means that it is preferable that at least one (preferably two and more preferably all) of "A:B=x:y to A:B=X:Y", "B:C=y:z to B:C=Y:Z", or "A:C=x:z to A:C=X:Z" be satisfied.

The water containing dissolved oxygen is an aqueous solution having a composition in which, for example, the content of $O_2$ is 1 to 200 ppm by mass with respect to the total mass of the water containing dissolved oxygen.

The water containing dissolved ozone is an aqueous solution having a composition in which, for example, the content of $O_3$ is 1 to 200 ppm by mass with respect to the total mass of the water containing dissolved ozone.

Perchloric acid is, for example, an aqueous solution in which the content of $HClO_4$ is 0.001% to 60% by mass with respect to the total mass of the solution.

Nitric acid is, for example, an aqueous solution in which the content of $HNO_3$ is 0.001% to 60% by mass with respect to the total mass of the solution.

In the liquid treatment, the method of bringing the object to be treated into contact with the oxidizing solution (preferably the specific solution) is not particularly limited. Examples of the method include a method of immersing the object to be treated in the oxidizing solution stored in a tank, a method of spraying the oxidizing solution onto the object to be treated, a method of causing the oxidizing solution to flow on the object to be treated, and a combined method consisting of any of the above methods.

The contact time between the object to be treated and the oxidizing solution is, for example, preferably 0.25 to 10 minutes, and more preferably 0.5 to 5 minutes.

The temperature of the oxidizing solution is preferably 20° C. to 75° C., and more preferably 20° C. to 60° C.

Examples of the oxidizing gas to be brought into contact with the object to be treated in the gas treatment include dry air, an oxygen (02) gas, an ozone (03) gas, and a mixed gas of these. The oxidizing gas may contain a gas other than these gases.

The oxidizing gas to be brought into contact with the object to be treated in the gas treatment is particularly preferably an oxygen gas or an ozone gas. In a case where an oxygen gas or an ozone gas is brought into contact with the object to be treated, it is also preferable that the contact be made in an oxygen atmosphere, an ozone atmosphere, or an atmosphere of a mixed gas of oxygen and ozone.

In the gas treatment, it is also preferable to heat the object to be treated (for example, heat the object to be treated at 40° C. to 200° C.) while bringing the object to be treated into contact with an oxidizing gas.

The gas treatment is particularly preferably an ozone treatment of bringing an ozone gas into contact with the object to be treated or a heating treatment in oxygen in which the object to be treated is heated in an oxygen atmosphere.

In the ozone treatment, an ozone gas may be brought into contact with the object to be treated in an ozone atmosphere, or an ozone gas may be brought into contact with the object to be treated in an atmosphere of a mixed gas of an ozone gas and another gas (for example, an oxygen gas). Furthermore, the ozone treatment may be a treatment of heating the object to be treated while bringing the object to be treated into contact with an ozone gas.

In step A (particularly in a case where the liquid treatment is performed), the object to be treated may contain a metal-based material other than the metal layer having surface layer that is oxidized by the oxidation treatment and turns into a metal oxide layer, and a part or entirety of such a metal-based material may be intentionally or inevitably removed by the step A (particularly by the liquid treatment).

Furthermore, in the step A (particularly in a case where the liquid treatment is performed), a part of the metal layer of the object to be treated may be intentionally or inevitably removed.

The step B is a step of bringing the object to be treated obtained by the step A into contact with a treatment liquid so that the metal oxide layer is dissolved.

The method of bringing the object to be treated into contact with the treatment liquid in step B is not limited, and examples thereof are the same as the examples of the method of bringing the object to be treated into contact with an oxidizing solution.

The contact time between the object to be treated and the treatment liquid is, for example, preferably 0.25 to 10 minutes, and more preferably 0.5 to 5 minutes.

The temperature of the treatment liquid is preferably 20° C. to 75° C., and more preferably 20° C. to 60° C.

In the step B, the metal oxide layer may be partially or totally removed.

In the step B, a part or entirety of the metal layer (for example, the metal layer which is exposed on the surface layer by the removal of the metal oxide layer covering the surface) may be intentionally or inevitably removed.

In the step B, the object to be treated may contain a metal-based material other than the metal oxide layer and the metal layer forming a metal oxide layer on the surface, or a part or entirety of such a metal-based material may be intentionally or inevitably removed.

In a case where the dissolution of the metal layer and/or other metal-based materials is unintended, it is preferable that the amount of the metal layer and/or other metal-based materials to be inevitably dissolved be small.

The treatment liquid to be used in the step B may be subjected to a deaeration treatment in advance so that the amount of dissolved oxygen is reduced. In a case where the amount of dissolved oxygen in the treatment liquid is reduced, it is possible to suppress a phenomenon where the metal layer exposed by the removal of the metal oxide layer with the treatment liquid is oxidized due to the dissolved oxygen in the treatment liquid and turns into a new metal oxide layer, such a metal oxide layer is removed again by the treatment liquid, and thus an excess of metal layer is removed.

Third Aspect

Examples of another aspect (third aspect) of the method for treating an object to be treated according to an embodiment of the present invention include an aspect in which an object to be treated containing a metal-based material is subjected to a dry etching treatment and then brought into contact with a treatment liquid so that dry etching residues are removed.

The object to be treated in the present aspect may contain only one kind of metal-based material or two or more kinds of metal-based materials. At least one kind of metal-based material or at least one of the two or more kinds of metal-based materials is preferably a cobalt-containing substance, a ruthenium-containing substance, a molybdenum-containing substance, an aluminum-containing substance, or a copper-containing substance, and is more preferably a cobalt-containing substance.

That is, as the third aspect of the method for treating an object to be treated according to an embodiment of the present invention, an aspect is preferable in which an object to be treated containing a cobalt-containing substance containing cobalt atoms is subjected to a dry etching treatment and then brought into contact with a treatment liquid so that dry etching residues are removed.

In the present aspect, the object to be treated that is brought into contact with the treatment liquid contains a metal-based material. Furthermore, in the present aspect, the object to be treated is brought into contact with the treatment liquid after being subjected to the dry etching treatment. Therefore, at a point in time when the object to be treated is brought into contact with the treatment liquid, the object to be treated contains dry etching residues on the surface. In the present aspect, the dry etching residues existing on the surface of such an object to be treated are removed.

This method for treating an object to be treated is also called a third aspect of the method for treating an object to be treated according to the embodiment of the present invention.

The third aspect may be a form of the first aspect described above that is accomplished by specifically restricting the constitution of the object to be treated and the purpose of the treatment in the first aspect.

The treatment liquid according to the embodiment of the present invention can also be suitably used for washing the object to be treated (for removing residues) as described above.

Figure 3:
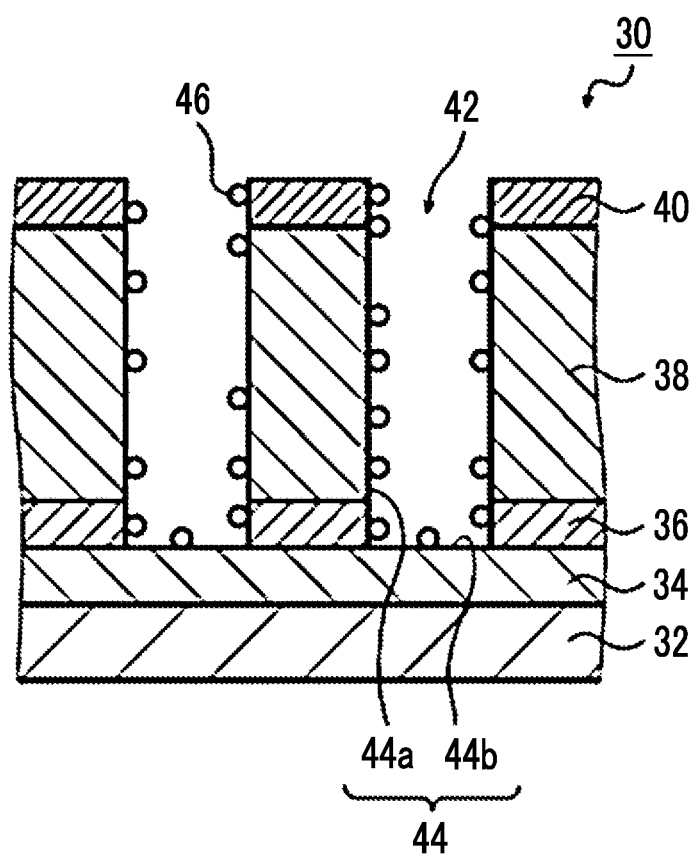
FIG. 3 is a schematic cross-sectional view showing an example of a laminate applicable to a method for treating an object to be treated according to an embodiment of the present invention.

FIG. 3 is a schematic view showing an example of the object to be treated (object to be treated after the dry etching treatment) in the third aspect described above.

An object 30 to be treated shown in FIG. 3 comprises a metal-containing film 34, an etch stop layer 36, an interlayer insulating film 38, a metal hard mask 40 in this order on a substrate 32. Through a dry etching step or the like, a hole 42 exposing the metal-containing film 34 is formed at a predetermined position. That is, the object to be treated shown in FIG. 3 is a laminate which comprises the substrate 32, the metal-containing film 34, the etch stop layer 36, the interlayer insulating film 38, and the metal hard mask 40 in this order and comprises the hole 42 that extends from the surface of the metal hard mask 40 to the surface of the metal-containing film 34 at the position of the opening portion of the metal hard mask 40. An inner wall 44 of the hole 42 is constituted with a cross-sectional wall 44a which includes the etch stop layer 36, the interlayer insulating film 38, and the metal hard mask 40, and a bottom wall 44b which includes the exposed metal-containing film 34. A dry etching residue 46 is attached to the inner wall 44.

The metal hard mask in the object to be treated may turn into a barrier metal after the object to be treated is further processed. In other words, the layer that will turn into a barrier metal in the subsequent step may be used as a metal hard mask in the dry etching step. That is, the barrier metal may be used as a metal hard mask.

For example, it is preferable that at least one of the metal-containing film 34 or the metal hard mask 40 be the cobalt-containing substance. Especially, it is preferable that the metal-containing film 34 and the metal hard mask 40 be the cobalt-containing substance and the metal-containing substance respectively, or that the metal-containing film 34 and the metal hard mask 40 be the metal-containing substance and the cobalt-containing substance respectively.

It is particularly preferable that the metal-containing film 34 and the metal hard mask 40 be the cobalt-containing substance and the metal-containing substance respectively.

As the interlayer insulating film, known materials can be used.

The dry etching residues may be organic residues containing an organic substance as a main component. The organic residues are residues having an organic substance content of 50% by mass or more. The organic residues may be residues that substantially do not contain a metal-containing substance and/or a cobalt-containing substance.

The dry etching residues may contain a metal component as a main component, or may be metal residues containing a metal-containing substance and/or a cobalt-containing substance. The metal residues are residues having a metal component content of more than 50% by mass. The metal residues may be residues that substantially do not contain an organic substance.

Examples of the specific method of the third aspect include a method of bringing the aforementioned object to be treated into contact with the treatment liquid.

The method of bringing the object to be treated into contact with the treatment liquid is the same as the method described above in the first aspect.

By the method of bringing the object to be treated into contact with the treatment liquid, the dry etching residues on the object to be treated are removed. In this case, a metal-based material (such as a cobalt-containing substance which is preferably a cobalt-containing substance as the metal-containing film 34) may be dissolved as well. In this case, there is no restriction on the amount of the metal-based material (such as the cobalt-containing substance) dissolved.

The dissolution of the metal-based material (such as the cobalt-containing substance) may be intentional dissolution for removing a part or all of the metal-containing film 34 (such as a cobalt-containing substance) on the bottom wall 44b of the hole 42, or inevitable dissolution resulting from the contact between the treatment liquid and the metal-based material (such as the cobalt-containing substance).

If necessary, the present treatment method may include a rinsing step of performing a rinsing treatment on the object to be treated by using a rinsing liquid.

For example, the method for treating an object to be treated in the first aspect, the second aspect, or the third aspect described above may further include the rinsing step after the procedure described above in each aspect.

Furthermore, the present treatment method may include the rinsing step between the step A and the step B in the second aspect.

As the rinsing liquid, for example, water, hydrofluoric acid (preferably 0.001% to 1% by mass hydrofluoric acid), hydrochloric acid (preferably 0.001% to 1% by mass hydrochloric acid), hydrogen peroxide water (preferably 0.5% to 31% by mass hydrogen peroxide water, and more preferably 3% to 15% by mass hydrogen peroxide water), a mixed solution of hydrofluoric acid and hydrogen peroxide water (FPM), a mixed solution of sulfuric acid and hydrogen peroxide water (SPM), a mixed solution of aqueous ammonia and hydrogen peroxide water (APM), a mixed solution of hydrochloric acid and hydrogen peroxide water (HPM), aqueous carbon dioxide (preferably 10 to 60 ppm by mass aqueous carbon dioxide), aqueous ozone (preferably 10 to 60 ppm by mass aqueous ozone), aqueous hydrogen (preferably 10 to 20 ppm by mass aqueous hydrogen), an aqueous citric acid solution (preferably a 0.01% to 10% by mass aqueous citric acid solution), sulfuric acid (preferably a 1% to 10% by mass aqueous sulfuric acid solution), aqueous ammonia (preferably 0.01% to 10% by mass aqueous ammonia), isopropyl alcohol (IPA), an aqueous hypochlorous acid solution (preferably a 1% to 10% by mass aqueous hypochlorous acid solution), aqua regia (preferably aqua regia obtained by mixing together "37% by mass hydrochloric acid:60% by mass nitric acid" at a volume ratio of "2.6:1.4" to "3.4:0.6"), ultrapure water, nitric acid (preferably 0.001% to 1% by mass nitric acid), perchloric acid (preferably 0.001% to 1% by mass perchloric acid), an aqueous oxalic acid solution (preferably a 0.01% to 10% by mass aqueous oxalic acid solution), acetic acid (preferably a 0.01% to 10% by mass aqueous acetic acid solution or an undiluted acetic acid solution), or an aqueous periodic acid solution (preferably a 0.5% to 10% by mass aqueous periodic acid solution, examples of the periodic acid include orthoperiodic acid and metaperiodic acid) is preferable.

The preferred conditions required to FPM, SPM, APM, and HPM are the same as the preferred conditions required, for example, to FPM, SPM, APM, and HPM used as the specific solution described above.

The hydrofluoric acid, nitric acid, perchloric acid, and hydrochloric acid mean aqueous solutions obtained by dissolving HF, $HNO_3$, $HClO_4$, and HCl in water respectively.

The aqueous ozone, aqueous carbon dioxide, and aqueous hydrogen mean aqueous solutions obtained by dissolving $O_3$, $CO_2$, and $H_2$ in water respectively.

As long as the purpose of the rinsing step is not impaired, these rinsing liquids may be used by being mixed together. The rinsing liquid may also contain an organic solvent.

Examples of the specific method of the rinsing step include a method of bringing the rinsing liquid into contact with the object to be treated.

The method of bringing the rinsing liquid into contact with the object to be treated is performed by a method of immersing the substrate in the rinsing liquid stored in a tank, a method of spraying the rinsing liquid onto the substrate, a method of causing the rinsing liquid to flow on the substrate, or a combined method consisting of any of the above methods.

The treatment time (contact time between the rinsing liquid and the object to be treated) is not particularly limited, but is 5 seconds to 5 minutes for example.

The temperature of the rinsing liquid during the treatment is not particularly limited. Generally, the temperature of the rinsing liquid is, for example, preferably 16° C. to 60° C., and more preferably 18° C. to 40° C. In a case where SPM is used as the rinsing liquid, the temperature thereof is preferably 90° C. to 250° C.

If necessary, the present treatment method may include a drying step of performing a drying treatment after the rinsing step. The method of the drying treatment is not particularly limited, and examples thereof include spin drying, causing a drying gas to flow on the substrate, heating the substrate by a heating unit such as a hot plate or an infrared lamp, isopropyl alcohol (IPA) vapor drying, Marangoni drying, Rotagoni drying, and any combination of these.

The drying time varies with the specific method to be used, but is about 30 seconds to a few minutes in general.

The present treatment method may be performed in combination with a semiconductor device manufacturing method, before or after the steps performed in the manufacturing method. While being performed, the present treatment method may be incorporated into those other steps. Alternatively, while those other steps are being performed, the present treatment method may be incorporated into the steps and performed.

Examples of those other steps include a step of forming each structure such as metal wiring, a gate structure, a source structure, a drain structure, an insulating layer, a ferromagnetic layer and/or a non-magnetic layer (layer formation, etching, chemical mechanical polishing, modification, and the like), a step of forming resist, an exposure step and a removing step, a heat treatment step, a washing step, an inspection step, and the like.

The present treatment method may be performed in the back end process (BEOL: Back end of the line) or in the front end process (FEOL: Front end of the line).

In addition, the treatment liquid may be applied, for example, to NAND, dynamic random access memory (DRAM), static random access memory (SRAM), resistive random access memory (ReRAM), ferroelectric random access memory (FRAM (registered trademark)), magnetoresistive random access memory (MRAM), phase change random access memory (PRAM), or the like, or applied to a logic circuit, a processor, or the like.

Examples

Hereinafter, the present invention will be more specifically described based on examples. The materials, the amounts and ratios of the materials used, the details of treatments, the procedures of treatments, and the like shown in the following examples can be appropriately changed as long as the gist of the present invention is maintained. Therefore, the scope of the present invention is not limited to the following examples.

In examples, unless otherwise specified, "%" means "% by mass", and "ppm" means "ppm by mass".

[Preparation of Treatment Liquid]

The following components were mixed together in a predetermined formulation, thereby preparing treatment liquids to be used in each test.

Each of raw materials used in each of the following treatment liquids was a high-purity grade material, which was further purified in advance by distillation, ion exchange, filtration, or a combination of these.

<Hydroxylamine>
HA: Hydroxylamine

<Hydrazines>
Hydrazine
Pyrazole
Carbohydrazide
Semicarbazide
Thiosemcarbazide
Monomethyl hydrazide
t-Butylhydrazine
Dimethylhydrazine (1,1-dimethylhydrazine)
Aminoguanidine <Organic Solvent>
Methanol
Isopropyl alcohol
1-Butanol
1,3-Propanediol
Ethylene glycol
Propylene glycol
Diethylene glycol
Dipropylene glycol
3-Methoxy-3-methyl-1-butanol
3-Methoxy-1-butanol
1-Methoxy-2-butanol
Ethylene glycol monomethyl ether
Ethylene glycol monoethyl ether
Ethylene glycol monobutyl ether
Diethylene glycol monomethyl ether
Diethylene glycol monobutyl ether
Triethylene glycol monomethyl ether
1-Methoxy-2-propanol
Acetone
Cyclohexanone
2-Butanone
Ethyl acetate
Butyl acetate
Propylene glycol monomethyl ether acetate <Anticorrosive>
Benzotriazole
5-Aminotetrazole
5-Phenylbenzotriazole
1-Aminobenzotriazole
5-Methyl-1H-benzotriazole
Benzotriazole-5-carboxylic acid
4-Methylbenzotriazole <Chelating Agent>
Diethylenetriaminepentaacetic acid
Ethylenediaminetetraacetic acid
Trans-1,2-diaminocyclohexanetetraacetic acid
Oxalic acid
Malonic acid
Citric acid
Methanesulfonic acid
1-Hydroxyethylidene-1,1-diphosphonic acid
Nitrilotrismethylene phosphonic acid <Sources of First Anions or Second Anions>

An appropriate amount of the following raw materials were added so that a predetermined amount of the first anions and/or the second anions were supplied to the treatment liquid.

Hydrochloric acid water (HClaq: source of $Cl^-$)
Aqueous solution of nitrous acid/nitric acid ($HNO_2$/$HNO_3$aq: source of $NO_2^-$ and $NO_3^-$)
Dinitrogen trioxide ($N_2O_3$: source of $NO_2^-$)
Aqueous nitric acid solution ($HNO_3$aq: source of $NO_3^-$)
Aqueous sulfuric acid solution ($H_2SO_4$aq: source of $SO_4^{2-}$)
Aqueous phosphoric acid solution ($H_3PO_4$ aq: source of $PO_4^{3-}$)

The aqueous solution of nitrous acid/nitric acid is an aqueous solution containing nitric acid and nitrous acid, which is prepared by reacting $H_2O$ and $NO_2$ in pure water.

The above dinitrogen trioxide generates nitrous acid by dissolving in $H_2O$, and functions as a source of $NO_2^-$.

<Water>
Water: ultrapure water was used after being repeatedly subjected to distillation, filtration, and ion exchange until the content of the first anions and the second anions was less than the detection limit.

The detection limit was less than 0.001 ppm by mass. In detecting the anions, if necessary, a treatment such as removing a portion of water from the sample as a detection target and concentrating the target substance was performed, and then the measurement was carried out.

<pH Adjuster>
Acetic acid (pH adjuster used to adjust acidity)
1,8-Diazabicyclo[5.4.0]-7-undecene (pH adjuster used to adjust basicity)

In order to obtain a treatment liquid having a predetermined pH, one of the acetic acid and 1,8-diazabicyclo[5.4.0]-7-undecene was added as a pH adjuster in a required amount.

In all treatment liquids, the amount of the pH adjuster added was 3.0% by mass or less with respect to the total mass of the treatment liquid.

[Test]

The following tests were performed using the prepared treatment liquids of examples or comparative examples.

<Evaluation on Organic Residue Removability>

A multilayer substrate was prepared which consisted of a substrate and a resist film, a metal hard mask (TiN layer), an etching stop layer ($Al_2O_3$ layer), a Co layer, and an interlayer insulating layer (ILD) that were laminated in this order on the surface of the substrate. This multilayer substrate was subjected to a patterning treatment by lithography, an etching treatment using a plasma etching machine for metals, and a resist film removal treatment by oxygen plasma ashing, thereby preparing a multilayer substrate for evaluation test (hereinafter, the multilayer substrate will be also described as "test piece").

The obtained test piece was washed (treated) with the treatment liquid of each of the examples and comparative examples.

Specifically, first, a glass beaker having a volume of 500 mL was filled with 200 mL of the treatment liquid. In a state where the treatment liquid was being stirred with a stirrer, the temperature of the treatment liquid was raised to 40° C. Then, the test piece prepared as above was immersed for 5 minutes in the treatment liquid at a liquid temperature of 40° C. that was being stirred, so that the test piece was washed. While being immersed in the treatment liquid, the test piece was held using 4-inch long plastic locking forceps so that a surface on a side of the test piece from which the photoresist had been removed faced the stirrer.

After a lapse of washing time, the test piece was immediately taken out of the treatment liquid and put in a 400 mL of deionized water (water temperature 17° C.) being gently stirred in a plastic beaker having a volume of 500 mL. The test piece was immersed in the deionized water for 30 seconds, then immediately taken out, and rinsed in running deionized water at 17° C. for 30 seconds.

Subsequently, the test piece was exposed to a nitrogen gas stream so that the liquid droplets having adhered to the surface of the test piece were blown away and the surface of the test piece was dried.

After this nitrogen drying step, the test piece was removed from the holding part of the plastic forceps, put in a plastic storage box with a lid with the element surface facing up, and stored.

By X-ray Photoelectron Spectroscopy (XPS), the composition of the surface of the obtained test piece was analyzed. The surface of the obtained test piece was measured using an XPS device (manufactured by ULVAC-PHI, INCORPORATED, trade name: Quantera SXM). The amounts of carbon atoms contained in the organic residues of the test piece, the amounts of carbon atoms being measured before and after the treatment, were compared with each other, and the rate of reduction caused through the treatment was calculated and adopted as an organic residue removal rate. The organic residue removability of each treatment liquid was evaluated according to the following evaluation standard.

1: The organic residue removal rate is 95% or more.
2: The organic residue removal rate is 80% or more and less than 95%.
3: The organic residue removal rate is 75% or more and less than 80%.
4: The organic residue removal rate is 50% or more and less than 75%.
5: The organic residue removal rate is less than 50%.

<Evaluation on Stability>

Next, a storage test was performed using the treatment liquid of each of the examples and comparative examples, and the temporal stability of the removal performance of each treatment liquid was evaluated.

Specifically, first, a high-density polyethylene container having a volume of 250 mL was filled with 200 mL of each treatment liquid and sealed. The container filled with the treatment liquid was stored in an environment at 60° C. for 24 hours (storage treatment).

The organic residue removability was evaluated and tested according to the same evaluation method of organic residue removability described above, except that the treatment liquid having undergone the storage treatment was used. On the assumption that the organic residue removal rate determined using a treatment liquid not yet being subjected to the storage treatment is 100%, the retention rate of the organic residue removal rate determined using a treatment liquid having undergone the storage treatment (=organic residue removal rate determined using treatment liquid having undergone storage treatment]÷[organic residue removal rate determined using treatment liquid not yet being subjected to storage treatment]×100) was calculated. The obtained retention rate was classified according to the following evaluation standard, and the stability of each treatment liquid was evaluated.

It should be noted that the retention rate did not exceed 100% regardless of which treatment liquid was used.

1: The retention rate is 99% or more.
2: The retention rate is 95% or more and less than 99%.
3: The retention rate is 85% or more and less than 95%.
4: The retention rate is 75% or more and less than 85%.
5: The retention rate is less than 75%.

<Evaluation on Smoothness (Smoothness of Object to be Treated)>

Substrates were prepared in which a metallic cobalt layer was formed on one surface of a commercial silicon wafer (diameter: 12 inches) by a chemical vapor deposition (CVD) method. The thickness of the metallic cobalt layer was 20 nm.

The obtained substrate was immersed in water at 40° C. for 1 minute, and then immersed in each of the treatment liquids shown in the table at 40° C. for 30 seconds. This treatment was regarded as one cycle, and the substrate was treated by repeating this cycle until the metallic cobalt was dissolved by 10 nm.

Then, after the treatment, the surface of the metallic cobalt layer was observed with a scanning electron microscope, and the smoothness of the portion treated with the treatment liquid was evaluated on a scale of 1 to 10.

The smoothness rated "1" is the best. The larger the rating scale, the worse the smoothness. Specifically, in a case where the surface of the metallic cobalt layer was found to be smooth and no roughness was found as a result of observation, the smoothness of the object to be treated in the treatment liquid was rated "1". In addition, as the rating scale was getting close to "10", roughness was further observed, and the metallic cobalt layer was evaluated as having a rougher surface. The smoothness rated "1 to 8" is at a practically preferably usable level, the smoothness rated "9" is at a practically usable level, and the smoothness rated "10" is at a level problematic for practical use.

<Evaluation on Metal Residue Removability>

An object to be treated (untreated laminate) comprising a metallic cobalt layer, a SiN film, a $SiO_2$ film, and a barrier metal (TaN) having a predetermined opening portion on a substrate (Si) in this order was formed. By using the barrier metal as a mask, plasma etching (dry etching) was performed on the obtained object to be treated. The SiN film and the $SiO_2$ film were etched until the metallic cobalt layer was exposed and via holes were formed, thereby manufacturing a sample 1 (see FIG. 3). The cross section of the laminate was checked using SEM/EDX (scanning electron microscope with energy-dispersive X-ray spectroscopy). As a result, plasma etching residues (metal residues) containing, as a main component, a metal such as cobalt on the wall surface of the holes were observed.

Then, by the following procedure, metal residue removability was evaluated. First, a section (about 2.0 cm×2.0 cm) of the prepared sample 1 was immersed for 1 minute in (treated with) each treatment liquid controlled to have a temperature of 40° C. After the lapse of a predetermined time, the section of the sample 1 was taken out, immediately washed with ultrapure water, and dried with $N_2$.

Thereafter, the surface of the section of the sample 1 having undergone immersion was observed with SEM/EDX, and the removability for the aforementioned metal residues was evaluated on a scale of 1 to 10.

The washing properties rated "1" are the best. The larger the rating scale, the worse the washing properties. Specifically, in a case where the metal residues were found to be completely removed as a result of observation, the washing properties were rated "1", and in a case where the metal residues were found to be substantially unremoved, the washing properties were rated "10". The washing properties rated "1 to 6" are at a practically preferably usable level, the washing properties rated "7 to 9" are at a practically usable level, and the washing properties rated "10" are at a level problematic for practical use.

Particularly, in view of balance between performances, it is preferable that the metal residue removability be rated 1 to 6 and the smoothness be rated 1 to 8.

[Result]

The following Tables 1a-1 to 1n-1 and Tables 1a-2 to 1n-2 show the formulation of the treatment liquids used in the series of test X and the test results.

In the tables, "%" means "% by mass", and "ppm" means "ppm by mass".

The column of "HA (%)" shows the content (% by mass) of hydroxylamine in each treatment liquid with respect to the total mass of the treatment liquid.

In the columns of "Chelating agent/Content", "Benzotriazole compound/Content", and "Organic solvent/Content", the upper row shows the type of each component added, and the lower row shows the amount (% by mass) of each component added.

The column of "Hydrazines (with respect to 100 parts of HA)" shows the total content (parts by mass) of the hydrazines with respect to 100 parts by mass of hydroxylamine in each treatment liquid. In a case where two kinds of hydrazines were used, the masses the two kinds of hydrazines contained in the treatment liquid were adjusted so that the masses were equal.

The column of "Anions (ppm)" shows the content (ppm by mass) of each anion in each treatment liquid with respect to the total mass of the treatment liquid.

The column of "Content of first anions (with respect to 100 parts of HA)" shows the total content (parts by mass) of the first anions with respect to 100 parts by mass of hydroxylamine in each treatment liquid.

The column of "Content of first and second anions (with respect to 100 parts of HA)" shows the total content (parts by mass) of the first anions and the second anions with respect to 100 parts by mass of hydroxylamine in each treatment liquid.

The column of "pH" shows the pH of each treatment liquid.

The components (remainder) of each treatment liquid that are not shown in the table consist of a pH adjuster added to achieve a predetermined pH and water.

Tables 1a-1 shows the formulation of the treatment liquids of Examples 001 to 049, and Table 1a-2 shows the test results obtained from the treatment liquids of the same examples.

For example, in the treatment liquid of Example 001, the content of hydroxylamine is 0.1% by mass with respect to the total mass of the treatment liquid, the content of hydrazine as hydrazines is 0.001 ppm by mass with respect to the total mass of the treatment liquid (0.0001 parts by mass with respect to 100 part by mass of hydroxylamine), none of the first anions, second anions, chelating agent, anticorrosive, and organic solvent are contained in the treatment liquid, and the remainder is a pH adjuster and water added to achieve a pH of 9. Regarding the test results obtained from the treatment liquid of Example 001, the organic residue removability is rated 3, the stability is rated 1, the metal residue removability is rated 9, and the smoothness is rated 3.

Tables 1b-1 and the subsequent tables and Table 1b-2 and the subsequent tables can be interpreted in the same way.

TABLE 1a-1

| | HA (%) | Type of hydrazines | Content of hydrazines (ppm) | Content of hydrazines (with respect to 100 parts of HA) | Anions (ppm) | | | | | Content of first anions (with respect to 100 parts of HA) | Content of first anions and second anions (with respect to 100 parts of HA) |
|---|---|---|---|---|---|---|---|---|---|---|---|
| | | | | | First anions | | | Second anions | | | |
| | | | | | $Cl^-$ | $NO_2^-$ | $NO_3^-$ | $SO_4^{2-}$ | $PO_4^{3-}$ | | |
| Example 001 | 0.1 | Hydrazine | 0.001 | 0.0001 | 0 | 0 | 0 | 0 | 0 | 0 | 0 |
| Example 002 | 0.1 | Hydrazine | 0.01 | 0.001 | 0 | 0 | 0 | 0 | 0 | 0 | 0 |
| Example 003 | 0.1 | Hydrazine | 0.1 | 0.01 | 0 | 0 | 0 | 0 | 0 | 0 | 0 |
| Example 004 | 0.1 | Hydrazine | 1 | 0.1 | 0 | 0 | 0 | 0 | 0 | 0 | 0 |
| Example 005 | 0.1 | Hydrazine | 10 | 1 | 0 | 0 | 0 | 0 | 0 | 0 | 0 |
| Example 006 | 1 | Hydrazine | 0.01 | 0.0001 | 0 | 0 | 0 | 0 | 0 | 0 | 0 |
| Example 007 | 1 | Hydrazine | 0.1 | 0.001 | 0 | 0 | 0 | 0 | 0 | 0 | 0 |
| Example 008 | 1 | Hydrazine | 1 | 0.01 | 0 | 0 | 0 | 0 | 0 | 0 | 0 |
| Example 009 | 1 | Hydrazine | 10 | 0.1 | 0 | 0 | 0 | 0 | 0 | 0 | 0 |
| Example 010 | 1 | Hydrazine | 100 | 1 | 0 | 0 | 0 | 0 | 0 | 0 | 0 |
| Example 011 | 5 | Hydrazine | 0.01 | 0.00002 | 0 | 0 | 0 | 0 | 0 | 0 | 0 |
| Example 012 | 5 | Hydrazine | 0.5 | 0.001 | 0 | 0 | 0 | 0 | 0 | 0 | 0 |
| Example 013 | 5 | Hydrazine | 5 | 0.01 | 0 | 0 | 0 | 0 | 0 | 0 | 0 |
| Example 014 | 5 | Hydrazine | 50 | 0.1 | 0 | 0 | 0 | 0 | 0 | 0 | 0 |
| Example 015 | 5 | Hydrazine | 500 | 1 | 0 | 0 | 0 | 0 | 0 | 0 | 0 |
| Example 016 | 10 | Hydrazine | 1 | 0.001 | 0 | 0 | 0 | 0 | 0 | 0 | 0 |
| Example 017 | 10 | Hydrazine | 10 | 0.01 | 0 | 0 | 0 | 0 | 0 | 0 | 0 |
| Example 018 | 10 | Hydrazine | 100 | 0.1 | 0 | 0 | 0 | 0 | 0 | 0 | 0 |
| Example 019 | 10 | Hydrazine | 1000 | 1 | 0 | 0 | 0 | 0 | 0 | 0 | 0 |
| Example 020 | 5 | Pyrazole | 50 | 0.1 | 0 | 0 | 0 | 0 | 0 | 0 | 0 |
| Example 021 | 5 | Carbohydrazide | 50 | 0.1 | 0 | 0 | 0 | 0 | 0 | 0 | 0 |
| Example 022 | 5 | Semicarbazide | 50 | 0.1 | 0 | 0 | 0 | 0 | 0 | 0 | 0 |
| Example 023 | 5 | Thiosemicarbazide | 50 | 0.1 | 0 | 0 | 0 | 0 | 0 | 0 | 0 |
| Example 024 | 5 | Monomethylhydrazide | 50 | 0.1 | 0 | 0 | 0 | 0 | 0 | 0 | 0 |
| Example 025 | 5 | t-Butylhydrazine | 50 | 0.1 | 0 | 0 | 0 | 0 | 0 | 0 | 0 |

TABLE 1a-1-continued

| | HA (%) | Type of hydrazines | Content of hydrazines (ppm) | Content of hydrazines (with respect to 100 parts of HA) | Anions (ppm) | | | | | Content of first anions (with respect to 100 parts of HA) | Content of first anions and second anions (with respect to 100 parts of HA) |
|---|---|---|---|---|---|---|---|---|---|---|---|
| | | | | | First anions | | | Second anions | | | |
| | | | | | $Cl^-$ | $NO_2^-$ | $NO_3^-$ | $SO_4^{2-}$ | $PO_4^{3-}$ | | |
| Example 026 | 5 | Dimethyl-hydrazine | 50 | 0.1 | 0 | 0 | 0 | 0 | 0 | 0 | 0 |
| Example 027 | 5 | Aminoguanidine | 50 | 0.1 | 0 | 0 | 0 | 0 | 0 | 0 | 0 |
| Example 028 | 5 | Hydrazine, pyrazole | 25, 25 | 0.1 | 0 | 0 | 0 | 0 | 0 | 0 | 0 |
| Example 029 | 5 | Hydrazine, carbohydrazide | 25, 25 | 0.1 | 0 | 0 | 0 | 0 | 0 | 0 | 0 |
| Example 030 | 5 | Hydrazine, semicarbazide | 25, 25 | 0.1 | 0 | 0 | 0 | 0 | 0 | 0 | 0 |
| Example 031 | 5 | Hydrazine, thiosemi-carbazide | 25, 25 | 0.1 | 0 | 0 | 0 | 0 | 0 | 0 | 0 |
| Example 032 | 5 | Hydrazine, monomethyl-hydrazide | 25, 25 | 0.1 | 0 | 0 | 0 | 0 | 0 | 0 | 0 |
| Example 033 | 5 | Hydrazine, t-butylhydrazine | 25, 25 | 0.1 | 0 | 0 | 0 | 0 | 0 | 0 | 0 |
| Example 034 | 5 | Hydrazine, dimethyl-hydrazine | 25, 25 | 0.1 | 0 | 0 | 0 | 0 | 0 | 0 | 0 |
| Example 035 | 5 | Hydrazine, aminoguanidine | 25, 25 | 0.1 | 0 | 0 | 0 | 0 | 0 | 0 | 0 |
| Example 036 | 1 | Hydrazine | 10 | 0.1 | 0.001 | 0.001 | 0.001 | 0 | 0 | 0.00003 | 0.00003 |
| Example 037 | 1 | Hydrazine | 10 | 0.1 | 1000 | 2000 | 2000 | 0 | 0 | 50 | 50 |
| Example 038 | 1 | Hydrazine | 10 | 0.1 | 1 | 0 | 1 | 0 | 0 | 0.02 | 0.02 |
| Example 039 | 1 | Hydrazine | 10 | 0.1 | 1 | 1 | 0 | 0 | 0 | 0.02 | 0.02 |
| Example 040 | 1 | Hydrazine | 10 | 0.1 | 1 | 0 | 0 | 0 | 0 | 0.01 | 0.01 |
| Example 041 | 1 | Hydrazine | 10 | 0.1 | 0 | 1 | 0 | 0 | 0 | 0.01 | 0.01 |
| Example 042 | 1 | Hydrazine | 10 | 0.1 | 0 | 0 | 1 | 0 | 0 | 0.01 | 0.01 |
| Example 043 | 1 | Hydrazine | 10 | 0.1 | 10 | 0 | 0 | 0 | 0 | 0.1 | 0.1 |
| Example 044 | 1 | Hydrazine | 10 | 0.1 | 0 | 10 | 0 | 0 | 0 | 0.1 | 0.1 |
| Example 045 | 1 | Hydrazine | 10 | 0.1 | 0 | 0 | 10 | 0 | 0 | 0.1 | 0.1 |
| Example 046 | 0.05 | Hydrazine | 0.5 | 0.1 | 0.1 | 1 | 1 | 0 | 0 | 0.42 | 0.42 |
| Example 047 | 0.05 | Hydrazine | 0.5 | 0.1 | 1 | 5 | 5 | 0 | 0 | 2.2 | 2.2 |
| Example 048 | 0.05 | Hydrazine | 0.5 | 0.1 | 5 | 20 | 50 | 0 | 0 | 15 | 15 |
| Example 049 | 0.05 | Hydrazine | 0.5 | 0.1 | 10 | 50 | 50 | 0 | 0 | 22 | 22 |

TABLE 1a-2

| | Chelating agent/ Content | Anticorrosive/ Content | Organic solvent/ Content | pH | Organic residue removability | Stability | Metal residue removability | Smoothness |
|---|---|---|---|---|---|---|---|---|
| Example 001 | — | — | — | 9 | 3 | 1 | 9 | 3 |
| Example 002 | — | — | — | 9 | 2 | 1 | 9 | 3 |
| Example 003 | — | — | — | 9 | 1 | 1 | 9 | 3 |
| Example 004 | — | — | — | 9 | 1 | 1 | 9 | 3 |
| Example 005 | — | — | — | 9 | 1 | 2 | 9 | 3 |
| Example 006 | — | — | — | 9 | 3 | 1 | 9 | 3 |
| Example 007 | — | — | — | 9 | 2 | 1 | 9 | 3 |
| Example 008 | — | — | — | 9 | 1 | 1 | 9 | 3 |
| Example 009 | — | — | — | 9 | 1 | 1 | 9 | 3 |
| Example 010 | — | — | — | 9 | 1 | 2 | 9 | 3 |
| Example 011 | — | — | — | 9 | 4 | 1 | 9 | 3 |
| Example 012 | — | — | — | 9 | 2 | 1 | 9 | 3 |
| Example 013 | — | — | — | 9 | 1 | 1 | 9 | 3 |
| Example 014 | — | — | — | 9 | 1 | 1 | 9 | 3 |
| Example 015 | — | — | — | 9 | 1 | 2 | 9 | 3 |
| Example 016 | — | — | — | 9 | 2 | 1 | 9 | 4 |
| Example 017 | — | — | — | 9 | 1 | 1 | 9 | 4 |
| Example 018 | — | — | — | 9 | 1 | 1 | 9 | 4 |
| Example 019 | — | — | — | 9 | 1 | 2 | 9 | 4 |
| Example 020 | — | — | — | 9 | 2 | 2 | 9 | 3 |
| Example 021 | — | — | — | 9 | 2 | 2 | 9 | 3 |
| Example 022 | — | — | — | 9 | 2 | 2 | 9 | 3 |

TABLE 1a-2-continued

| | Chelating agent/ Content | Anticorrosive/ Content | Organic solvent/ Content | pH | Organic residue removability | Stability | Metal residue removability | Smoothness |
|---|---|---|---|---|---|---|---|---|
| Example 023 | — | — | — | 9 | 2 | 2 | 9 | 3 |
| Example 024 | — | — | — | 9 | 2 | 2 | 9 | 3 |
| Example 025 | — | — | — | 9 | 2 | 2 | 9 | 3 |
| Example 026 | — | — | — | 9 | 2 | 2 | 9 | 3 |
| Example 027 | — | — | — | 9 | 2 | 2 | 9 | 3 |
| Example 028 | — | — | — | 9 | 1 | 1 | 9 | 3 |
| Example 029 | — | — | — | 9 | 1 | 1 | 9 | 3 |
| Example 030 | — | — | — | 9 | 1 | 1 | 9 | 3 |
| Example 031 | — | — | — | 9 | 1 | 1 | 9 | 3 |
| Example 032 | — | — | — | 9 | 1 | 1 | 9 | 3 |
| Example 033 | — | — | — | 9 | 1 | 1 | 9 | 3 |
| Example 034 | — | — | — | 9 | 1 | 1 | 9 | 3 |
| Example 035 | — | — | — | 9 | 1 | 1 | 9 | 3 |
| Example 036 | — | — | — | 9 | 1 | 1 | 8 | 3 |
| Example 037 | — | — | — | 9 | 1 | 1 | 1 | 9 |
| Example 038 | — | — | — | 9 | 1 | 1 | 8 | 3 |
| Example 039 | — | — | — | 9 | 1 | 1 | 8 | 3 |
| Example 040 | — | — | — | 9 | 1 | 1 | 8 | 3 |
| Example 041 | — | — | — | 9 | 1 | 1 | 8 | 3 |
| Example 042 | — | — | — | 9 | 1 | 1 | 8 | 3 |
| Example 043 | — | — | — | 9 | 1 | 1 | 7 | 3 |
| Example 044 | — | — | — | 9 | 1 | 1 | 7 | 3 |
| Example 045 | — | — | — | 9 | 1 | 1 | 7 | 3 |
| Example 046 | — | — | — | 9 | 1 | 1 | 6 | 3 |
| Example 047 | — | — | — | 9 | 1 | 1 | 5 | 4 |
| Example 048 | — | — | — | 9 | 1 | 1 | 4 | 5 |
| Example 049 | — | — | — | 9 | 1 | 1 | 4 | 5 |

TABLE 1b-1

| | HA (%) | Type of hydrazines | Content of hydrazines (ppm) | Content of hydrazines (with respect to 100 parts of HA) | Anions (ppm) First anions $Cl^-$ | $NO_2^-$ | $NO_3^-$ | Second anions $SO_4^{2-}$ | $PO_4^{3-}$ | Content of first anions (with respect to 100 parts of HA) | Content of first anions and second anions (with respect to 100 parts of HA) |
|---|---|---|---|---|---|---|---|---|---|---|---|
| Example 050 | 0.1 | Hydrazine | 1 | 0.1 | 0.1 | 1 | 1 | 0 | 0 | 0.21 | 0.21 |
| Example 051 | 0.1 | Hydrazine | 1 | 0.1 | 1 | 5 | 5 | 5 | 0 | 1.1 | 1.6 |
| Example 052 | 0.1 | Hydrazine | 1 | 0.1 | 1 | 5 | 5 | 300 | 0 | 1.1 | 31.1 |
| Example 053 | 0.1 | Hydrazine | 1 | 0.1 | 1 | 5 | 5 | 0 | 5 | 1.1 | 1.6 |
| Example 054 | 0.1 | Hydrazine | 1 | 0.1 | 1 | 5 | 5 | 0 | 300 | 1.1 | 31.1 |
| Example 055 | 0.1 | Hydrazine | 1 | 0.1 | 1 | 5 | 5 | 0 | 0 | 1.1 | 1.1 |
| Example 056 | 0.1 | Hydrazine | 1 | 0.1 | 5 | 20 | 50 | 0 | 0 | 7.5 | 7.5 |
| Example 057 | 0.1 | Hydrazine | 1 | 0.1 | 50 | 5 | 20 | 0 | 0 | 7.5 | 7.5 |
| Example 058 | 0.1 | Hydrazine | 1 | 0.1 | 10 | 50 | 100 | 0 | 0 | 16 | 16 |
| Example 059 | 0.1 | Hydrazine | 1 | 0.1 | 100 | 100 | 100 | 0 | 0 | 30 | 30 |
| Example 060 | 1 | Hydrazine | 10 | 0.1 | 0.1 | 1 | 1 | 0 | 0 | 0.021 | 0.021 |
| Example 061 | 1 | Hydrazine | 10 | 0.1 | 1 | 5 | 5 | 0 | 0 | 0.11 | 0.11 |
| Example 062 | 1 | Hydrazine | 10 | 0.1 | 5 | 20 | 50 | 0 | 0 | 0.75 | 0.75 |
| Example 063 | 1 | Hydrazine | 10 | 0.1 | 10 | 50 | 100 | 0 | 0 | 1.6 | 1.6 |
| Example 064 | 1 | Hydrazine | 10 | 0.1 | 100 | 100 | 100 | 0 | 0 | 3 | 3 |
| Example 065 | 1 | Hydrazine | 10 | 0.1 | 100 | 1000 | 1000 | 0 | 0 | 21 | 21 |
| Example 066 | 5 | Hydrazine | 50 | 0.1 | 0.1 | 1 | 1 | 0 | 0 | 0.0042 | 0.0042 |
| Example 067 | 5 | Hydrazine | 50 | 0.1 | 1 | 5 | 5 | 0 | 0 | 0.022 | 0.022 |
| Example 068 | 5 | Hydrazine | 50 | 0.1 | 5 | 20 | 50 | 0 | 0 | 0.15 | 0.15 |
| Example 069 | 5 | Hydrazine | 50 | 0.1 | 10 | 50 | 100 | 0 | 0 | 0.32 | 0.32 |
| Example 070 | 5 | Hydrazine | 50 | 0.1 | 100 | 100 | 100 | 0 | 0 | 0.6 | 0.6 |
| Example 071 | 5 | Hydrazine | 50 | 0.1 | 100 | 1000 | 1000 | 0 | 0 | 4.2 | 4.2 |
| Example 072 | 5 | Hydrazine | 50 | 0.1 | 200 | 2000 | 2000 | 0 | 0 | 8.4 | 8.4 |
| Example 073 | 5 | Hydrazine | 50 | 0.1 | 500 | 5000 | 5000 | 0 | 0 | 21 | 21 |
| Example 074 | 10 | Hydrazine | 100 | 0.1 | 0.1 | 1 | 1 | 0 | 0 | 0.0021 | 0.0021 |
| Example 075 | 10 | Hydrazine | 100 | 0.1 | 1 | 5 | 5 | 0 | 0 | 0.011 | 0.011 |
| Example 076 | 10 | Hydrazine | 100 | 0.1 | 5 | 20 | 50 | 0 | 0 | 0.075 | 0.075 |
| Example 077 | 10 | Hydrazine | 100 | 0.1 | 10 | 50 | 100 | 0 | 0 | 0.16 | 0.16 |
| Example 078 | 10 | Hydrazine | 100 | 0.1 | 100 | 100 | 100 | 0 | 0 | 0.3 | 0.3 |
| Example 079 | 10 | Hydrazine | 100 | 0.1 | 100 | 1000 | 1000 | 0 | 0 | 2.1 | 2.1 |
| Example 080 | 10 | Hydrazine | 100 | 0.1 | 200 | 2000 | 2000 | 0 | 0 | 4.2 | 4.2 |

TABLE 1b-1-continued

| | HA (%) | Type of hydrazines | Content of hydrazines (ppm) | Content of hydrazines (with respect to 100 parts of HA) | Anions (ppm) | | | | | Content of first anions (with respect to 100 parts of HA) | Content of first anions and second anions (with respect to 100 parts of HA) |
|---|---|---|---|---|---|---|---|---|---|---|---|
| | | | | | First anions | | | Second anions | | | |
| | | | | | $Cl^-$ | $NO_2^-$ | $NO_3^-$ | $SO_4^{2-}$ | $PO_4^{3-}$ | | |
| Example 081 | 10 | Hydrazine | 100 | 0.1 | 500 | 5000 | 5000 | 0 | 0 | 10.5 | 10.5 |
| Example 082 | 10 | Hydrazine | 100 | 0.1 | 1000 | 10000 | 10000 | 0 | 0 | 21 | 21 |
| Example 083 | 20 | Hydrazine | 200 | 0.1 | 0.1 | 1 | 1 | 0 | 0 | 0.00105 | 0.00105 |
| Example 084 | 20 | Hydrazine | 200 | 0.1 | 1 | 5 | 5 | 0 | 0 | 0.0055 | 0.0055 |
| Example 085 | 20 | Hydrazine | 200 | 0.1 | 5 | 20 | 50 | 0 | 0 | 0.0375 | 0.0375 |
| Example 086 | 20 | Hydrazine | 200 | 0.1 | 10 | 50 | 100 | 0 | 0 | 0.08 | 0.08 |
| Example 087 | 20 | Hydrazine | 200 | 0.1 | 100 | 100 | 100 | 0 | 0 | 0.15 | 0.15 |
| Example 088 | 20 | Hydrazine | 200 | 0.1 | 100 | 1000 | 1000 | 0 | 0 | 1.05 | 1.05 |
| Example 089 | 20 | Hydrazine | 200 | 0.1 | 200 | 2000 | 2000 | 0 | 0 | 2.1 | 2.1 |
| Example 090 | 20 | Hydrazine | 200 | 0.1 | 500 | 5000 | 5000 | 0 | 0 | 5.25 | 5.25 |
| Example 091 | 20 | Hydrazine | 200 | 0.1 | 1000 | 10000 | 10000 | 0 | 0 | 10.5 | 10.5 |
| Example 092 | 20 | Hydrazine | 200 | 0.1 | 2000 | 20000 | 20000 | 0 | 0 | 21 | 21 |

TABLE 1b-2

| | Chelating agent/Content | Anticorrosive/Content | Organic solvent/Content | pH | Organic residue removability | Stability | Metal residue removability | Smoothness |
|---|---|---|---|---|---|---|---|---|
| Example 050 | — | — | — | 9 | 1 | 1 | 5 | 4 |
| Example 051 | — | — | — | 9 | 1 | 1 | 4 | 5 |
| Example 052 | — | — | — | 9 | 1 | 1 | 4 | 6 |
| Example 053 | — | — | — | 9 | 1 | 1 | 4 | 5 |
| Example 054 | — | — | — | 9 | 1 | 1 | 4 | 6 |
| Example 055 | — | — | — | 9 | 1 | 1 | 4 | 5 |
| Example 056 | — | — | — | 9 | 1 | 1 | 4 | 5 |
| Example 057 | — | — | — | 9 | 1 | 1 | 5 | 5 |
| Example 058 | — | — | — | 9 | 1 | 1 | 3 | 6 |
| Example 059 | — | — | — | 9 | 1 | 1 | 3 | 6 |
| Example 060 | — | — | — | 9 | 1 | 1 | 4 | 4 |
| Example 061 | — | — | — | 9 | 1 | 1 | 4 | 4 |
| Example 062 | — | — | — | 9 | 1 | 1 | 3 | 5 |
| Example 063 | — | — | — | 9 | 1 | 1 | 3 | 5 |
| Example 064 | — | — | — | 9 | 1 | 1 | 3 | 5 |
| Example 065 | — | — | — | 9 | 1 | 1 | 2 | 6 |
| Example 066 | — | — | — | 9 | 1 | 1 | 5 | 3 |
| Example 067 | — | — | — | 9 | 1 | 1 | 4 | 4 |
| Example 068 | — | — | — | 9 | 1 | 1 | 4 | 4 |
| Example 069 | — | — | — | 9 | 1 | 1 | 4 | 4 |
| Example 070 | — | — | — | 9 | 1 | 1 | 3 | 5 |
| Example 071 | — | — | — | 9 | 1 | 1 | 3 | 5 |
| Example 072 | — | — | — | 9 | 1 | 1 | 3 | 5 |
| Example 073 | — | — | — | 9 | 1 | 1 | 2 | 6 |
| Example 074 | — | — | — | 9 | 1 | 1 | 5 | 4 |
| Example 075 | — | — | — | 9 | 1 | 1 | 5 | 4 |
| Example 076 | — | — | — | 9 | 1 | 1 | 4 | 5 |
| Example 077 | — | — | — | 9 | 1 | 1 | 4 | 5 |
| Example 078 | — | — | — | 9 | 1 | 1 | 4 | 5 |
| Example 079 | — | — | — | 9 | 1 | 1 | 3 | 6 |
| Example 080 | — | — | — | 9 | 1 | 1 | 3 | 6 |
| Example 081 | — | — | — | 9 | 1 | 1 | 2 | 7 |
| Example 082 | — | — | — | 9 | 1 | 1 | 2 | 7 |
| Example 083 | — | — | — | 9 | 1 | 1 | 4 | 5 |
| Example 084 | — | — | — | 9 | 1 | 1 | 4 | 5 |
| Example 085 | — | — | — | 9 | 1 | 1 | 3 | 6 |
| Example 086 | — | — | — | 9 | 1 | 1 | 3 | 6 |
| Example 087 | — | — | — | 9 | 1 | 1 | 3 | 6 |
| Example 088 | — | — | — | 9 | 1 | 1 | 2 | 7 |
| Example 089 | — | — | — | 9 | 1 | 1 | 2 | 7 |
| Example 090 | — | — | — | 9 | 1 | 1 | 2 | 7 |
| Example 091 | — | — | — | 9 | 1 | 1 | 1 | 8 |
| Example 092 | — | — | — | 9 | 1 | 1 | 1 | 8 |

TABLE 1c-1

| | HA (%) | Type of hydrazines | Content of hydrazines (ppm) | Content of hydrazines (with respect to 100 parts of HA) | Anions (ppm) | | | | | Content of first anions (with respect to 100 parts of HA) | Content of first anions and second anions (with respect to 100 parts of HA) |
|---|---|---|---|---|---|---|---|---|---|---|---|
| | | | | | First anions | | | Second anions | | | |
| | | | | | Cl⁻ | NO₂⁻ | NO₃⁻ | SO₄²⁻ | PO₄³⁻ | | |
| Example 093 | 0.1 | Hydrazine | 1 | 0.1 | 1 | 5 | 5 | 0 | 0 | 1.1 | 1.1 |
| Example 094 | 0.1 | Hydrazine | 1 | 0.1 | 5 | 20 | 50 | 0 | 0 | 7.5 | 7.5 |
| Example 095 | 1 | Hydrazine | 10 | 0.1 | 10 | 50 | 100 | 0 | 0 | 1.6 | 1.6 |
| Example 096 | 1 | Hydrazine | 10 | 0.1 | 100 | 100 | 100 | 0 | 0 | 3 | 3 |
| Example 097 | 5 | Hydrazine | 50 | 0.1 | 100 | 100 | 100 | 0 | 0 | 0.6 | 0.6 |
| Example 098 | 5 | Hydrazine | 50 | 0.1 | 100 | 1000 | 1000 | 0 | 0 | 4.2 | 4.2 |
| Example 099 | 5 | Hydrazine | 50 | 0.1 | 200 | 2000 | 2000 | 0 | 0 | 8.4 | 8.4 |
| Example 100 | 0.1 | Hydrazine | 1 | 0.1 | 1 | 5 | 5 | 0 | 0 | 1.1 | 1.1 |
| Example 101 | 0.1 | Hydrazine | 1 | 0.1 | 5 | 20 | 50 | 0 | 0 | 7.5 | 7.5 |
| Example 102 | 1 | Hydrazine | 10 | 0.1 | 10 | 50 | 100 | 0 | 0 | 1.6 | 1.6 |
| Example 103 | 1 | Hydrazine | 10 | 0.1 | 100 | 100 | 100 | 0 | 0 | 3 | 3 |
| Example 104 | 5 | Hydrazine | 50 | 0.1 | 100 | 100 | 100 | 0 | 0 | 0.6 | 0.6 |
| Example 105 | 5 | Hydrazine | 50 | 0.1 | 100 | 1000 | 1000 | 0 | 0 | 4.2 | 4.2 |
| Example 106 | 5 | Hydrazine | 50 | 0.1 | 200 | 2000 | 2000 | 0 | 0 | 8.4 | 8.4 |
| Example 107 | 0.1 | Hydrazine | 1 | 0.1 | 1 | 5 | 5 | 0 | 0 | 1.1 | 1.1 |
| Example 108 | 0.1 | Hydrazine | 1 | 0.1 | 5 | 20 | 50 | 0 | 0 | 7.5 | 7.5 |
| Example 109 | 1 | Hydrazine | 10 | 0.1 | 10 | 50 | 100 | 0 | 0 | 1.6 | 1.6 |
| Example 110 | 1 | Hydrazine | 10 | 0.1 | 100 | 100 | 100 | 0 | 0 | 3 | 3 |
| Example 111 | 5 | Hydrazine | 50 | 0.1 | 100 | 100 | 100 | 0 | 0 | 0.6 | 0.6 |
| Example 112 | 5 | Hydrazine | 50 | 0.1 | 100 | 1000 | 1000 | 0 | 0 | 4.2 | 4.2 |
| Example 113 | 5 | Hydrazine | 50 | 0.1 | 200 | 2000 | 2000 | 0 | 0 | 8.4 | 8.4 |
| Example 114 | 0.1 | Hydrazine | 1 | 0.1 | 1 | 5 | 5 | 0 | 0 | 1.1 | 1.1 |
| Example 115 | 0.1 | Hydrazine | 1 | 0.1 | 5 | 20 | 50 | 0 | 0 | 7.5 | 7.5 |
| Example 116 | 1 | Hydrazine | 10 | 0.1 | 10 | 50 | 100 | 0 | 0 | 1.6 | 1.6 |
| Example 117 | 1 | Hydrazine | 10 | 0.1 | 100 | 100 | 100 | 0 | 0 | 3 | 3 |
| Example 118 | 5 | Hydrazine | 50 | 0.1 | 100 | 100 | 100 | 0 | 0 | 0.6 | 0.6 |
| Example 119 | 5 | Hydrazine | 50 | 0.1 | 100 | 1000 | 1000 | 0 | 0 | 4.2 | 4.2 |
| Example 120 | 5 | Hydrazine | 50 | 0.1 | 200 | 2000 | 2000 | 0 | 0 | 8.4 | 8.4 |

TABLE 1c-2

| | Chelating agent/Content | Anticorrosive/Content | Organic solvent/Content | pH | Organic residue removability | Stability | Metal residue removability | Smoothness |
|---|---|---|---|---|---|---|---|---|
| Example 093 | Diethylenetriaminepentaacetic acid/1% | — | — | 8 | 1 | 1 | 2 | 5 |
| Example 094 | Diethylenetriaminepentaacetic acid/1% | — | — | 8 | 1 | 1 | 2 | 5 |
| Example 095 | Diethylenetriaminepentaacetic acid/1% | — | — | 8 | 1 | 1 | 1 | 5 |
| Example 096 | Diethylenetriaminepentaacetic acid/1% | — | — | 8 | 1 | 1 | 1 | 5 |
| Example 097 | Diethylenetriaminepentaacetic acid/1% | — | — | 8 | 1 | 1 | 1 | 5 |
| Example 098 | Diethylenetriaminepentaacetic acid/1% | — | — | 8 | 1 | 1 | 1 | 5 |
| Example 099 | Diethylenetriaminepentaacetic acid/1% | — | — | 8 | 1 | 1 | 1 | 5 |
| Example 100 | Ethylenediaminetetraacetic acid/1% | — | — | 8 | 1 | 1 | 3 | 5 |
| Example 101 | Ethylenediaminetetraacetic acid/1% | — | — | 8 | 1 | 1 | 3 | 5 |
| Example 102 | Ethylenediaminetetraacetic acid/1% | — | — | 8 | 1 | 1 | 2 | 5 |
| Example 103 | Ethylenediaminetetraacetic acid/1% | — | — | 8 | 1 | 1 | 2 | 5 |
| Example 104 | Ethylenediaminetetraacetic acid/1% | — | — | 8 | 1 | 1 | 2 | 5 |
| Example 105 | Ethylenediaminetetraacetic acid/1% | — | — | 8 | 1 | 1 | 2 | 5 |
| Example 106 | Ethylenediaminetetraacetic acid/1% | — | — | 8 | 1 | 1 | 2 | 5 |
| Example 107 | Trans-1,2-diaminocyclohexanetetraacetic acid/1% | — | — | 8 | 1 | 1 | 3 | 5 |
| Example 108 | Trans-1,2-diaminocyclohexanetetraacetic acid/1% | — | — | 8 | 1 | 1 | 3 | 5 |
| Example 109 | Trans-1,2-diaminocyclohexanetetraacetic acid/1% | — | — | 8 | 1 | 1 | 2 | 5 |
| Example 110 | Trans-1,2-diaminocyclohexanetetraacetic acid/1% | — | — | 8 | 1 | 1 | 2 | 5 |
| Example 111 | Trans-1,2-diaminocyclohexanetetraacetic acid/1% | — | — | 8 | 1 | 1 | 2 | 5 |
| Example 112 | Trans-1,2-diaminocyclohexanetetraacetic acid/1% | — | — | 8 | 1 | 1 | 2 | 5 |

TABLE 1c-2-continued

|  | Chelating agent/Content | Anticorrosive/ Content | Organic solvent/ Content | pH | Organic residue removability | Stability | Metal residue removability | Smoothness |
|---|---|---|---|---|---|---|---|---|
| Example 113 | Trans-1,2-diaminocyclohexanetetraacetic acid/1% | — | — | 8 | 1 | 1 | 2 | 5 |
| Example 114 | Oxalic acid/1% | — | — | 6 | 1 | 1 | 3 | 5 |
| Example 115 | Oxalic acid/1% | — | — | 6 | 1 | 1 | 3 | 5 |
| Example 116 | Oxalic acid/1% | — | — | 6 | 1 | 1 | 2 | 5 |
| Example 117 | Oxalic acid/1% | — | — | 6 | 1 | 1 | 2 | 5 |
| Example 118 | Oxalic acid/1% | — | — | 6 | 1 | 1 | 2 | 5 |
| Example 119 | Oxalic acid/1% | — | — | 6 | 1 | 1 | 2 | 5 |
| Example 120 | Oxalic acid/1% | — | — | 6 | 1 | 1 | 2 | 5 |

TABLE 1d-1

|  | HA (%) | Type of hydrazines | Content of hydrazines (ppm) | Content of hydrazines (with respect to 100 parts of HA) | Anions (ppm) Cl$^-$ | Anions (ppm) NO$_2^-$ | Anions (ppm) NO$_3^-$ | Anions (ppm) SO$_4^{2-}$ | Anions (ppm) PO$_4^{3-}$ | Content of first anions (with respect to 100 parts of HA) | Content of first anions and second anions (with respect to 100 parts of HA) |
|---|---|---|---|---|---|---|---|---|---|---|---|
| Example 121 | 0.1 | Hydrazine | 1 | 0.1 | 1 | 5 | 5 | 0 | 0 | 1.1 | 1.1 |
| Example 122 | 0.1 | Hydrazine | 1 | 0.1 | 5 | 20 | 50 | 0 | 0 | 7.5 | 7.5 |
| Example 123 | 1 | Hydrazine | 10 | 0.1 | 10 | 50 | 100 | 0 | 0 | 1.6 | 1.6 |
| Example 124 | 1 | Hydrazine | 10 | 0.1 | 100 | 100 | 100 | 0 | 0 | 3 | 3 |
| Example 125 | 5 | Hydrazine | 50 | 0.1 | 100 | 100 | 100 | 0 | 0 | 0.6 | 0.6 |
| Example 126 | 5 | Hydrazine | 50 | 0.1 | 100 | 1000 | 1000 | 0 | 0 | 4.2 | 4.2 |
| Example 127 | 5 | Hydrazine | 50 | 0.1 | 200 | 2000 | 2000 | 0 | 0 | 8.4 | 8.4 |
| Example 128 | 0.1 | Hydrazine | 1 | 0.1 | 1 | 5 | 5 | 0 | 0 | 1.1 | 1.1 |
| Example 129 | 0.1 | Hydrazine | 1 | 0.1 | 5 | 20 | 50 | 0 | 0 | 7.5 | 7.5 |
| Example 130 | 1 | Hydrazine | 10 | 0.1 | 10 | 50 | 100 | 0 | 0 | 1.6 | 1.6 |
| Example 131 | 1 | Hydrazine | 10 | 0.1 | 100 | 100 | 100 | 0 | 0 | 3 | 3 |
| Example 132 | 5 | Hydrazine | 50 | 0.1 | 100 | 100 | 100 | 0 | 0 | 0.6 | 0.6 |
| Example 133 | 5 | Hydrazine | 50 | 0.1 | 100 | 1000 | 1000 | 0 | 0 | 4.2 | 4.2 |
| Example 134 | 5 | Hydrazine | 50 | 0.1 | 200 | 2000 | 2000 | 0 | 0 | 8.4 | 8.4 |
| Example 135 | 0.1 | Hydrazine | 1 | 0.1 | 1 | 5 | 5 | 0 | 0 | 1.1 | 1.1 |
| Example 136 | 0.1 | Hydrazine | 1 | 0.1 | 5 | 20 | 50 | 0 | 0 | 7.5 | 7.5 |
| Example 137 | 1 | Hydrazine | 10 | 0.1 | 10 | 50 | 100 | 0 | 0 | 1.6 | 1.6 |
| Example 138 | 1 | Hydrazine | 10 | 0.1 | 100 | 100 | 100 | 0 | 0 | 3 | 3 |
| Example 139 | 5 | Hydrazine | 50 | 0.1 | 100 | 100 | 100 | 0 | 0 | 0.6 | 0.6 |
| Example 140 | 5 | Hydrazine | 50 | 0.1 | 100 | 1000 | 1000 | 0 | 0 | 4.2 | 4.2 |
| Example 141 | 5 | Hydrazine | 50 | 0.1 | 200 | 2000 | 2000 | 0 | 0 | 8.4 | 8.4 |
| Example 142 | 0.1 | Hydrazine | 1 | 0.1 | 1 | 5 | 5 | 0 | 0 | 1.1 | 1.1 |
| Example 143 | 0.1 | Hydrazine | 1 | 0.1 | 5 | 20 | 50 | 0 | 0 | 7.5 | 7.5 |
| Example 144 | 1 | Hydrazine | 10 | 0.1 | 10 | 50 | 100 | 0 | 0 | 1.6 | 1.6 |
| Example 145 | 1 | Hydrazine | 10 | 0.1 | 100 | 100 | 100 | 0 | 0 | 3 | 3 |
| Example 146 | 5 | Hydrazine | 50 | 0.1 | 100 | 100 | 100 | 0 | 0 | 0.6 | 0.6 |
| Example 147 | 5 | Hydrazine | 50 | 0.1 | 100 | 1000 | 1000 | 0 | 0 | 4.2 | 4.2 |
| Example 148 | 5 | Hydrazine | 50 | 0.1 | 200 | 2000 | 2000 | 0 | 0 | 8.4 | 8.4 |

TABLE 1d-2

|  | Chelating agent/Content | Anticorrosive/ Content | Organic solvent/ Content | pH | Organic residue removability | Stability | Metal residue removability | Smoothness |
|---|---|---|---|---|---|---|---|---|
| Example 121 | Malonic acid/1% | — | — | 6 | 1 | 1 | 3 | 5 |
| Example 122 | Malonic acid/1% | — | — | 6 | 1 | 1 | 3 | 5 |
| Example 123 | Malonic acid/1% | — | — | 6 | 1 | 1 | 2 | 5 |
| Example 124 | Malonic acid/1% | — | — | 6 | 1 | 1 | 2 | 5 |
| Example 125 | Malonic acid/1% | — | — | 6 | 1 | 1 | 2 | 5 |
| Example 126 | Malonic acid/1% | — | — | 6 | 1 | 1 | 2 | 5 |
| Example 127 | Malonic acid/1% | — | — | 6 | 1 | 1 | 2 | 5 |
| Example 128 | Citric acid/1% | — | — | 6 | 1 | 1 | 2 | 5 |

TABLE 1d-2-continued

|  | Chelating agent/Content | Anticorrosive/Content | Organic solvent/Content | pH | Organic residue removability | Stability | Metal residue removability | Smoothness |
|---|---|---|---|---|---|---|---|---|
| Example 129 | Citric acid/1% | — | — | 6 | 1 | 1 | 2 | 5 |
| Example 130 | Citric acid/1% | — | — | 6 | 1 | 1 | 1 | 5 |
| Example 131 | Citric acid/1% | — | — | 6 | 1 | 1 | 1 | 5 |
| Example 132 | Citric acid/1% | — | — | 6 | 1 | 1 | 1 | 5 |
| Example 133 | Citric acid/1% | — | — | 6 | 1 | 1 | 1 | 5 |
| Example 134 | Citric acid/1% | — | — | 6 | 1 | 1 | 1 | 5 |
| Example 135 | Methanesulfonic acid/1% | — | — | 6 | 1 | 1 | 3 | 5 |
| Example 136 | Methanesulfonic acid/1% | — | — | 6 | 1 | 1 | 3 | 5 |
| Example 137 | Methanesulfonic acid/1% | — | — | 6 | 1 | 1 | 2 | 5 |
| Example 138 | Methanesulfonic acid/1% | — | — | 6 | 1 | 1 | 2 | 5 |
| Example 139 | Methanesulfonic acid/1% | — | — | 6 | 1 | 1 | 2 | 5 |
| Example 140 | Methanesulfonic acid/1% | — | — | 6 | 1 | 1 | 2 | 5 |
| Example 141 | Methanesulfonic acid/1% | — | — | 6 | 1 | 1 | 2 | 5 |
| Example 142 | 1-Hydroxyethylidene-1,1-diphosphonic acid/1% | — | — | 6 | 1 | 1 | 3 | 5 |
| Example 143 | 1-Hydroxyethylidene-1,1-diphosphonic acid/1% | — | — | 6 | 1 | 1 | 3 | 5 |
| Example 144 | 1-Hydroxyethylidene-1,1-diphosphonic acid/1% | — | — | 6 | 1 | 1 | 2 | 5 |
| Example 145 | 1-Hydroxyethylidene-1,1-diphosphonic acid/1% | — | — | 6 | 1 | 1 | 2 | 5 |
| Example 146 | 1-Hydroxyethylidene-1,1-diphosphonic acid/1% | — | — | 6 | 1 | 1 | 2 | 5 |
| Example 147 | 1-Hydroxyethylidene-1,1-diphosphonic acid/1% | — | — | 6 | 1 | 1 | 2 | 5 |
| Example 148 | 1-Hydroxyethylidene-1,1-diphosphonic acid/1% | — | — | 6 | 1 | 1 | 2 | 5 |

TABLE 1e-1

|  | HA (%) | Type of hydrazines | Content of hydrazines (ppm) | Content of hydrazines (with respect to 100 parts of HA) | Anions (ppm) | | | | | Content of first anions (with respect to 100 parts of HA) | Content of first anions and second anions (with respect to 100 parts of HA) |
|---|---|---|---|---|---|---|---|---|---|---|---|
|  |  |  |  |  | First anions | | | Second anions | | | |
|  |  |  |  |  | $Cl^-$ | $NO_2^-$ | $NO_3^-$ | $SO_4^{2-}$ | $PO_4^{3-}$ | | |
| Example 149 | 0.1 | Hydrazine | 1 | 0.1 | 1 | 5 | 5 | 0 | 0 | 1.1 | 1.1 |
| Example 150 | 0.1 | Hydrazine | 1 | 0.1 | 5 | 20 | 50 | 0 | 0 | 7.5 | 7.5 |
| Example 151 | 1 | Hydrazine | 10 | 0.1 | 10 | 50 | 100 | 0 | 0 | 1.6 | 1.6 |
| Example 152 | 1 | Hydrazine | 10 | 0.1 | 100 | 100 | 100 | 0 | 0 | 3 | 3 |
| Example 153 | 5 | Hydrazine | 50 | 0.1 | 100 | 100 | 100 | 0 | 0 | 0.6 | 0.6 |
| Example 154 | 5 | Hydrazine | 50 | 0.1 | 100 | 1000 | 1000 | 0 | 0 | 4.2 | 4.2 |
| Example 155 | 5 | Hydrazine | 50 | 0.1 | 200 | 2000 | 2000 | 0 | 0 | 8.4 | 8.4 |
| Example 156 | 0.1 | Hydrazine | 1 | 0.1 | 1 | 5 | 5 | 0 | 0 | 1.1 | 1.1 |
| Example 157 | 0.1 | Hydrazine | 1 | 0.1 | 5 | 20 | 50 | 0 | 0 | 7.5 | 7.5 |
| Example 158 | 1 | Hydrazine | 10 | 0.1 | 10 | 50 | 100 | 0 | 0 | 1.6 | 1.6 |
| Example 159 | 1 | Hydrazine | 10 | 0.1 | 100 | 100 | 100 | 0 | 0 | 3 | 3 |
| Example 160 | 5 | Hydrazine | 50 | 0.1 | 100 | 100 | 100 | 0 | 0 | 0.6 | 0.6 |
| Example 161 | 5 | Hydrazine | 50 | 0.1 | 100 | 1000 | 1000 | 0 | 0 | 4.2 | 4.2 |
| Example 162 | 5 | Hydrazine | 50 | 0.1 | 200 | 2000 | 2000 | 0 | 0 | 8.4 | 8.4 |
| Example 163 | 0.1 | Hydrazine | 1 | 0.1 | 1 | 5 | 5 | 0 | 0 | 1.1 | 1.1 |
| Example 164 | 0.1 | Hydrazine | 1 | 0.1 | 5 | 20 | 50 | 0 | 0 | 7.5 | 7.5 |
| Example 165 | 1 | Hydrazine | 10 | 0.1 | 10 | 50 | 100 | 0 | 0 | 1.6 | 1.6 |
| Example 166 | 1 | Hydrazine | 10 | 0.1 | 100 | 100 | 100 | 0 | 0 | 3 | 3 |
| Example 167 | 5 | Hydrazine | 50 | 0.1 | 100 | 100 | 100 | 0 | 0 | 0.6 | 0.6 |
| Example 168 | 5 | Hydrazine | 50 | 0.1 | 100 | 1000 | 1000 | 0 | 0 | 4.2 | 4.2 |
| Example 169 | 5 | Hydrazine | 50 | 0.1 | 200 | 2000 | 2000 | 0 | 0 | 8.4 | 8.4 |
| Example 170 | 0.1 | Hydrazine | 1 | 0.1 | 1 | 5 | 5 | 0 | 0 | 1.1 | 1.1 |
| Example 171 | 0.1 | Hydrazine | 1 | 0.1 | 5 | 20 | 50 | 0 | 0 | 7.5 | 7.5 |
| Example 172 | 1 | Hydrazine | 10 | 0.1 | 10 | 50 | 100 | 0 | 0 | 1.6 | 1.6 |
| Example 173 | 1 | Hydrazine | 10 | 0.1 | 100 | 100 | 100 | 0 | 0 | 3 | 3 |
| Example 174 | 5 | Hydrazine | 50 | 0.1 | 100 | 100 | 100 | 0 | 0 | 0.6 | 0.6 |
| Example 175 | 5 | Hydrazine | 50 | 0.1 | 100 | 1000 | 1000 | 0 | 0 | 4.2 | 4.2 |
| Example 176 | 5 | Hydrazine | 50 | 0.1 | 200 | 2000 | 2000 | 0 | 0 | 8.4 | 8.4 |

TABLE 1e-2

| | Chelating agent/Content | Anticorrosive/Content | Organic solvent/Content | pH | Organic residue removability | Stability | Metal residue removability | Smoothness |
|---|---|---|---|---|---|---|---|---|
| Example 149 | Nitrilotrismethylene phosphonica cid/1% | — | — | 6 | 1 | 1 | 3 | 5 |
| Example 150 | Nitrilotrismethylene phosphonic acid/1% | — | — | 6 | 1 | 1 | 3 | 5 |
| Example 151 | Nitrilotrismethylene phosphonic acid/1% | — | — | 6 | 1 | 1 | 2 | 5 |
| Example 152 | Nitrilotrismethylene phosphonic acid/1% | — | — | 6 | 1 | 1 | 2 | 5 |
| Example 153 | Nitrilotrismethylene phosphonic acid/1% | — | — | 6 | 1 | 1 | 2 | 5 |
| Example 154 | Nitrilotrismethylene phosphonic acid/1% | — | — | 6 | 1 | 1 | 2 | 5 |
| Example 155 | Nitrilotrismethylene phosphonic acid/1% | — | — | 6 | 1 | 1 | 2 | 5 |
| Example 156 | — | Benzotriazole/0.5% | — | 8 | 1 | 1 | 4 | 3 |
| Example 157 | — | Benzotriazole/0.5% | — | 8 | 1 | 1 | 4 | 3 |
| Example 158 | — | Benzotriazole/0.5% | — | 8 | 1 | 1 | 3 | 3 |
| Example 159 | — | Benzotriazole/0.5% | — | 8 | 1 | 1 | 3 | 3 |
| Example 160 | — | Benzotriazole/0.5% | — | 8 | 1 | 1 | 3 | 3 |
| Example 161 | — | Benzotriazole/0.5% | — | 8 | 1 | 1 | 3 | 3 |
| Example 162 | — | Benzotriazole/0.5% | — | 8 | 1 | 1 | 3 | 3 |
| Example 163 | — | 5-Aminotetrazole/0.5% | — | 8 | 1 | 1 | 4 | 4 |
| Example 164 | — | 5-Aminotetrazole/0.5% | — | 8 | 1 | 1 | 4 | 4 |
| Example 165 | — | 5-Aminotetrazole/0.5% | — | 8 | 1 | 1 | 3 | 4 |
| Example 166 | — | 5-Aminotetrazole/0.5% | — | 8 | 1 | 1 | 3 | 4 |
| Example 167 | — | 5-Aminotetrazole/0.5% | — | 8 | 1 | 1 | 3 | 4 |
| Example 168 | — | 5-Aminotetrazole/0.5% | — | 8 | 1 | 1 | 3 | 4 |
| Example 169 | — | 5-Aminotetrazole/0.5% | — | 8 | 1 | 1 | 3 | 4 |
| Example 170 | — | 5-Phenylbenzotriazole/0.5% | — | 8 | 1 | 1 | 4 | 4 |
| Example 171 | — | 5-Phenylbenzotriazole/0.5% | — | 8 | 1 | 1 | 4 | 4 |
| Example 172 | — | 5-Phenylbenzotriazole/0.5% | — | 8 | 1 | 1 | 3 | 4 |
| Example 173 | — | 5-Phenylbenzotriazole/0.5% | — | 8 | 1 | 1 | 3 | 4 |
| Example 174 | — | 5-Phenylbenzotriazole/0.5% | — | 8 | 1 | 1 | 3 | 4 |
| Example 175 | — | 5-Phenylbenzotriazole/0.5% | — | 8 | 1 | 1 | 3 | 4 |
| Example 176 | — | 5-Phenylbenzotriazole/0.5% | — | 8 | 1 | 1 | 3 | 4 |

TABLE 1f-1

| | HA (%) | Type of hydrazines | Content of hydrazines (ppm) | Content of hydrazines (with respect to 100 parts of HA) | Anions (ppm) First anions Cl$^-$ | Anions (ppm) First anions NO$_2^-$ | Anions (ppm) First anions NO$_3^-$ | Anions (ppm) Second anions SO$_4^{2-}$ | Anions (ppm) Second anions PO$_4^{3-}$ | Content of first anions (with respect to 100 parts of HA) | Content of first anions and second anions (with respect to 100 parts of HA) |
|---|---|---|---|---|---|---|---|---|---|---|---|
| Example 177 | 0.1 | Hydrazine | 1 | 0.1 | 1 | 5 | 5 | 0 | 0 | 1.1 | 1.1 |
| Example 178 | 0.1 | Hydrazine | 1 | 0.1 | 5 | 20 | 50 | 0 | 0 | 7.5 | 7.5 |
| Example 179 | 1 | Hydrazine | 10 | 0.1 | 10 | 50 | 100 | 0 | 0 | 1.6 | 1.6 |
| Example 180 | 1 | Hydrazine | 10 | 0.1 | 100 | 100 | 100 | 0 | 0 | 3 | 3 |
| Example 181 | 5 | Hydrazine | 50 | 0.1 | 100 | 100 | 100 | 0 | 0 | 0.6 | 0.6 |
| Example 182 | 5 | Hydrazine | 50 | 0.1 | 100 | 1000 | 1000 | 0 | 0 | 4.2 | 4.2 |
| Example 183 | 5 | Hydrazine | 50 | 0.1 | 200 | 2000 | 2000 | 0 | 0 | 8.4 | 8.4 |
| Example 184 | 0.1 | Hydrazine | 1 | 0.1 | 1 | 5 | 5 | 0 | 0 | 1.1 | 1.1 |
| Example 185 | 0.1 | Hydrazine | 1 | 0.1 | 5 | 20 | 50 | 0 | 0 | 7.5 | 7.5 |
| Example 186 | 1 | Hydrazine | 10 | 0.1 | 10 | 50 | 100 | 0 | 0 | 1.6 | 1.6 |
| Example 187 | 1 | Hydrazine | 10 | 0.1 | 100 | 100 | 100 | 0 | 0 | 3 | 3 |
| Example 188 | 5 | Hydrazine | 50 | 0.1 | 100 | 100 | 100 | 0 | 0 | 0.6 | 0.6 |
| Example 189 | 5 | Hydrazine | 50 | 0.1 | 100 | 1000 | 1000 | 0 | 0 | 4.2 | 4.2 |
| Example 190 | 5 | Hydrazine | 50 | 0.1 | 200 | 2000 | 2000 | 0 | 0 | 8.4 | 8.4 |
| Example 191 | 0.1 | Hydrazine | 1 | 0.1 | 1 | 5 | 5 | 0 | 0 | 1.1 | 1.1 |

TABLE 1f-1-continued

| | HA (%) | Type of hydrazines | Content of hydrazines (ppm) | Content of hydrazines (with respect to 100 parts of HA) | Anions (ppm) | | | | | Content of first anions (with respect to 100 parts of HA) | Content of first anions and second anions (with respect to 100 parts of HA) |
|---|---|---|---|---|---|---|---|---|---|---|---|
| | | | | | First anions | | | Second anions | | | |
| | | | | | $Cl^-$ | $NO_2^-$ | $NO_3^-$ | $SO_4^{2-}$ | $PO_4^{3-}$ | | |
| Example 192 | 0.1 | Hydrazine | 1 | 0.1 | 5 | 20 | 50 | 0 | 0 | 7.5 | 7.5 |
| Example 193 | 1 | Hydrazine | 10 | 0.1 | 10 | 50 | 100 | 0 | 0 | 1.6 | 1.6 |
| Example 194 | 1 | Hydrazine | 10 | 0.1 | 100 | 100 | 100 | 0 | 0 | 3 | 3 |
| Example 195 | 5 | Hydrazine | 50 | 0.1 | 100 | 100 | 100 | 0 | 0 | 0.6 | 0.6 |
| Example 196 | 5 | Hydrazine | 50 | 0.1 | 100 | 1000 | 1000 | 0 | 0 | 4.2 | 4.2 |
| Example 197 | 5 | Hydrazine | 50 | 0.1 | 200 | 2000 | 2000 | 0 | 0 | 8.4 | 8.4 |
| Example 198 | 0.1 | Hydrazine | 1 | 0.1 | 1 | 5 | 5 | 0 | 0 | 1.1 | 1.1 |
| Example 199 | 0.1 | Hydrazine | 1 | 0.1 | 5 | 20 | 50 | 0 | 0 | 7.5 | 7.5 |
| Example 200 | 1 | Hydrazine | 10 | 0.1 | 10 | 50 | 100 | 0 | 0 | 1.6 | 1.6 |
| Example 201 | 1 | Hydrazine | 10 | 0.1 | 100 | 100 | 100 | 0 | 0 | 3 | 3 |
| Example 202 | 5 | Hydrazine | 50 | 0.1 | 100 | 100 | 100 | 0 | 0 | 0.6 | 0.6 |
| Example 203 | 5 | Hydrazine | 50 | 0.1 | 100 | 1000 | 1000 | 0 | 0 | 4.2 | 4.2 |
| Example 204 | 5 | Hydrazine | 50 | 0.1 | 200 | 2000 | 2000 | 0 | 0 | 8.4 | 8.4 |

TABLE 1f-2

| | Chelating agent/ Content | Anticorrosive/Content | Organic solvent/ Content | pH | Organic residue removability | Stability | Metal residue removability | Smoothness |
|---|---|---|---|---|---|---|---|---|
| Example 177 | — | 1-Aminobenzotriazole/0.5% | — | 8 | 1 | 1 | 4 | 3 |
| Example 178 | — | 1-Aminobenzotriazole/0.5% | — | 8 | 1 | 1 | 4 | 3 |
| Example 179 | — | 1-Aminobenzotriazole/0.5% | — | 8 | 1 | 1 | 3 | 3 |
| Example 180 | — | 1-Aminobenzotriazole/0.5% | — | 8 | 1 | 1 | 3 | 3 |
| Example 181 | — | 1-Aminobenzotriazole/0.5% | — | 8 | 1 | 1 | 3 | 3 |
| Example 182 | — | 1-Aminobenzotriazole/0.5% | — | 8 | 1 | 1 | 3 | 3 |
| Example 183 | — | 1-Aminobenzotriazole/0.5% | — | 8 | 1 | 1 | 3 | 3 |
| Example 184 | — | 5-Methyl-1H-benzotriazole/ 0.5% | — | 8 | 1 | 1 | 4 | 2 |
| Example 185 | — | 5-Methyl-1H-benzotriazole/ 0.5% | — | 8 | 1 | 1 | 4 | 2 |
| Example 186 | — | 5-Methyl-1H-benzotriazole/ 0.5% | — | 8 | 1 | 1 | 3 | 2 |
| Example 187 | — | 5-Methyl-1H-benzotriazole/ 0.5% | — | 8 | 1 | 1 | 3 | 2 |
| Example 188 | — | 5-Methyl-1H-benzotriazole/ 0.5% | — | 8 | 1 | 1 | 3 | 2 |
| Example 189 | — | 5-Methyl-1H-benzotriazole/ 0.5% | — | 8 | 1 | 1 | 3 | 2 |
| Example 190 | — | 5-Methyl-1H-benzotriazole/ 0.5% | — | 8 | 1 | 1 | 3 | 2 |
| Example 191 | — | Benzotriazole-5-carboxylic acid/0.5% | — | 8 | 1 | 1 | 4 | 4 |
| Example 192 | — | Benzotriazole-5-carboxylic acid/0.5% | — | 8 | 1 | 1 | 4 | 4 |
| Example 193 | — | Benzotriazole-5-carboxylic acid/0.5% | — | 8 | 1 | 1 | 3 | 4 |
| Example 194 | — | Benzotriazole-5-carboxylic acid/0.5% | — | 8 | 1 | 1 | 3 | 4 |
| Example 195 | — | Benzotriazole-5-carboxylic acid/0.5% | — | 8 | 1 | 1 | 3 | 4 |
| Example 196 | — | Benzotriazole-5-carboxylic acid/0.5% | — | 8 | 1 | 1 | 3 | 4 |
| Example 197 | — | Benzotriazole-5-carboxylic acid/0.5% | — | 8 | 1 | 1 | 3 | 4 |
| Example 198 | — | 4-Methylbenzotriazole/0.5% | — | 8 | 1 | 1 | 4 | 4 |
| Example 199 | — | 4-Methylbenzotriazole/0.5% | — | 8 | 1 | 1 | 4 | 4 |
| Example 200 | — | 4-Methylbenzotriazole/0.5% | — | 8 | 1 | 1 | 3 | 4 |
| Example 201 | — | 4-Methylbenzotriazole/0.5% | — | 8 | 1 | 1 | 3 | 4 |
| Example 202 | — | 4-Methylbenzotriazole/0.5% | — | 8 | 1 | 1 | 3 | 4 |
| Example 203 | — | 4-Methylbenzotriazole/0.5% | — | 8 | 1 | 1 | 3 | 4 |
| Example 204 | — | 4-Methylbenzotriazole/0.5% | — | 8 | 1 | 1 | 3 | 4 |

TABLE 1g-1

| | HA (%) | Type of hydrazines | Content of hydrazines (ppm) | Content of hydrazines (with respect to 100 parts of HA) | Anions (ppm) | | | | | Content of first anions (with respect to 100 parts of HA) | Content of first anions and second anions (with respect to 100 parts of HA) |
|---|---|---|---|---|---|---|---|---|---|---|---|
| | | | | | First anions | | | Second anions | | | |
| | | | | | Cl⁻ | NO₂⁻ | NO₃⁻ | SO₄²⁻ | PO₄³⁻ | | |
| Example 205 | 0.1 | Hydrazine | 1 | 0.1 | 1 | 5 | 5 | 0 | 0 | 1.1 | 1.1 |
| Example 206 | 0.1 | Hydrazine | 1 | 0.1 | 5 | 20 | 50 | 0 | 0 | 7.5 | 7.5 |
| Example 207 | 1 | Hydrazine | 10 | 0.1 | 10 | 50 | 100 | 0 | 0 | 1.6 | 1.6 |
| Example 208 | 1 | Hydrazine | 10 | 0.1 | 100 | 100 | 100 | 0 | 0 | 3 | 3 |
| Example 209 | 5 | Hydrazine | 50 | 0.1 | 100 | 100 | 100 | 0 | 0 | 0.6 | 0.6 |
| Example 210 | 5 | Hydrazine | 50 | 0.1 | 100 | 1000 | 1000 | 0 | 0 | 4.2 | 4.2 |
| Example 211 | 5 | Hydrazine | 50 | 0.1 | 200 | 2000 | 2000 | 0 | 0 | 8.4 | 8.4 |
| Example 212 | 0.1 | Hydrazine | 1 | 0.1 | 1 | 5 | 5 | 0 | 0 | 1.1 | 1.1 |
| Example 213 | 0.1 | Hydrazine | 1 | 0.1 | 5 | 20 | 50 | 0 | 0 | 7.5 | 7.5 |
| Example 214 | 1 | Hydrazine | 10 | 0.1 | 10 | 50 | 100 | 0 | 0 | 1.6 | 1.6 |
| Example 215 | 1 | Hydrazine | 10 | 0.1 | 100 | 100 | 100 | 0 | 0 | 3 | 3 |
| Example 216 | 5 | Hydrazine | 50 | 0.1 | 100 | 100 | 100 | 0 | 0 | 0.6 | 0.6 |
| Example 217 | 5 | Hydrazine | 50 | 0.1 | 100 | 1000 | 1000 | 0 | 0 | 4.2 | 4.2 |
| Example 218 | 5 | Hydrazine | 50 | 0.1 | 200 | 2000 | 2000 | 0 | 0 | 8.4 | 8.4 |
| Example 219 | 0.1 | Hydrazine | 1 | 0.1 | 1 | 5 | 5 | 0 | 0 | 1.1 | 1.1 |
| Example 220 | 0.1 | Hydrazine | 1 | 0.1 | 5 | 20 | 50 | 0 | 0 | 7.5 | 7.5 |
| Example 221 | 1 | Hydrazine | 10 | 0.1 | 10 | 50 | 100 | 0 | 0 | 1.6 | 1.6 |
| Example 222 | 1 | Hydrazine | 10 | 0.1 | 100 | 100 | 100 | 0 | 0 | 3 | 3 |
| Example 223 | 5 | Hydrazine | 50 | 0.1 | 100 | 100 | 100 | 0 | 0 | 0.6 | 0.6 |
| Example 224 | 5 | Hydrazine | 50 | 0.1 | 100 | 1000 | 1000 | 0 | 0 | 4.2 | 4.2 |
| Example 225 | 5 | Hydrazine | 50 | 0.1 | 200 | 2000 | 2000 | 0 | 0 | 8.4 | 8.4 |
| Example 226 | 0.1 | Hydrazine | 1 | 0.1 | 1 | 5 | 5 | 0 | 0 | 1.1 | 1.1 |
| Example 227 | 0.1 | Hydrazine | 1 | 0.1 | 5 | 20 | 50 | 0 | 0 | 7.5 | 7.5 |
| Example 228 | 1 | Hydrazine | 10 | 0.1 | 10 | 50 | 100 | 0 | 0 | 1.6 | 1.6 |
| Example 229 | 1 | Hydrazine | 10 | 0.1 | 100 | 100 | 100 | 0 | 0 | 3 | 3 |
| Example 230 | 5 | Hydrazine | 50 | 0.1 | 100 | 100 | 100 | 0 | 0 | 0.6 | 0.6 |
| Example 231 | 5 | Hydrazine | 50 | 0.1 | 100 | 1000 | 1000 | 0 | 0 | 4.2 | 4.2 |
| Example 232 | 5 | Hydrazine | 50 | 0.1 | 200 | 2000 | 2000 | 0 | 0 | 8.4 | 8.4 |

TABLE 1g-2

| | Chelating agent/ Content | Anticorrosive/ Content | Organic solvent/ Content | pH | Organic residue removability | Stability | Metal residue removability | Smoothness |
|---|---|---|---|---|---|---|---|---|
| Example 205 | — | — | Methanol/3% | 8 | 1 | 1 | 4 | 4 |
| Example 206 | — | — | Methanol/3% | 8 | 1 | 1 | 4 | 4 |
| Example 207 | — | — | Methanol/3% | 8 | 1 | 1 | 3 | 4 |
| Example 208 | — | — | Methanol/3% | 8 | 1 | 1 | 3 | 4 |
| Example 209 | — | — | Methanol/3% | 8 | 1 | 1 | 3 | 4 |
| Example 210 | — | — | Methanol/3% | 8 | 1 | 1 | 3 | 4 |
| Example 211 | — | — | Methanol/3% | 8 | 1 | 1 | 3 | 4 |
| Example 212 | — | — | Isopropyl alcohol/3% | 8 | 1 | 1 | 4 | 4 |
| Example 213 | — | — | Isopropyl alcohol/3% | 8 | 1 | 1 | 4 | 4 |
| Example 214 | — | — | Isopropyl alcohol/3% | 8 | 1 | 1 | 3 | 4 |
| Example 215 | — | — | Isopropyl alcohol/3% | 8 | 1 | 1 | 3 | 4 |
| Example 216 | — | — | Isopropyl alcohol/3% | 8 | 1 | 1 | 3 | 4 |
| Example 217 | — | — | Isopropyl alcohol/3% | 8 | 1 | 1 | 3 | 4 |
| Example 218 | — | — | Isopropyl alcohol/3% | 8 | 1 | 1 | 3 | 4 |
| Example 219 | — | — | 1-Butanol/3% | 8 | 1 | 1 | 4 | 4 |
| Example 220 | — | — | 1-Butanol/3% | 8 | 1 | 1 | 4 | 4 |
| Example 221 | — | — | 1-Butanol/3% | 8 | 1 | 1 | 3 | 4 |
| Example 222 | — | — | 1-Butanol/3% | 8 | 1 | 1 | 3 | 4 |

TABLE 1g-2-continued

| | Chelating agent/ Content | Anticorrosive/ Content | Organic solvent/ Content | pH | Organic residue removability | Stability | Metal residue removability | Smoothness |
|---|---|---|---|---|---|---|---|---|
| Example 223 | — | — | 1-Butanol/3% | 8 | 1 | 1 | 3 | 4 |
| Example 224 | — | — | 1-Butanol/3% | 8 | 1 | 1 | 3 | 4 |
| Example 225 | — | — | 1-Butanol/3% | 8 | 1 | 1 | 3 | 4 |
| Example 226 | — | — | 1,3-Propanediol/3% | 8 | 1 | 1 | 4 | 4 |
| Example 227 | — | — | 1,3-Propanediol/3% | 8 | 1 | 1 | 4 | 4 |
| Example 228 | — | — | 1,3-Propanediol/3% | 8 | 1 | 1 | 3 | 4 |
| Example 229 | — | — | 1,3-Propanediol/3% | 8 | 1 | 1 | 3 | 4 |
| Example 230 | — | — | 1,3-Propanediol/3% | 8 | 1 | 1 | 3 | 4 |
| Example 231 | — | — | 1,3-Propanediol/3% | 8 | 1 | 1 | 3 | 4 |
| Example 232 | — | — | 1,3-Propanediol/3% | 8 | 1 | 1 | 3 | 4 |

TABLE 1h-1

| | HA (%) | Type of hydrazines | Content of hydrazines (ppm) | Content of hydrazines (with respect to 100 parts of HA) | Anions (ppm) First anions $Cl^-$ | $NO_2^-$ | $NO_3^-$ | Second anions $SO_4^{2-}$ | $PO_4^{3-}$ | Content of first anions (with respect to 100 parts of HA) | Content of first anions and second anions (with respect to 100 parts of HA) |
|---|---|---|---|---|---|---|---|---|---|---|---|
| Example 233 | 0.1 | Hydrazine | 1 | 0.1 | 1 | 5 | 5 | 0 | 0 | 1.1 | 1.1 |
| Example 234 | 0.1 | Hydrazine | 1 | 0.1 | 5 | 20 | 50 | 0 | 0 | 7.5 | 7.5 |
| Example 235 | 1 | Hydrazine | 10 | 0.1 | 10 | 50 | 100 | 0 | 0 | 1.6 | 1.6 |
| Example 236 | 1 | Hydrazine | 10 | 0.1 | 100 | 100 | 100 | 0 | 0 | 3 | 3 |
| Example 237 | 5 | Hydrazine | 50 | 0.1 | 100 | 100 | 100 | 0 | 0 | 0.6 | 0.6 |
| Example 238 | 5 | Hydrazine | 50 | 0.1 | 100 | 1000 | 1000 | 0 | 0 | 4.2 | 4.2 |
| Example 239 | 5 | Hydrazine | 50 | 0.1 | 200 | 2000 | 2000 | 0 | 0 | 8.4 | 8.4 |
| Example 240 | 0.1 | Hydrazine | 1 | 0.1 | 1 | 5 | 5 | 0 | 0 | 1.1 | 1.1 |
| Example 241 | 0.1 | Hydrazine | 1 | 0.1 | 5 | 20 | 50 | 0 | 0 | 7.5 | 7.5 |
| Example 242 | 1 | Hydrazine | 10 | 0.1 | 10 | 50 | 100 | 0 | 0 | 1.6 | 1.6 |
| Example 243 | 1 | Hydrazine | 10 | 0.1 | 100 | 100 | 100 | 0 | 0 | 3 | 3 |
| Example 244 | 5 | Hydrazine | 50 | 0.1 | 100 | 100 | 100 | 0 | 0 | 0.6 | 0.6 |
| Example 245 | 5 | Hydrazine | 50 | 0.1 | 100 | 1000 | 1000 | 0 | 0 | 4.2 | 4.2 |
| Example 246 | 5 | Hydrazine | 50 | 0.1 | 200 | 2000 | 2000 | 0 | 0 | 8.4 | 8.4 |
| Example 247 | 0.1 | Hydrazine | 1 | 0.1 | 1 | 5 | 5 | 0 | 0 | 1.1 | 1.1 |
| Example 248 | 0.1 | Hydrazine | 1 | 0.1 | 5 | 20 | 50 | 0 | 0 | 7.5 | 7.5 |
| Example 249 | 1 | Hydrazine | 10 | 0.1 | 10 | 50 | 100 | 0 | 0 | 1.6 | 1.6 |
| Example 250 | 1 | Hydrazine | 10 | 0.1 | 100 | 100 | 100 | 0 | 0 | 3 | 3 |
| Example 251 | 5 | Hydrazine | 50 | 0.1 | 100 | 100 | 100 | 0 | 0 | 0.6 | 0.6 |
| Example 252 | 5 | Hydrazine | 50 | 0.1 | 100 | 1000 | 1000 | 0 | 0 | 4.2 | 4.2 |
| Example 253 | 5 | Hydrazine | 50 | 0.1 | 200 | 2000 | 2000 | 0 | 0 | 8.4 | 8.4 |
| Example 254 | 0.1 | Hydrazine | 1 | 0.1 | 1 | 5 | 5 | 0 | 0 | 1.1 | 1.1 |
| Example 255 | 0.1 | Hydrazine | 1 | 0.1 | 5 | 20 | 50 | 0 | 0 | 7.5 | 7.5 |
| Example 256 | 1 | Hydrazine | 10 | 0.1 | 10 | 50 | 100 | 0 | 0 | 1.6 | 1.6 |
| Example 257 | 1 | Hydrazine | 10 | 0.1 | 100 | 100 | 100 | 0 | 0 | 3 | 3 |
| Example 258 | 5 | Hydrazine | 50 | 0.1 | 100 | 100 | 100 | 0 | 0 | 0.6 | 0.6 |
| Example 259 | 5 | Hydrazine | 50 | 0.1 | 100 | 1000 | 1000 | 0 | 0 | 4.2 | 4.2 |
| Example 260 | 5 | Hydrazine | 50 | 0.1 | 200 | 2000 | 2000 | 0 | 0 | 8.4 | 8.4 |

TABLE 1h-2

| | Chelating agent/ Content | Anticorrosive/ Content | Organic solvent/ Content | pH | Organic residue removability | Stability | Metal residue removability | Smoothness |
|---|---|---|---|---|---|---|---|---|
| Example 233 | — | — | Ethylene glycol/3% | 8 | 1 | 1 | 4 | 4 |
| Example 234 | — | — | Ethylene glycol/3% | 8 | 1 | 1 | 4 | 4 |
| Example 235 | — | — | Ethylene glycol/3% | 8 | 1 | 1 | 3 | 4 |
| Example 236 | — | — | Ethylene glycol/3% | 8 | 1 | 1 | 3 | 4 |
| Example 237 | — | — | Ethylene glycol/3% | 8 | 1 | 1 | 3 | 4 |
| Example 238 | — | — | Ethylene glycol/3% | 8 | 1 | 1 | 3 | 4 |
| Example 239 | — | — | Ethylene glycol/3% | 8 | 1 | 1 | 3 | 4 |
| Example 240 | — | — | Propylene glycol/3% | 8 | 1 | 1 | 4 | 4 |
| Example 241 | — | — | Propylene glycol/3% | 8 | 1 | 1 | 4 | 4 |
| Example 242 | — | — | Propylene glycol/3% | 8 | 1 | 1 | 3 | 4 |
| Example 243 | — | — | Propylene glycol/3% | 8 | 1 | 1 | 3 | 4 |
| Example 244 | — | — | Propylene glycol/3% | 8 | 1 | 1 | 3 | 4 |
| Example 245 | — | — | Propylene glycol/3% | 8 | 1 | 1 | 3 | 4 |
| Example 246 | — | — | Propylene glycol/3% | 8 | 1 | 1 | 3 | 4 |
| Example 247 | — | — | Diethylene glycol/3% | 8 | 1 | 1 | 4 | 4 |
| Example 248 | — | — | Diethylene glycol/3% | 8 | 1 | 1 | 4 | 4 |
| Example 249 | — | — | Diethylene glycol/3% | 8 | 1 | 1 | 3 | 4 |
| Example 250 | — | — | Diethylene glycol/3% | 8 | 1 | 1 | 3 | 4 |
| Example 251 | — | — | Diethylene glycol/3% | 8 | 1 | 1 | 3 | 4 |
| Example 252 | — | — | Diethylene glycol/3% | 8 | 1 | 1 | 3 | 4 |
| Example 253 | — | — | Diethylene glycol/3% | 8 | 1 | 1 | 3 | 4 |
| Example 254 | — | — | Dipropylene glycol/3% | 8 | 1 | 1 | 4 | 4 |
| Example 255 | — | — | Dipropylene glycol/3% | 8 | 1 | 1 | 4 | 4 |
| Example 256 | — | — | Dipropylene glycol/3% | 8 | 1 | 1 | 3 | 4 |
| Example 257 | — | — | Dipropylene glycol/3% | 8 | 1 | 1 | 3 | 4 |
| Example 258 | — | — | Dipropylene glycol/3% | 8 | 1 | 1 | 3 | 4 |
| Example 259 | — | — | Dipropylene glycol/3% | 8 | 1 | 1 | 3 | 4 |
| Example 260 | — | — | Dipropylene glycol/3% | 8 | 1 | 1 | 3 | 4 |

TABLE 1i-1

| | HA (%) | Type of hydrazines | Content of hydrazines (ppm) | Content of hydrazines (with respect to 100 parts of HA) | Anions (ppm) | | | | | Content of first anions (with respect to 100 parts of HA) | Content of first anions and second anions (with respect to 100 parts of HA) |
|---|---|---|---|---|---|---|---|---|---|---|---|
| | | | | | First anions | | | Second anions | | | |
| | | | | | $Cl^-$ | $NO_2^-$ | $NO_3^-$ | $SO_4^{2-}$ | $PO_4^{3-}$ | | |
| Example 261 | 0.1 | Hydrazine | 1 | 0.1 | 1 | 5 | 5 | 0 | 0 | 1.1 | 1.1 |
| Example 262 | 0.1 | Hydrazine | 1 | 0.1 | 5 | 20 | 50 | 0 | 0 | 7.5 | 7.5 |
| Example 263 | 1 | Hydrazine | 10 | 0.1 | 10 | 50 | 100 | 0 | 0 | 1.6 | 1.6 |
| Example 264 | 1 | Hydrazine | 10 | 0.1 | 100 | 100 | 100 | 0 | 0 | 3 | 3 |
| Example 265 | 5 | Hydrazine | 50 | 0.1 | 100 | 100 | 100 | 0 | 0 | 0.6 | 0.6 |
| Example 266 | 5 | Hydrazine | 50 | 0.1 | 100 | 1000 | 1000 | 0 | 0 | 4.2 | 4.2 |
| Example 267 | 5 | Hydrazine | 50 | 0.1 | 200 | 2000 | 2000 | 0 | 0 | 8.4 | 8.4 |
| Example 268 | 0.1 | Hydrazine | 1 | 0.1 | 1 | 5 | 5 | 0 | 0 | 1.1 | 1.1 |
| Example 269 | 0.1 | Hydrazine | 1 | 0.1 | 5 | 20 | 50 | 0 | 0 | 7.5 | 7.5 |
| Example 270 | 1 | Hydrazine | 10 | 0.1 | 10 | 50 | 100 | 0 | 0 | 1.6 | 1.6 |
| Example 271 | 1 | Hydrazine | 10 | 0.1 | 100 | 100 | 100 | 0 | 0 | 3 | 3 |
| Example 272 | 5 | Hydrazine | 50 | 0.1 | 100 | 100 | 100 | 0 | 0 | 0.6 | 0.6 |
| Example 273 | 5 | Hydrazine | 50 | 0.1 | 100 | 1000 | 1000 | 0 | 0 | 4.2 | 4.2 |
| Example 274 | 5 | Hydrazine | 50 | 0.1 | 200 | 2000 | 2000 | 0 | 0 | 8.4 | 8.4 |
| Example 275 | 0.1 | Hydrazine | 1 | 0.1 | 1 | 5 | 5 | 0 | 0 | 1.1 | 1.1 |
| Example 276 | 0.1 | Hydrazine | 1 | 0.1 | 5 | 20 | 50 | 0 | 0 | 7.5 | 7.5 |
| Example 277 | 1 | Hydrazine | 10 | 0.1 | 10 | 50 | 100 | 0 | 0 | 1.6 | 1.6 |
| Example 278 | 1 | Hydrazine | 10 | 0.1 | 100 | 100 | 100 | 0 | 0 | 3 | 3 |
| Example 279 | 5 | Hydrazine | 50 | 0.1 | 100 | 100 | 100 | 0 | 0 | 0.6 | 0.6 |
| Example 280 | 5 | Hydrazine | 50 | 0.1 | 100 | 1000 | 1000 | 0 | 0 | 4.2 | 4.2 |
| Example 281 | 5 | Hydrazine | 50 | 0.1 | 200 | 2000 | 2000 | 0 | 0 | 8.4 | 8.4 |
| Example 282 | 0.1 | Hydrazine | 1 | 0.1 | 1 | 5 | 5 | 0 | 0 | 1.1 | 1.1 |
| Example 283 | 0.1 | Hydrazine | 1 | 0.1 | 5 | 20 | 50 | 0 | 0 | 7.5 | 7.5 |
| Example 284 | 1 | Hydrazine | 10 | 0.1 | 10 | 50 | 100 | 0 | 0 | 1.6 | 1.6 |
| Example 285 | 1 | Hydrazine | 10 | 0.1 | 100 | 100 | 100 | 0 | 0 | 3 | 3 |
| Example 286 | 5 | Hydrazine | 50 | 0.1 | 100 | 100 | 100 | 0 | 0 | 0.6 | 0.6 |
| Example 287 | 5 | Hydrazine | 50 | 0.1 | 100 | 1000 | 1000 | 0 | 0 | 4.2 | 4.2 |
| Example 288 | 5 | Hydrazine | 50 | 0.1 | 200 | 2000 | 2000 | 0 | 0 | 8.4 | 8.4 |

TABLE 1i-2

| | Chelating agent/ Content | Anticorrosive/ Content | Organic solvent/ Content | pH | Organic residue removability | Stability | Metal residue removability | Smoothness |
|---|---|---|---|---|---|---|---|---|
| Example 261 | — | — | 3-Methoxy-3-methyl-1-butanol/3% | 8 | 1 | 1 | 4 | 4 |
| Example 262 | — | — | 3-Methoxy-3-methyl-1-butanol/3% | 8 | 1 | 1 | 4 | 4 |
| Example 263 | — | — | 3-Methoxy-3-methyl-1-butanol/3% | 8 | 1 | 1 | 3 | 4 |
| Example 264 | — | — | 3-Methoxy-3-methyl-1-butanol/3% | 8 | 1 | 1 | 3 | 4 |
| Example 265 | — | — | 3-Methoxy-3-methyl-1-butanol/3% | 8 | 1 | 1 | 3 | 4 |
| Example 266 | — | — | 3-Methoxy-3-methyl-1-butanol/3% | 8 | 1 | 1 | 3 | 4 |
| Example 267 | — | — | 3-Methoxy-3-methyl-1-butanol/3% | 8 | 1 | 1 | 3 | 4 |
| Example 268 | — | — | 3-Methoxy-1-butanol/3% | 8 | 1 | 1 | 4 | 4 |
| Example 269 | — | — | 3-Methoxy-1-butanol/3% | 8 | 1 | 1 | 4 | 4 |
| Example 270 | — | — | 3-Methoxy-1-butanol/3% | 8 | 1 | 1 | 3 | 4 |
| Example 271 | — | — | 3-Methoxy-1-butanol/3% | 8 | 1 | 1 | 3 | 4 |
| Example 272 | — | — | 3-Methoxy-1-butanol/3% | 8 | 1 | 1 | 3 | 4 |
| Example 273 | — | — | 3-Methoxy-1-butanol/3% | 8 | 1 | 1 | 3 | 4 |
| Example 274 | — | — | 3-Methoxy-1-butanol/3% | 8 | 1 | 1 | 3 | 4 |
| Example 275 | — | — | 1-Methoxy-2-butanol/3% | 8 | 1 | 1 | 4 | 4 |

TABLE 1i-2-continued

| | Chelating agent/ Content | Anticorrosive/ Content | Organic solvent/ Content | pH | Organic residue removability | Stability | Metal residue removability | Smoothness |
|---|---|---|---|---|---|---|---|---|
| Example 276 | — | — | 1-Methoxy-2-butanol/3% | 8 | 1 | 1 | 4 | 4 |
| Example 277 | — | — | 1-Methoxy-2-butanol/3% | 8 | 1 | 1 | 3 | 4 |
| Example 278 | — | — | 1-Methoxy-2-butanol/3% | 8 | 1 | 1 | 3 | 4 |
| Example 279 | — | — | 1-Methoxy-2-butanol/3% | 8 | 1 | 1 | 3 | 4 |
| Example 280 | — | — | 1-Methoxy-2-butanol/3% | 8 | 1 | 1 | 3 | 4 |
| Example 281 | — | — | 1-Methoxy-2-butanol/3% | 8 | 1 | 1 | 3 | 4 |
| Example 282 | — | — | Ethylene glycol monomethyl ether/3% | 8 | 1 | 1 | 4 | 4 |
| Example 283 | — | — | Ethylene glycol monomethyl ether/3% | 8 | 1 | 1 | 4 | 4 |
| Example 284 | — | — | Ethylene glycol monomethyl ether/3% | 8 | 1 | 1 | 3 | 4 |
| Example 285 | — | — | Ethylene glycol monomethyl ether/3% | 8 | 1 | 1 | 3 | 4 |
| Example 286 | — | — | Ethylene glycol monomethyl ether/3% | 8 | 1 | 1 | 3 | 4 |
| Example 287 | — | — | Ethylene glycol monomethyl ether/3% | 8 | 1 | 1 | 3 | 4 |
| Example 288 | — | — | Ethylene glycol monomethyl ether/3% | 8 | 1 | 1 | 3 | 4 |

TABLE 1j-1

| | HA (%) | Type of hydrazines | Content of hydrazines (ppm) | Content of hydrazines (with respect to 100 parts of HA) | Anions (ppm) First anions Cl$^-$ | NO$_2^-$ | NO$_3^-$ | Second anions SO$_4^{2-}$ | PO$_4^{3-}$ | Content of first anions (with respect to 100 parts of HA) | Content of first anions and second anions (with respect to 100 parts of HA) |
|---|---|---|---|---|---|---|---|---|---|---|---|
| Example 289 | 0.1 | Hydrazine | 1 | 0.1 | 1 | 5 | 5 | 0 | 0 | 1.1 | 1.1 |
| Example 290 | 0.1 | Hydrazine | 1 | 0.1 | 5 | 20 | 50 | 0 | 0 | 7.5 | 7.5 |
| Example 291 | 1 | Hydrazine | 10 | 0.1 | 10 | 50 | 100 | 0 | 0 | 1.6 | 1.6 |
| Example 292 | 1 | Hydrazine | 10 | 0.1 | 100 | 100 | 100 | 0 | 0 | 3 | 3 |
| Example 293 | 5 | Hydrazine | 50 | 0.1 | 100 | 100 | 100 | 0 | 0 | 0.6 | 0.6 |
| Example 294 | 5 | Hydrazine | 50 | 0.1 | 100 | 1000 | 1000 | 0 | 0 | 4.2 | 4.2 |
| Example 295 | 5 | Hydrazine | 50 | 0.1 | 200 | 2000 | 2000 | 0 | 0 | 8.4 | 8.4 |
| Example 296 | 0.1 | Hydrazine | 1 | 0.1 | 1 | 5 | 5 | 0 | 0 | 1.1 | 1.1 |
| Example 297 | 0.1 | Hydrazine | 1 | 0.1 | 5 | 20 | 50 | 0 | 0 | 7.5 | 7.5 |
| Example 298 | 1 | Hydrazine | 10 | 0.1 | 10 | 50 | 100 | 0 | 0 | 1.6 | 1.6 |
| Example 299 | 1 | Hydrazine | 10 | 0.1 | 100 | 100 | 100 | 0 | 0 | 3 | 3 |
| Example 300 | 5 | Hydrazine | 50 | 0.1 | 100 | 100 | 100 | 0 | 0 | 0.6 | 0.6 |
| Example 301 | 5 | Hydrazine | 50 | 0.1 | 100 | 1000 | 1000 | 0 | 0 | 4.2 | 4.2 |
| Example 302 | 5 | Hydrazine | 50 | 0.1 | 200 | 2000 | 2000 | 0 | 0 | 8.4 | 8.4 |
| Example 303 | 0.1 | Hydrazine | 1 | 0.1 | 1 | 5 | 5 | 0 | 0 | 1.1 | 1.1 |
| Example 304 | 0.1 | Hydrazine | 1 | 0.1 | 5 | 20 | 50 | 0 | 0 | 7.5 | 7.5 |
| Example 305 | 1 | Hydrazine | 10 | 0.1 | 10 | 50 | 100 | 0 | 0 | 1.6 | 1.6 |
| Example 306 | 1 | Hydrazine | 10 | 0.1 | 100 | 100 | 100 | 0 | 0 | 3 | 3 |
| Example 307 | 5 | Hydrazine | 50 | 0.1 | 100 | 100 | 100 | 0 | 0 | 0.6 | 0.6 |
| Example 308 | 5 | Hydrazine | 50 | 0.1 | 100 | 1000 | 1000 | 0 | 0 | 4.2 | 4.2 |
| Example 309 | 5 | Hydrazine | 50 | 0.1 | 200 | 2000 | 2000 | 0 | 0 | 8.4 | 8.4 |
| Example 310 | 0.1 | Hydrazine | 1 | 0.1 | 1 | 5 | 5 | 0 | 0 | 1.1 | 1.1 |
| Example 311 | 0.1 | Hydrazine | 1 | 0.1 | 5 | 20 | 50 | 0 | 0 | 7.5 | 7.5 |
| Example 312 | 1 | Hydrazine | 10 | 0.1 | 10 | 50 | 100 | 0 | 0 | 1.6 | 1.6 |
| Example 313 | 1 | Hydrazine | 10 | 0.1 | 100 | 100 | 100 | 0 | 0 | 3 | 3 |
| Example 314 | 5 | Hydrazine | 50 | 0.1 | 100 | 100 | 100 | 0 | 0 | 0.6 | 0.6 |
| Example 315 | 5 | Hydrazine | 50 | 0.1 | 100 | 1000 | 1000 | 0 | 0 | 4.2 | 4.2 |
| Example 316 | 5 | Hydrazine | 50 | 0.1 | 200 | 2000 | 2000 | 0 | 0 | 8.4 | 8.4 |

TABLE 1j-2

| | Chelating agent/ Content | Anticorrosive/ Content | Organic solvent/ Content | pH | Organic residue removability | Stability | Metal residue removability | Smoothness |
|---|---|---|---|---|---|---|---|---|
| Example 289 | — | — | Ethylene glycol monoethyl ether/3% | 8 | 1 | 1 | 4 | 4 |
| Example 290 | — | — | Ethylene glycol monoethyl ether/3% | 8 | 1 | 1 | 4 | 4 |
| Example 291 | — | — | Ethylene glycol monoethyl ether/3% | 8 | 1 | 1 | 3 | 4 |
| Example 292 | — | — | Ethylene glycol monoethyl ether/3% | 8 | 1 | 1 | 3 | 4 |
| Example 293 | — | — | Ethylene glycol monoethyl ether/3% | 8 | 1 | 1 | 3 | 4 |
| Example 294 | — | — | Ethylene glycol monoethyl ether/3% | 8 | 1 | 1 | 3 | 4 |
| Example 295 | — | — | Ethylene glycol monoethyl ether/3% | 8 | 1 | 1 | 3 | 4 |
| Example 296 | — | — | Ethylene glycol monobutyl ether/3% | 8 | 1 | 1 | 4 | 3 |
| Example 297 | — | — | Ethylene glycol monobutyl ether/3% | 8 | 1 | 1 | 4 | 3 |
| Example 298 | — | — | Ethylene glycol monobutyl ether/3% | 8 | 1 | 1 | 3 | 3 |
| Example 299 | — | — | Ethylene glycol monobutyl ether/3% | 8 | 1 | 1 | 3 | 3 |
| Example 300 | — | — | Ethylene glycol monobutyl ether/3% | 8 | 1 | 1 | 3 | 3 |
| Example 301 | — | — | Ethylene glycol monobutyl ether/3% | 8 | 1 | 1 | 3 | 3 |
| Example 302 | — | — | Ethylene glycol monobutyl ether/3% | 8 | 1 | 1 | 3 | 3 |
| Example 303 | — | — | Diethylene glycol monomethyl ether/3% | 8 | 1 | 1 | 4 | 4 |
| Example 304 | — | — | Diethylene glycol monomethyl ether/3% | 8 | 1 | 1 | 4 | 4 |
| Example 305 | — | — | Diethylene glycol monomethyl ether/3% | 8 | 1 | 1 | 3 | 4 |
| Example 306 | — | — | Diethylene glycol monomethyl ether/3% | 8 | 1 | 1 | 3 | 4 |
| Example 307 | — | — | Diethylene glycol monomethyl ether/3% | 8 | 1 | 1 | 3 | 4 |
| Example 308 | — | — | Diethylene glycol monomethyl ether/3% | 8 | 1 | 1 | 3 | 4 |
| Example 309 | — | — | Diethylene glycol monomethyl ether/3% | 8 | 1 | 1 | 3 | 4 |
| Example 310 | — | — | Diethylene glycol monobutyl ether/3% | 8 | 1 | 1 | 4 | 4 |
| Example 311 | — | — | Diethylene glycol monobutyl ether/3% | 8 | 1 | 1 | 4 | 4 |
| Example 312 | — | — | Diethylene glycol monobutyl ether/3% | 8 | 1 | 1 | 3 | 4 |
| Example 313 | — | — | Diethylene glycol monobutyl ether/3% | 8 | 1 | 1 | 3 | 4 |
| Example 314 | — | — | Diethylene glycol monobutyl ether/3% | 8 | 1 | 1 | 3 | 4 |
| Example 315 | — | — | Diethylene glycol monobutyl ether/3% | 8 | 1 | 1 | 3 | 4 |
| Example 316 | — | — | Diethylene glycol monobutyl ether/3% | 8 | 1 | 1 | 3 | 4 |

TABLE 1j-2

| | Chelating agent/ Content | Anticorrosive/ Content | Organic solvent/ Content | pH | Organic residue removability | Stability | Metal residue removability | Smoothness |
|---|---|---|---|---|---|---|---|---|
| Example 289 | — | — | Ethylene glycol monoethyl ether/3% | 8 | 1 | 1 | 4 | 4 |
| Example 290 | — | — | Ethylene glycol monoethyl ether/3% | 8 | 1 | 1 | 4 | 4 |
| Example 291 | — | — | Ethylene glycol monoethyl ether/3% | 8 | 1 | 1 | 3 | 4 |
| Example 292 | — | — | Ethylene glycol monoethyl ether/3% | 8 | 1 | 1 | 3 | 4 |
| Example 293 | — | — | Ethylene glycol monoethyl ether/3% | 8 | 1 | 1 | 3 | 4 |

TABLE 1j-2-continued

| | Chelating agent/ Content | Anticorrosive/ Content | Organic solvent/ Content | pH | Organic residue removability | Stability | Metal residue removability | Smoothness |
|---|---|---|---|---|---|---|---|---|
| Example 294 | — | — | Ethylene glycol monoethyl ether/3% | 8 | 1 | 1 | 3 | 4 |
| Example 295 | — | — | Ethylene glycol monoethyl ether/3% | 8 | 1 | 1 | 3 | 4 |
| Example 296 | — | — | Ethylene glycol monobutyl ether/3% | 8 | 1 | 1 | 4 | 3 |
| Example 297 | — | — | Ethylene glycol monobutyl ether/3% | 8 | 1 | 1 | 4 | 3 |
| Example 298 | — | — | Ethylene glycol monobutyl ether/3% | 8 | 1 | 1 | 3 | 3 |
| Example 299 | — | — | Ethylene glycol monobutyl ether/3% | 8 | 1 | 1 | 3 | 3 |
| Example 300 | — | — | Ethylene glycol monobutyl ether/3% | 8 | 1 | 1 | 3 | 3 |
| Example 301 | — | — | Ethylene glycol monobutyl ether/3% | 8 | 1 | 1 | 3 | 3 |
| Example 302 | — | — | Ethylene glycol monobutyl ether/3% | 8 | 1 | 1 | 3 | 3 |
| Example 303 | — | — | Diethylene glycol monomethyl ether/3% | 8 | 1 | 1 | 4 | 4 |
| Example 304 | — | — | Diethylene glycol monomethyl ether/3% | 8 | 1 | 1 | 4 | 4 |
| Example 305 | — | — | Diethylene glycol monomethyl ether/3% | 8 | 1 | 1 | 3 | 4 |
| Example 306 | — | — | Diethylene glycol monomethyl ether/3% | 8 | 1 | 1 | 3 | 4 |
| Example 307 | — | — | Diethylene glycol monomethyl ether/3% | 8 | 1 | 1 | 3 | 4 |
| Example 308 | — | — | Diethylene glycol monomethyl ether/3% | 8 | 1 | 1 | 3 | 4 |
| Example 309 | — | — | Diethylene glycol monomethyl ether/3% | 8 | 1 | 1 | 3 | 4 |
| Example 310 | — | — | Diethylene glycol monobutyl ether/3% | 8 | 1 | 1 | 4 | 4 |
| Example 311 | — | — | Diethylene glycol monobutyl ether/3% | 8 | 1 | 1 | 4 | 4 |
| Example 312 | — | — | Diethylene glycol monobutyl ether/3% | 8 | 1 | 1 | 3 | 4 |
| Example 313 | — | — | Diethylene glycol monobutyl ether/3% | 8 | 1 | 1 | 3 | 4 |
| Example 314 | — | — | Diethylene glycol monobutyl ether/3% | 8 | 1 | 1 | 3 | 4 |
| Example 315 | — | — | Diethylene glycol monobutyl ether/3% | 8 | 1 | 1 | 3 | 4 |
| Example 316 | — | — | Diethylene glycol monobutyl ether/3% | 8 | 1 | 1 | 3 | 4 |

TABLE 1k-2

| | Chelating agent/ Content | Anticorrosive/ Content | Organic solvent/ Content | pH | Organic residue removability | Stability | Metal residue removability | Smoothness |
|---|---|---|---|---|---|---|---|---|
| Example 317 | — | — | Triethylene glycol monomethyl ether/3% | 8 | 1 | 1 | 4 | 4 |
| Example 318 | — | — | Triethylene glycol monomethyl ether/3% | 8 | 1 | 1 | 4 | 4 |
| Example 319 | — | — | Triethylene glycol monomethyl ether/3% | 8 | 1 | 1 | 3 | 4 |
| Example 320 | — | — | Triethylene glycol monomethyl ether/3% | 8 | 1 | 1 | 3 | 4 |
| Example 321 | — | — | Triethylene glycol monomethyl ether/3% | 8 | 1 | 1 | 3 | 4 |
| Example 322 | — | — | Triethylene glycol monomethyl ether/3% | 8 | 1 | 1 | 3 | 4 |
| Example 323 | — | — | Triethylene glycol monomethyl ether/3% | 8 | 1 | 1 | 3 | 4 |
| Example 324 | — | — | 1-Methoxy-2-propanol/ 3% | 8 | 1 | 1 | 4 | 4 |

TABLE 1k-2-continued

| | Chelating agent/ Content | Anticorrosive/ Content | Organic solvent/ Content | pH | Organic residue removability | Stability | Metal residue removability | Smoothness |
|---|---|---|---|---|---|---|---|---|
| Example 325 | — | — | 1-Methoxy-2-propanol/3% | 8 | 1 | 1 | 4 | 4 |
| Example 326 | — | — | 1-Methoxy-2-propanol/3% | 8 | 1 | 1 | 3 | 4 |
| Example 327 | — | — | 1-Methoxy-2-propanol/3% | 8 | 1 | 1 | 3 | 4 |
| Example 328 | — | — | 1-Methoxy-2-propanol/3% | 8 | 1 | 1 | 3 | 4 |
| Example 329 | — | — | 1-Methoxy-2-propanol/3% | 8 | 1 | 1 | 3 | 4 |
| Example 330 | — | — | 1-Methoxy-2-propanol/3% | 8 | 1 | 1 | 3 | 4 |
| Example 331 | — | — | Acetone/3% | 8 | 1 | 1 | 4 | 4 |
| Example 332 | — | — | Acetone/3% | 8 | 1 | 1 | 4 | 4 |
| Example 333 | — | — | Acetone/3% | 8 | 1 | 1 | 3 | 4 |
| Example 334 | — | — | Acetone/3% | 8 | 1 | 1 | 3 | 4 |
| Example 335 | — | — | Acetone/3% | 8 | 1 | 1 | 3 | 4 |
| Example 336 | — | — | Acetone/3% | 8 | 1 | 1 | 3 | 4 |
| Example 337 | — | — | Acetone/3% | 8 | 1 | 1 | 3 | 4 |
| Example 338 | — | — | Cyclohexanone/3% | 8 | 1 | 1 | 4 | 4 |
| Example 339 | — | — | Cyclohexanone/3% | 8 | 1 | 1 | 4 | 4 |
| Example 340 | — | — | Cyclohexanone/3% | 8 | 1 | 1 | 3 | 4 |
| Example 341 | — | — | Cyclohexanone/3% | 8 | 1 | 1 | 3 | 4 |
| Example 342 | — | — | Cyclohexanone/3% | 8 | 1 | 1 | 3 | 4 |
| Example 343 | — | — | Cyclohexanone/3% | 8 | 1 | 1 | 3 | 4 |
| Example 344 | — | — | Cyclohexanone/3% | 8 | 1 | 1 | 3 | 4 |

TABLE 1l-1

| | HA (%) | Type of hydrazines | Content of hydrazines (ppm) | Content of hydrazines (with respect to 100 parts of HA) | Anions (ppm) First anions Cl$^-$ | NO$_2^-$ | NO$_3^-$ | Second anions SO$_4^{2-}$ | PO$_4^{3-}$ | Content of first anions (with respect to 100 parts of HA) | Content of first anions and second anions (with respect to 100 parts of HA) |
|---|---|---|---|---|---|---|---|---|---|---|---|
| Example 345 | 0.1 | Hydrazine | 1 | 0.1 | 1 | 5 | 5 | 0 | 0 | 1.1 | 1.1 |
| Example 346 | 0.1 | Hydrazine | 1 | 0.1 | 5 | 20 | 50 | 0 | 0 | 7.5 | 7.5 |
| Example 347 | 1 | Hydrazine | 10 | 0.1 | 10 | 50 | 100 | 0 | 0 | 1.6 | 1.6 |
| Example 348 | 1 | Hydrazine | 10 | 0.1 | 100 | 100 | 100 | 0 | 0 | 3 | 3 |
| Example 349 | 5 | Hydrazine | 50 | 0.1 | 100 | 100 | 100 | 0 | 0 | 0.6 | 0.6 |
| Example 350 | 5 | Hydrazine | 50 | 0.1 | 100 | 1000 | 1000 | 0 | 0 | 4.2 | 4.2 |
| Example 351 | 5 | Hydrazine | 50 | 0.1 | 200 | 2000 | 2000 | 0 | 0 | 8.4 | 8.4 |
| Example 352 | 0.1 | Hydrazine | 1 | 0.1 | 1 | 5 | 5 | 0 | 0 | 1.1 | 1.1 |
| Example 353 | 0.1 | Hydrazine | 1 | 0.1 | 5 | 20 | 50 | 0 | 0 | 7.5 | 7.5 |
| Example 354 | 1 | Hydrazine | 10 | 0.1 | 10 | 50 | 100 | 0 | 0 | 1.6 | 1.6 |
| Example 355 | 1 | Hydrazine | 10 | 0.1 | 100 | 100 | 100 | 0 | 0 | 3 | 3 |
| Example 356 | 5 | Hydrazine | 50 | 0.1 | 100 | 100 | 100 | 0 | 0 | 0.6 | 0.6 |
| Example 357 | 5 | Hydrazine | 50 | 0.1 | 100 | 1000 | 1000 | 0 | 0 | 4.2 | 4.2 |
| Example 358 | 5 | Hydrazine | 50 | 0.1 | 200 | 2000 | 2000 | 0 | 0 | 8.4 | 8.4 |
| Example 359 | 0.1 | Hydrazine | 1 | 0.1 | 1 | 5 | 5 | 0 | 0 | 1.1 | 1.1 |
| Example 360 | 0.1 | Hydrazine | 1 | 0.1 | 5 | 20 | 50 | 0 | 0 | 7.5 | 7.5 |
| Example 361 | 1 | Hydrazine | 10 | 0.1 | 10 | 50 | 100 | 0 | 0 | 1.6 | 1.6 |
| Example 362 | 1 | Hydrazine | 10 | 0.1 | 100 | 100 | 100 | 0 | 0 | 3 | 3 |
| Example 363 | 5 | Hydrazine | 50 | 0.1 | 100 | 100 | 100 | 0 | 0 | 0.6 | 0.6 |
| Example 364 | 5 | Hydrazine | 50 | 0.1 | 100 | 1000 | 1000 | 0 | 0 | 4.2 | 4.2 |
| Example 365 | 5 | Hydrazine | 50 | 0.1 | 200 | 2000 | 2000 | 0 | 0 | 8.4 | 8.4 |
| Example 366 | 0.1 | Hydrazine | 1 | 0.1 | 1 | 5 | 5 | 0 | 0 | 1.1 | 1.1 |
| Example 367 | 0.1 | Hydrazine | 1 | 0.1 | 5 | 20 | 50 | 0 | 0 | 7.5 | 7.5 |
| Example 368 | 1 | Hydrazine | 10 | 0.1 | 10 | 50 | 100 | 0 | 0 | 1.6 | 1.6 |
| Example 369 | 1 | Hydrazine | 10 | 0.1 | 100 | 100 | 100 | 0 | 0 | 3 | 3 |
| Example 370 | 5 | Hydrazine | 50 | 0.1 | 100 | 100 | 100 | 0 | 0 | 0.6 | 0.6 |
| Example 371 | 5 | Hydrazine | 50 | 0.1 | 100 | 1000 | 1000 | 0 | 0 | 4.2 | 4.2 |
| Example 372 | 5 | Hydrazine | 50 | 0.1 | 200 | 2000 | 2000 | 0 | 0 | 8.4 | 8.4 |

TABLE 1l-2

| | Chelating agent/ Content | Anticorrosive/ Content | Organic solvent/ Content | pH | Organic residue removability | Stability | Metal residue removability | Smoothness |
|---|---|---|---|---|---|---|---|---|
| Example 345 | — | — | 2-Butanone/3% | 8 | 1 | 1 | 4 | 4 |
| Example 346 | — | — | 2-Butanone/3% | 8 | 1 | 1 | 4 | 4 |
| Example 347 | — | — | 2-Butanone/3% | 8 | 1 | 1 | 3 | 4 |
| Example 348 | — | — | 2-Butanone/3% | 8 | 1 | 1 | 3 | 4 |
| Example 349 | — | — | 2-Butanone/3% | 8 | 1 | 1 | 3 | 4 |
| Example 350 | — | — | 2-Butanone/3% | 8 | 1 | 1 | 3 | 4 |
| Example 351 | — | — | 2-Butanone/3% | 8 | 1 | 1 | 3 | 4 |
| Example 352 | — | — | Ethyl acetate/3% | 8 | 1 | 1 | 4 | 4 |
| Example 353 | — | — | Ethyl acetate/3% | 8 | 1 | 1 | 4 | 4 |
| Example 354 | — | — | Ethyl acetate/3% | 8 | 1 | 1 | 3 | 4 |
| Example 355 | — | — | Ethyl acetate/3% | 8 | 1 | 1 | 3 | 4 |
| Example 356 | — | — | Ethyl acetate/3% | 8 | 1 | 1 | 3 | 4 |
| Example 357 | — | — | Ethyl acetate/3% | 8 | 1 | 1 | 3 | 4 |
| Example 358 | — | — | Ethyl acetate/3% | 8 | 1 | 1 | 3 | 4 |
| Example 359 | — | — | Butyl acetate/3% | 8 | 1 | 1 | 4 | 4 |
| Example 360 | — | — | Butyl acetate/3% | 8 | 1 | 1 | 4 | 4 |
| Example 361 | — | — | Butyl acetate/3% | 8 | 1 | 1 | 3 | 4 |
| Example 362 | — | — | Butyl acetate/3% | 8 | 1 | 1 | 3 | 4 |
| Example 363 | — | — | Butyl acetate/3% | 8 | 1 | 1 | 3 | 4 |
| Example 364 | — | — | Butyl acetate/3% | 8 | 1 | 1 | 3 | 4 |
| Example 365 | — | — | Butyl acetate/3% | 8 | 1 | 1 | 3 | 4 |
| Example 366 | — | — | Propylene glycol monomethyl ether acetate/3% | 8 | 1 | 1 | 4 | 4 |
| Example 367 | — | — | Propylene glycol monomethyl ether acetate/3% | 8 | 1 | 1 | 4 | 4 |
| Example 368 | — | — | Propylene glycol monomethyl ether acetate/3% | 8 | 1 | 1 | 3 | 4 |
| Example 369 | — | — | Propylene glycol monomethyl ether acetate/3% | 8 | 1 | 1 | 3 | 4 |
| Example 370 | — | — | Propylene glycol monomethyl ether acetate/3% | 8 | 1 | 1 | 3 | 4 |
| Example 371 | — | — | Propylene glycol monomethyl ether acetate/3% | 8 | 1 | 1 | 3 | 4 |
| Example 372 | — | — | Propylene glycol monomethyl ether acetate/3% | 8 | 1 | 1 | 3 | 4 |

TABLE 1m-1

| | HA (%) | Type of hydrazines | Content of hydrazines (ppm) | Content of hydrazines (with respect to 100 parts of HA) | Anions (ppm) First anions Cl$^-$ | NO$_2^-$ | NO$_3^-$ | Second anions SO$_4^{2-}$ | PO$_4^{3-}$ | Content of first anions (with respect to 100 parts of HA) | Content of first anions and second anions (with respect to 100 parts of HA) |
|---|---|---|---|---|---|---|---|---|---|---|---|
| Example 373 | 0.1 | Hydrazine | 1 | 0.1 | 1 | 5 | 5 | 0 | 0 | 1.1 | 1.1 |
| Example 374 | 0.1 | Hydrazine | 1 | 0.1 | 5 | 20 | 50 | 0 | 0 | 7.5 | 7.5 |
| Example 375 | 1 | Hydrazine | 10 | 0.1 | 10 | 50 | 100 | 0 | 0 | 1.6 | 1.6 |
| Example 376 | 1 | Hydrazine | 10 | 0.1 | 100 | 100 | 100 | 0 | 0 | 3 | 3 |
| Example 377 | 5 | Hydrazine | 50 | 0.1 | 100 | 100 | 100 | 0 | 0 | 0.6 | 0.6 |
| Example 378 | 5 | Hydrazine | 50 | 0.1 | 100 | 1000 | 1000 | 0 | 0 | 4.2 | 4.2 |
| Example 379 | 5 | Hydrazine | 50 | 0.1 | 200 | 2000 | 2000 | 0 | 0 | 8.4 | 8.4 |
| Example 380 | 0.1 | Hydrazine | 1 | 0.1 | 1 | 5 | 5 | 0 | 0 | 1.1 | 1.1 |
| Example 381 | 0.1 | Hydrazine | 1 | 0.1 | 5 | 20 | 50 | 0 | 0 | 7.5 | 7.5 |
| Example 382 | 1 | Hydrazine | 10 | 0.1 | 10 | 50 | 100 | 0 | 0 | 1.6 | 1.6 |
| Example 383 | 1 | Hydrazine | 10 | 0.1 | 100 | 100 | 100 | 0 | 0 | 3 | 3 |
| Example 384 | 5 | Hydrazine | 50 | 0.1 | 100 | 100 | 100 | 0 | 0 | 0.6 | 0.6 |
| Example 385 | 5 | Hydrazine | 50 | 0.1 | 100 | 1000 | 1000 | 0 | 0 | 4.2 | 4.2 |
| Example 386 | 5 | Hydrazine | 50 | 0.1 | 200 | 2000 | 2000 | 0 | 0 | 8.4 | 8.4 |
| Example 387 | 0.1 | Hydrazine | 1 | 0.1 | 1 | 5 | 5 | 0 | 0 | 1.1 | 1.1 |

TABLE 1m-1-continued

| | HA (%) | Type of hydrazines | Content of hydrazines (ppm) | Content of hydrazines (with respect to 100 parts of HA) | Anions (ppm) | | | | | Content of first anions (with respect to 100 parts of HA) | Content of first anions and second anions (with respect to 100 parts of HA) |
|---|---|---|---|---|---|---|---|---|---|---|---|
| | | | | | First anions | | | Second anions | | | |
| | | | | | Cl⁻ | NO₂⁻ | NO₃⁻ | SO₄²⁻ | PO₄³⁻ | | |
| Example 388 | 0.1 | Hydrazine | 1 | 0.1 | 5 | 20 | 50 | 0 | 0 | 7.5 | 7.5 |
| Example 389 | 1 | Hydrazine | 10 | 0.1 | 10 | 50 | 100 | 0 | 0 | 1.6 | 1.6 |
| Example 390 | 1 | Hydrazine | 10 | 0.1 | 100 | 100 | 100 | 0 | 0 | 3 | 3 |
| Example 391 | 5 | Hydrazine | 50 | 0.1 | 100 | 100 | 100 | 0 | 0 | 0.6 | 0.6 |
| Example 392 | 5 | Hydrazine | 50 | 0.1 | 100 | 1000 | 1000 | 0 | 0 | 4.2 | 4.2 |
| Example 393 | 5 | Hydrazine | 50 | 0.1 | 200 | 2000 | 2000 | 0 | 0 | 8.4 | 8.4 |

TABLE 1m-2

| | Chelating agent/Content | Anticorrosive/Content | Organic solvent/Content | pH | Organic residue removability | Stability | Metal residue removability | Smoothness |
|---|---|---|---|---|---|---|---|---|
| Example 373 | Diethylenetriaminepentaacetic acid/1% | 5-Methyl-1H-benzotriazole/0.5% | — | 8 | 1 | 1 | 2 | 2 |
| Example 374 | Diethylenetriaminepentaacetic acid/1% | 5-Methyl-1H-benzotriazole/0.5% | — | 8 | 1 | 1 | 2 | 2 |
| Example 375 | Diethylenetriaminepentaacetic acid/1% | 5-Methyl-1H-benzotriazole/0.5% | — | 8 | 1 | 1 | 1 | 2 |
| Example 376 | Diethylenetriaminepentaacetic acid/1% | 5-Methyl-1H-benzotriazole/0.5% | — | 8 | 1 | 1 | 1 | 2 |
| Example 377 | Diethylenetriaminepentaacetic acid/1% | 5-Methyl-1H-benzotriazole/0.5% | — | 8 | 1 | 1 | 1 | 2 |
| Example 378 | Diethylenetriaminepentaacetic acid/1% | 5-Methyl-1H-benzotriazole/0.5% | — | 8 | 1 | 1 | 1 | 2 |
| Example 379 | Diethylenetriaminepentaacetic acid/1% | 5-Methyl-1H-benzotriazole/0.5% | — | 8 | 1 | 1 | 1 | 2 |
| Example 380 | Diethylenetriaminepentaacetic acid/1% | — | Ethylene glycol monobutyl ether/3% | 8 | 1 | 1 | 2 | 3 |
| Example 381 | Diethylenetriaminepentaacetic acid/1% | — | Ethylene glycol monobutyl ether/3% | 8 | 1 | 1 | 2 | 3 |
| Example 382 | Diethylenetriaminepentaacetic acid/1% | — | Ethylene glycol monobutyl ether/3% | 8 | 1 | 1 | 1 | 3 |
| Example 383 | Diethylenetriaminepentaacetic acid/1% | — | Ethylene glycol monobutyl ether/3% | 8 | 1 | 1 | 1 | 3 |
| Example 384 | Diethylenetriaminepentaacetic acid/1% | — | Ethylene glycol monobutyl ether/3% | 8 | 1 | 1 | 1 | 3 |
| Example 385 | Diethylenetriaminepentaacetic acid/1% | — | Ethylene glycol monobutyl ether/3% | 8 | 1 | 1 | 1 | 3 |
| Example 386 | Diethylenetriaminepentaacetic acid/1% | — | Ethylene glycol monobutyl ether/3% | 8 | 1 | 1 | 1 | 3 |
| Example 387 | — | 5-Methyl-1H-benzotriazole/0.5% | Ethylene glycol monobutyl ether/3% | 8 | 1 | 1 | 3 | 1 |
| Example 388 | — | 5-Methyl-1H-benzotriazole/0.5% | Ethylene glycol monobutyl ether/3% | 8 | 1 | 1 | 3 | 1 |
| Example 389 | — | 5-Methyl-1H-benzotriazole/0.5% | Ethylene glycol monobutyl ether/3% | 8 | 1 | 1 | 2 | 1 |
| Example 390 | — | 5-Methyl-1H-benzotriazole/0.5% | Ethylene glycol monobutyl ether/3% | 8 | 1 | 1 | 2 | 1 |
| Example 391 | — | 5-Methyl-1H-benzotriazole/0.5% | Ethylene glycol monobutyl ether/3% | 8 | 1 | 1 | 2 | 1 |
| Example 392 | — | 5-Methyl-1H-benzotriazole/0.5% | Ethylene glycol monobutyl ether/3% | 8 | 1 | 1 | 2 | 1 |
| Example 393 | — | 5-Methyl-1H-benzotriazole/0.5% | Ethylene glycol monobutyl ether/3% | 8 | 1 | 1 | 2 | 1 |

TABLE 1m-2

| | Chelating agent/Content | Anticorrosive/Content | Organic solvent/Content | pH | Organic residue removability | Stability | Metal residue removability | Smoothness |
|---|---|---|---|---|---|---|---|---|
| Example 373 | Diethylenetriaminepentaacetic acid/1% | 5-Methyl-1H-benzotriazole/0.5% | — | 8 | 1 | 1 | 2 | 2 |
| Example 374 | Diethylenetriaminepentaacetic acid/1% | 5-Methyl-1H-benzotriazole/0.5% | — | 8 | 1 | 1 | 2 | 2 |
| Example 375 | Diethylenetriaminepentaacetic acid/1% | 5-Methyl-1H-benzotriazole/0.5% | — | 8 | 1 | 1 | 1 | 2 |
| Example 376 | Diethylenetriaminepentaacetic acid/1% | 5-Methyl-1H-benzotriazole/0.5% | — | 8 | 1 | 1 | 1 | 2 |
| Example 377 | Diethylenetriaminepentaacetic acid/1% | 5-Methyl-1H-benzotriazole/0.5% | — | 8 | 1 | 1 | 1 | 2 |
| Example 378 | Diethylenetriaminepentaacetic acid/1% | 5-Methyl-1H-benzotriazole/0.5% | — | 8 | 1 | 1 | 1 | 2 |
| Example 379 | Diethylenetriaminepentaacetic acid/1% | 5-Methyl-1H-benzotriazole/0.5% | — | 8 | 1 | 1 | 1 | 2 |
| Example 380 | Diethylenetriaminepentaacetic acid/1% | — | Ethylene glycol monobutyl ether/3% | 8 | 1 | 1 | 2 | 3 |
| Example 381 | Diethylenetriaminepentaacetic acid/1% | — | Ethylene glycol monobutyl ether/3% | 8 | 1 | 1 | 2 | 3 |
| Example 382 | Diethylenetriaminepentaacetic acid/1% | — | Ethylene glycol monobutyl ether/3% | 8 | 1 | 1 | 1 | 3 |
| Example 383 | Diethylenetriaminepentaacetic acid/1% | — | Ethylene glycol monobutyl ether/3% | 8 | 1 | 1 | 1 | 3 |
| Example 384 | Diethylenetriaminepentaacetic acid/1% | — | Ethylene glycol monobutyl ether/3% | 8 | 1 | 1 | 1 | 3 |
| Example 385 | Diethylenetriaminepentaacetic acid/1% | — | Ethylene glycol monobutyl ether/3% | 8 | 1 | 1 | 1 | 3 |
| Example 386 | Diethylenetriaminepentaacetic acid/1% | — | Ethylene glycol monobutyl ether/3% | 8 | 1 | 1 | 1 | 3 |
| Example 387 | — | 5-Methyl-1H-benzotriazole/0.5% | Ethylene glycol monobutyl ether/3% | 8 | 1 | 1 | 3 | 1 |
| Example 388 | — | 5-Methyl-1H-benzotriazole/0.5% | Ethylene glycol monobutyl ether/3% | 8 | 1 | 1 | 3 | 1 |
| Example 389 | — | 5-Methyl-1H-benzotriazole/0.5% | Ethylene glycol monobutyl ether/3% | 8 | 1 | 1 | 2 | 1 |
| Example 390 | — | 5-Methyl-1H-benzotriazole/0.5% | Ethylene glycol monobutyl ether/3% | 8 | 1 | 1 | 2 | 1 |
| Example 391 | — | 5-Methyl-1H-benzotriazole/0.5% | Ethylene glycol monobutyl ether/3% | 8 | 1 | 1 | 2 | 1 |
| Example 392 | — | 5-Methyl-1H-benzotriazole/0.5% | Ethylene glycol monobutyl ether/3% | 8 | 1 | 1 | 2 | 1 |
| Example 393 | — | 5-Methyl-1H-benzotriazole/0.5% | Ethylene glycol monobutyl ether/3% | 8 | 1 | 1 | 2 | 1 |

TABLE 1n-2

| | Chelating agent/Content | Anticorrosive/Content | Organic solvent/Content | pH | Organic residue removability | Stability | Metal residue removability | Smoothness |
|---|---|---|---|---|---|---|---|---|
| Example 394 | Diethylenetriaminepentaacetic acid/1% | 5-Methyl-1H-benzotriazole/0.5% | Ethylene glycol monobutyl ether/3% | 8 | 1 | 1 | 2 | 1 |
| Example 395 | Diethylenetriaminepentaacetic acid/1% | 5-Methyl-1H-benzotriazole/0.5% | Ethylene glycol monobutyl ether/3% | 8 | 1 | 1 | 2 | 1 |
| Example 396 | Diethylenetriaminepentaacetic acid/1% | 5-Methyl-1H-benzotriazole/0.5% | Ethylene glycol monobutyl ether/3% | 8 | 2 | 1 | 1 | 1 |
| Example 397 | Diethylenetriaminepentaacetic acid/1% | 5-Methyl-1H-benzotriazole/0.5% | Ethylene glycol monobutyl ether/3% | 8 | 1 | 1 | 1 | 1 |
| Example 398 | Diethylenetriaminepentaacetic acid/1% | 5-Methyl-1H-benzotriazole/0.5% | Ethylene glycol monobutyl ether/3% | 8 | 1 | 1 | 1 | 1 |
| Example 399 | Diethylenetriaminepentaacetic acid/1% | 5-Methyl-1H-benzotriazole/0.5% | Ethylene glycol monobutyl ether/3% | 8 | 1 | 2 | 1 | 1 |
| Example 400 | Diethylenetriaminepentaacetic acid/1% | 5-Methyl-1H-benzotriazole/0.5% | Ethylene glycol monobutyl ether/3% | 8 | 2 | 1 | 1 | 1 |
| Example 401 | Diethylenetriaminepentaacetic acid/1% | 5-Methyl-1H-benzotriazole/0.5% | Ethylene glycol monobutyl ether/3% | 8 | 1 | 1 | 1 | 1 |
| Example 402 | Diethylenetriaminepentaacetic acid/1% | 5-Methyl-1H-benzotriazole/0.5% | Ethylene glycol monobutyl ether/3% | 8 | 1 | 1 | 1 | 1 |
| Example 403 | Diethylenetriaminepentaacetic acid/1% | 5-Methyl-1H-benzotriazole/0.5% | Ethylene glycol monobutyl ether/3% | 8 | 1 | 2 | 1 | 1 |

TABLE 1n-2-continued

|  | Chelating agent/Content | Anticorrosive/ Content | Organic solvent/ Content | pH | Organic residue removability | Stability | Metal residue removability | Smoothness |
|---|---|---|---|---|---|---|---|---|
| Example 404 | Diethylenetriaminepentaacetic acid/1% | 5-Methyl-1H-benzotriazole/0.5% | Ethylene glycol monobutyl ether/3% | 8 | 2 | 1 | 1 | 1 |
| Example 405 | Diethylenetriaminepentaacetic acid/1% | 5-Methyl-1H-benzotriazole/0.5% | Ethylene glycol monobutyl ether/3% | 8 | 1 | 1 | 1 | 1 |
| Example 406 | Diethylenetriaminepentaacetic acid/1% | 5-Methyl-1H-benzotriazole/0.5% | Ethylene glycol monobutyl ether/3% | 8 | 1 | 1 | 1 | 1 |
| Example 407 | Diethylenetriaminepentaacetic acid/1% | 5-Methyl-1H-benzotriazole/0.5% | Ethylene glycol monobutyl ether/3% | 8 | 1 | 2 | 1 | 1 |
| Example 408 | Diethylenetriaminepentaacetic acid/1% | 5-Methyl-1H-benzotriazole/0.5% | Ethylene glycol monobutyl ether/3% | 8 | 2 | 1 | 1 | 1 |
| Example 409 | Diethylenetriaminepentaacetic acid/1% | 5-Methyl-1H-benzotriazole/0.5% | Ethylene glycol monobutyl ether/3% | 8 | 1 | 1 | 1 | 1 |
| Example 410 | Diethylenetriaminepentaacetic acid/1% | 5-Methyl-1H-benzotriazole/0.5% | Ethylene glycol monobutyl ether/3% | 8 | 1 | 1 | 1 | 1 |
| Example 411 | Diethylenetriaminepentaacetic acid/1% | 5-Methyl-1H-benzotriazole/0.5% | Ethylene glycol monobutyl ether/3% | 8 | 1 | 2 | 1 | 1 |
| Example 412 | Diethylenetriaminepentaacetic acid/1% | 5-Methyl-1H-benzotriazole/0.5% | Ethylene glycol monobutyl ether/3% | 8 | 2 | 1 | 1 | 1 |
| Example 413 | Diethylenetriaminepentaacetic acid/1% | 5-Methyl-1H-benzotriazole/0.5% | Ethylene glycol monobutyl ether/3% | 8 | 1 | 1 | 1 | 1 |
| Example 414 | Diethylenetriaminepentaacetic acid/1% | 5-Methyl-1H-benzotriazole/0.5% | Ethylene glycol monobutyl ether/3% | 8 | 1 | 1 | 1 | 1 |
| Example 415 | Diethylenetriaminepentaacetic acid/1% | 5-Methyl-1H-benzotriazole/0.5% | Ethylene glycol monobutyl ether/3% | 8 | 1 | 2 | 1 | 1 |
| Comparative Example 001 | — | — | — | 9 | 5 | 1 | 9 | 3 |
| Comparative Example 002 | — | — | — | 9 | 1 | 5 | 9 | 3 |

From the results shown in the table, it has been confirmed that in a case where the treatment liquid according to the aspect of the present invention is used, the objects of the present invention can be achieved.

In addition, it has been confirmed that in a case where the content of hydrazines is 0.0001 parts by mass or more (preferably 0.005 to 0.5 parts by mass) with respect to 100 parts by mass of hydroxylamine, the effects of the treatment liquid are further improved (refer to the comparison of results of Examples 001 to 005, the comparison of results of Examples 001 and 011, and the like).

It has been confirmed that in a case where hydrazines contain hydrazine, the effects of the treatment liquid are further improved (refer to the comparison of results of Examples 014 and 020 to 027, and the like).

It has been confirmed that in a case where treatment liquid contains the first anions, the effects of the treatment liquid are further improved (refer to the comparison of results of Examples 009 and 036 to 045, and the like).

Furthermore, it has been confirmed that the effects of the treatment liquid are further improved in a case where the total content of the first anions and the second anions is 0.0001 to 30 parts by mass with respect to 100 parts by mass of hydroxylamine (refer to the comparison of the results of Examples 009 and 036 to 045, and the like).

It has been confirmed that the effects of the treatment liquid are further improved in a case where the total mass of the two kinds of specific anions consisting of $NO_2^-$ and $NO_3^-$ contained in the treatment liquid is larger than the mass of the $Cl^-$ contained in the treatment liquid (refer to the comparison between the result of Example 056 and the result of Example 057, and the like).

It has been confirmed that the effects of the treatment liquid are further improved in a case where the treatment liquid contains a chelating agent (more preferably diethylenetriaminepentaacetic acid or citric acid) (refer to the comparison between the results of Examples 093 to 155 and the results of Examples 055, 056, 063, 064, 070, 071, and 072, and the like).

It has been confirmed that the effects of the treatment liquid are further improved in a case where the treatment liquid contains an anticorrosive (more preferably benzotriazole, 1-amino-benzotriazole, or 5-methyl-1H-benzotriazole, and even more preferably 5-methyl-1H-benzotriazole) (refer to the comparison between the results of Examples 156 to 204 and the results of Examples 055, 056, 063, 064, 070, 071, and 072, and the like).

It has been confirmed that the effects of the treatment liquid are further improved in a case where the treatment liquid contains one or more kinds of organic solvents (more preferably ethylene glycol monobutyl ether) selected from the group consisting of an alcohol-based solvent, a ketone-based solvent, an ester-based solvent, and an ether-based solvent (refer to the comparison between the results of Examples 205 to 372 and the results of Examples 055, 056, 063, 064, 070, 071, and 072, and the like).

EXPLANATION OF REFERENCES

20: object to be treated
12: substrate
14: insulating film
16: metal-containing substance portion
18 cobalt-containing substance
30: object to be treated
32: substrate
34: metal-containing film
36: etch stop layer
38: interlayer insulating film
40: metal hard mask
42: hole
46: dry etching residue
44: inner wall 44a: cross-sectional wall
44b: bottom wall

What is claimed is:

1. A treatment liquid comprising:
    water;
    hydroxylamine; and
    one or more kinds of hydrazines selected from the group consisting of hydrazine, a hydrazine salt, and a hydrazine derivative,
    wherein a total content of the hydrazines is 1 part by mass or less with respect to 100 parts by mass of the hydroxylamine.

2. The treatment liquid according to claim 1,
    wherein the total content of the hydrazines is 0.0001 parts by mass or more with respect to 100 parts by mass of the hydroxylamine.

3. The treatment liquid according to claim 1,
    wherein the total content of the hydrazines is 0.005 to 0.5 parts by mass with respect to 100 parts by mass of the hydroxylamine.

4. The treatment liquid according to claim 1,
    wherein the hydrazine derivative is one or more kinds of compounds selected from the group consisting of a compound represented by General Formula (A), a compound represented by General Formula (B), a compound having a pyrazole ring, and a salt of these, $$H_2N—N—R^N_2 \quad (A)$$

$$H_2N—N=X \quad (B)$$

in General Formula (A), two $R^N$'s each independently represent a hydrogen atom or a substituent, two $R^N$'s may be bonded to each other to form a ring, at least one of two $R^N$'s is not a hydrogen atom, and
    in General Formula (B), X represents a divalent group.

5. The treatment liquid according to claim 1,
    wherein the hydrazines contain hydrazine.

6. The treatment liquid according to claim 1, further comprising:
    one or more kinds of first anions selected from the group consisting of $Cl^-$, $NO_2^-$, and $NO_3^-$.

7. The treatment liquid according to claim 6, comprising:
    three kinds of first anions consisting of $Cl^-$, $NO_2^-$, and $NO_3^-$.

8. The treatment liquid according to claim 6,
    wherein a total content of the first anions is 0.0001 to 30 parts by mass with respect to 100 parts by mass of the hydroxylamine.

9. The treatment liquid according to claim 6, further comprising:
    one or more kinds of second anions selected from the group consisting of $SO_4^{2-}$ and $PO_4^{3-}$,
    wherein a total content of the first anions and the second anions is 0.0001 to 30 parts by mass with respect to 100 parts by mass of the hydroxylamine.

10. The treatment liquid according to claim 6,
    wherein a total mass of $NO_2^-$ and $NO_3^-$ contained in the treatment liquid is larger than a mass of $Cl^-$ contained in the treatment liquid.

11. The treatment liquid according to claim 1, further comprising:
    a chelating agent.

12. The treatment liquid according to claim 11,
    wherein the chelating agent contains a functional group selected from the group consisting of a carboxylic acid group, a phosphonic acid group, and a sulfonic acid group.

13. The treatment liquid according to claim 11,
    wherein the chelating agent is one or more kinds of compounds selected from the group consisting of diethylenetriaminepentaacetic acid, ethylenediaminetetraacetic acid, trans-1,2-diaminocyclohexanetetraacetic acid, oxalic acid, malonic acid, succinic acid, citric acid, methanesulfonic acid, 1-hydroxyethylidene-1,1-diphosphonic acid, and nitrilotrismethylenephosphonic acid.

14. The treatment liquid according to claim 1, further comprising:
    an anticorrosive.

15. The treatment liquid according to claim 14,
    wherein the anticorrosive is benzotriazoles.

16. The treatment liquid according to claim 15,
    wherein the benzotriazoles are benzotriazole that may be substituted with one or more kinds of substituents selected from the group consisting of an alkyl group which may further contain a substituent, an aryl group which may further contain a substituent, a halogen atom, an amino group which may further contain a substituent, a nitro group, an alkoxy group which may further contain a substituent, and a hydroxyl group.

17. The treatment liquid according to claim 14,
    wherein the anticorrosive is one or more kinds of compounds selected from the group consisting of benzotriazole, 5-aminotetrazole, 1-hydroxybenzotriazole, 5-phenylthiol-benzotriazole, 5-chlorobenzotriazole, 4-chlorobenzotriazole, 5-bromobenzotriazole, 4-bromobenzotriazole, 5-fluorobenzotriazole, 4-fluorobenzotriazole, naphthotriazole, tolyltriazole, 5-phenylbenzotriazole, 5-nitrobenzotriazole, 4-nitrobenzotriazole, 3-amino-5-mercapto-1,2,4-triazole, 2-(5-amino-pentyl)-benzotriazole, 1-amino-benzotriazole, 5-methyl-1H-benzotriazole, benzotriazole-5-carboxylic acid, 4-methylbenzotriazole, 4-ethylbenzotriazole, 5-ethylbenzotriazole, 4-propylbenzotriazole, 5-propylbenzotriazole, 4-isopropylbenzotriazole, 5-isopropylbenzotriazole, 4-n-butylbenzotriazole, 5-n-butylbenzotriazole, 4-isobutylbenzotriazole, 5-isobutylbenzotriazole, 4-pentylbenzotriazole, 5-pentylbenzotriazole, 4-hexylbenzotriazole, 5-hexylbenzotriazole, 5-methoxybenzotriazole, 5-hydroxybenzotriazole, dihydroxypropylbenzotriazole, 1-[N,N-bis(2-ethylhexyl)aminomethyl]-benzotriazole, 5-t-butylbenzotriazole, 5-(1',1'-dimethylpropyl)-benzotriazole, 5-(1',1',3'-trimethylbutyl)benzotriazole, 5-n-octylbenzotriazole, and 5-(1',1',3',3'-tetramethylbutyl)benzotriazole.

18. The treatment liquid according to claim 1, further comprising:
    one or more kinds of organic solvents selected from the group consisting of an alcohol-based solvent, a ketone-based solvent, an ester-based solvent, and an ether-based solvent.

19. The treatment liquid according to claim 1,
    wherein the treatment liquid has a pH of 6 to 11.

20. The treatment liquid according to claim 1,
    wherein the treatment liquid is used for an object to be treated that contains a cobalt-containing substance containing cobalt atoms and a metal-containing substance containing metal atoms other than cobalt atoms.

21. The treatment liquid according to claim 20,
    wherein the cobalt-containing substance is simple cobalt, a cobalt alloy, a cobalt oxide, or a cobalt nitride.

22. A method for treating an object to be treated, comprising:

bringing an object to be treated that contains a cobalt-containing substance containing cobalt atoms into contact with the treatment liquid according to claim 1 so that the cobalt-containing substance is dissolved.

23. A method for treating an object to be treated, comprising:
- a step A of performing a treatment on an object to be treated containing a metal layer so that a surface layer of the metal layer is oxidized and turns into a metal oxide layer; and
- a step B of bringing the object to be treated obtained by the step A into contact with the treatment liquid according to claim 1 so that the metal oxide layer is dissolved,
- wherein the treatment in the step A is a liquid treatment of bringing the object to be treated into contact with a solution selected from the group consisting of water, hydrogen peroxide water, a mixed aqueous solution of ammonia and hydrogen peroxide, a mixed aqueous solution of hydrofluoric acid and hydrogen peroxide water, a mixed aqueous solution of sulfuric acid and hydrogen peroxide water, a mixed aqueous solution of hydrochloric acid and hydrogen peroxide water, water containing dissolved oxygen, and water containing dissolved ozone,
- an ozone treatment of bringing the object to be treated into contact with an ozone gas,
- a heating treatment in oxygen in which the object to be treated is heated in an oxygen atmosphere, or
- a plasma treatment using an oxygen gas.

24. The method for treating an object to be treated according to claim 23,
wherein the step A and the step B are alternately repeated.

25. The method for treating an object to be treated according to claim 23,
wherein the metal layer consists of a cobalt-containing substance that is simple cobalt or a cobalt alloy.

26. A method for treating an object to be treated, comprising:
- performing a dry etching treatment on an object to be treated containing a metal-based material, and
- then bringing the object to be treated into contact with the treatment liquid according to claim 1 so that dry etching residues are removed.

27. The method for treating an object to be treated according to claim 26,
wherein the metal-based material is a cobalt-containing substance containing cobalt atoms.

\* \* \* \* \*